United States Patent [19]
Gaylord et al.

[11] Patent Number: 5,007,708
[45] Date of Patent: Apr. 16, 1991

[54] TECHNIQUE FOR PRODUCING ANTIREFLECTION GRATING SURFACES ON DIELECTRICS, SEMICONDUCTORS AND METALS

[75] Inventors: Thomas K. Gaylord; Elias N. Glytsis, both of Atlanta, Ga.; M. Gamal Moharam, Charlottesville, Va.; William E. Baird, Oxford, Ga.

[73] Assignee: Georgia Tech Research Corporation, Atlanta, Ga.

[21] Appl. No.: 224,571

[22] Filed: Jul. 26, 1988

[51] Int. Cl.$^5$ .................... G02B 26/00; G02F 1/00
[52] U.S. Cl. .................... 350/162.2; 350/162.17; 350/320; 350/166
[58] Field of Search .................... 350/168.11–162.24, 350/96.13, 96.15, 166–168; 250/231 SE; 333/153, 195, 142; 357/68, 65

[56] References Cited

U.S. PATENT DOCUMENTS

| | | | |
|---|---|---|---|
| 4,255,019 | 3/1981 | Knot | 350/162.2 |
| 4,501,784 | 2/1985 | Moshinsky | 428/156 |
| 4,545,646 | 10/1985 | Chern et al. | 350/162.2 |
| 4,660,934 | 4/1987 | Akisa et al. | 350/162.17 |
| 4,666,250 | 5/1987 | Soothwell | 350/320 |
| 4,765,705 | 8/1988 | Seymour et al. | 350/162.17 |
| 4,806,442 | 2/1989 | Shirasaki et al. | 350/162.17 |

*Primary Examiner*—Bruce Y. Arnold
*Assistant Examiner*—Thong Nguyen
*Attorney, Agent, or Firm*—Hurt, Richardson, Garner, Todd & Cadenhead

[57] ABSTRACT

A method of forming an antireflection rectangular-groove surface-relief grating on a lossy substrate exposed to incident waves of transverse electric or transverse magnetic or combination of polarizations and any angle of incidence in a lossless medium. The required thickness and complex refractive index of a single homogeneous layer on a lossy substrate to produce zero reflectivity is first computed using an impedance matching approach. The filling factor and groove depth of the rectangular groove surface-relief grating that is equivalent to the single homogeneous layer in the long-wavelength limit are then calculated. The surface-relief grating is then formed on the lossy substrate by reactive ion etching, electron beam lithography, or holography.

28 Claims, 37 Drawing Sheets

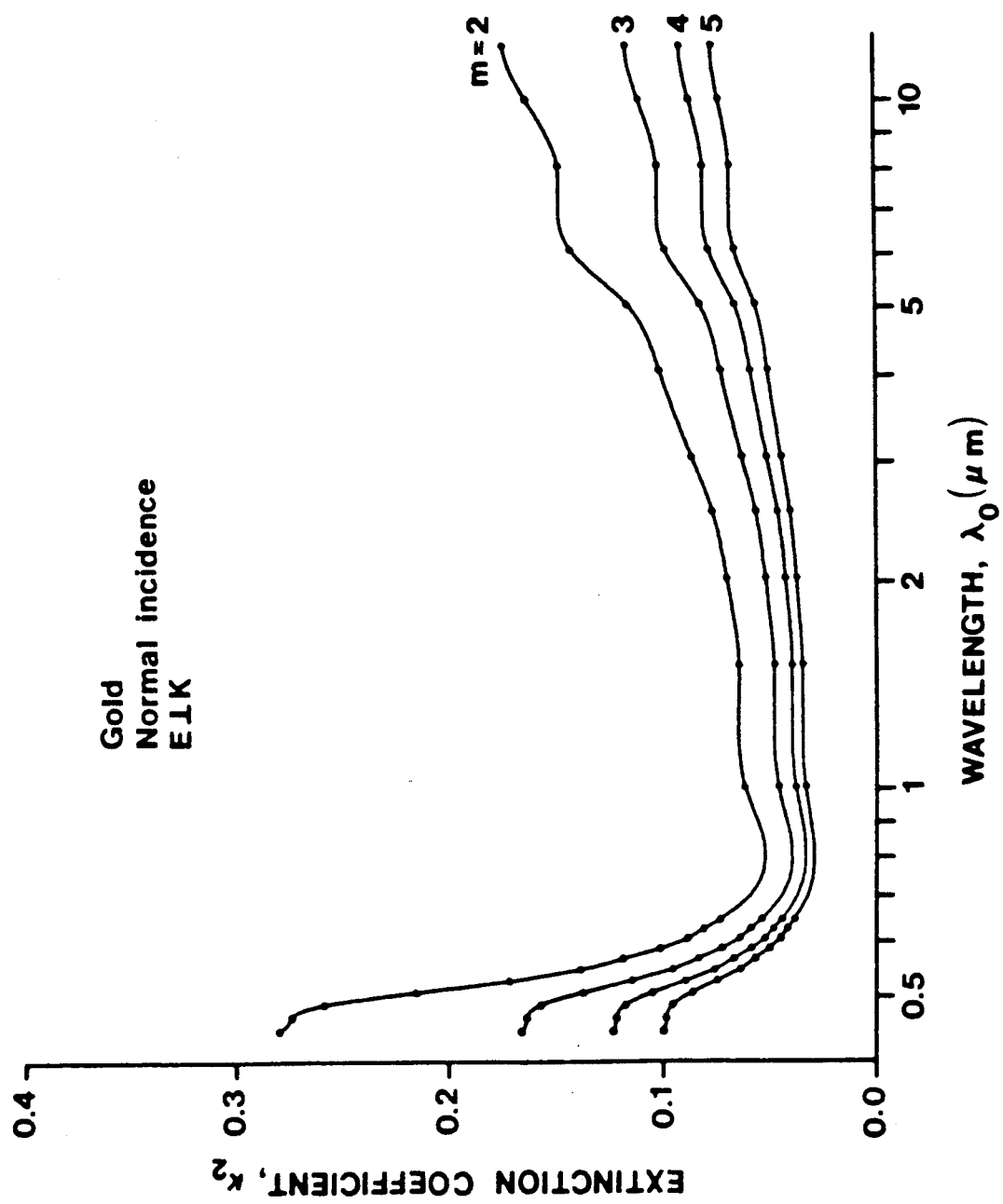

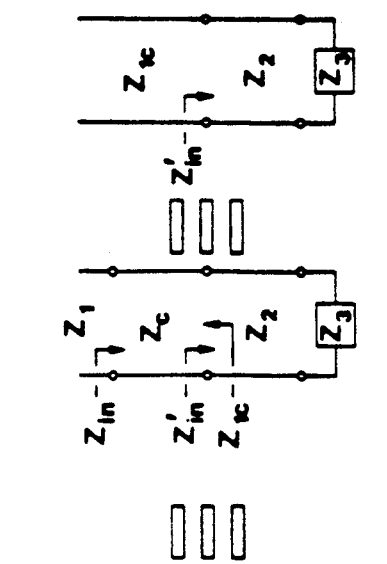
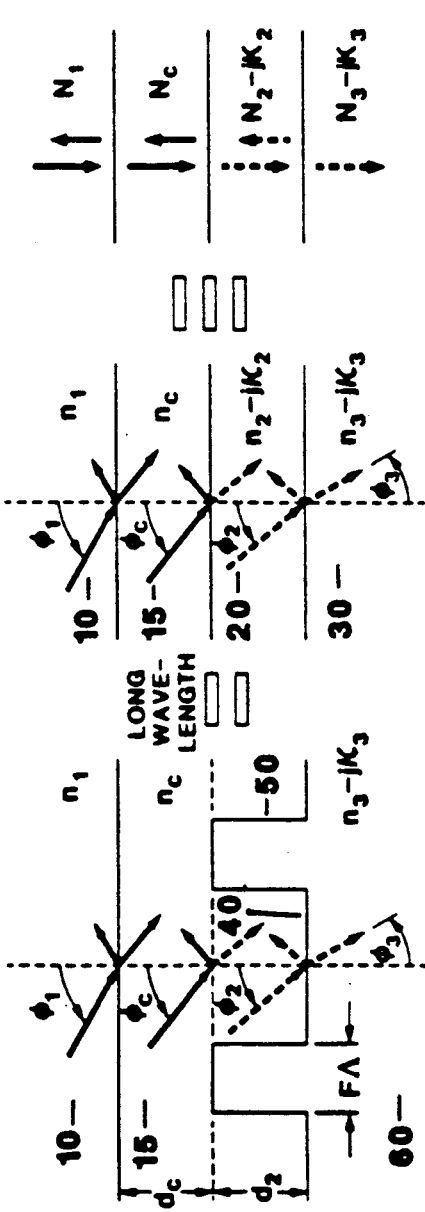

TECHNIQUE FOR PRODUCING ANTIREFLECTION GRATING SURFACES ON DIELECTRICS, SEMICONDUCTORS AND METALS

GOVERNMENT INTEREST

The invention described herein was made with Government support under Contract No. DAAG29-84-K-0024 on a grant from the Joint Services Electronics Program. The Government has certain rights in this invention.

BACKGROUND OF THE INVENTION

This invention relates to a method for improving the antireflective properties of materials by application of a surface grating. By the use of multiple stair-steps in the grating, and/or by the use of crossed gratings, and/or by the use of dielectric overlayers the material can be made non-reflective to a wide range of frequencies, a wide range of angles of incidence and for any polarization or combination of polarizations. The method involves a consistent mathematically rigorous procedure for the selection of appropriate grating periods and filling factors to be applied to the surface by holography, electron beam lithography, reactive ion etching or other techniques. It is applicable to a broad frequency range including optical and radar frequencies as well as any arbitrary angle of incidence. The antireflective treatment can be applied to dielectric, semiconductor, or conductor materials.

Thin film antireflection coatings are often used to produce low reflectivity at an interface with a dielectric material. Thin films require deposition of dissimilar materials and display problems such as differential expansion and contraction, adhesion, and local heat absorption. Thin films degrade at high power and have a limited range of indices of refraction, the minimum being about 1.35. Alternatively, a high spatial-frequency periodic surface-relief grating on a dielectric surface can also behave like an antireflection grating.

In the prior art, the patent to Moshinsky, U.S. Pat. No. 4,501,784 discloses the use of closely spaced indentations in a random or systematic pattern having a depth or radius of curvature from 0.2 to 5.0 times the wavelength of the radar signals which may illuminate the surface. The indentations vary in depth or radius of curvature within the stated range and are variably positioned on the surface. The surface irregularities are spaced in size so that they will scatter or disperse any of the various radar wavelengths on reflection. The surface irregularities may be distributed uniformly or randomly over the surface. The effect is to reflect radar signals in a highly dispersed manner so that the radar signal returned to the radar apparatus has an intensity less than 1 percent of the signal reflected from a smooth surface.

The patent to Akiba et al., U.S. Pat. No. 4,660,934 discloses a method for manufacturing a diffraction grating having periodic corrugations through two-beam interference exposure so that the phases of corrugation in two adjacent regions are reverse to each other. The method involves first forming a negative type photoresist film on a region of a substrate and then forming a positive type photoresist film in a second region of the substrate. The second step involves subjecting the two regions of the substrate to two-beam interference exposure and in the third step, through utilization of characteristics of the negative and positive photoresist films, a diffraction grating is formed in which corrugations in the first region and second region are reversed in phase to each other.

The patent to Southwell, U.S. Pat. No. 4,666,250, discloses a multilayer antireflective optical film which, when placed between an incident medium and a substrate effects minimal reflectivity from the instrument medium-substrate interface over a broad spectral band. The optical film is comprised of a plurality of thin layers of equal thickness each of which is either a selected first material having a low refractive index or a selected second material having a high refractive index. The low or high refractive index is specified for each layer, then the refractive index for a single layer is changed and the reflectivity reevaluated. Each layer is examined in turn until no further improvement in reflectivity is obtained.

The method of this invention involves first the calculation of the required thickness and complex refractive index of a single homogeneous layer on lossy substrate to produce zero reflectivity using a rigorous impedance matching approach. The method is applicable to both transverse electric (TE) and transverse magnetic (TM) polarization, and to any angle of incidence. The method then involves the calculation of the required filling factor and groove depth of a rectangular-groove grating that is equivalent to that of the single homogeneous layer in the long-wavelength limit.

SUMMARY OF THE INVENTION

It is an object of the present invention to provide a rigorous impedance matching method for calculating the required thickness and complex refractive index of single homogeneous layers on lossy substrates that is applicable to both transverse electric (TE) and transverse magnetic (TM) polarization and to any angle of incidence.

It is another object of the present invention to provide a method for calculating the filling factor and groove depth of a rectangular groove grating required to make it equivalent to a single homogeneous lossy layer in the long wavelength limit.

The calculation of the homgeneous lossy layer may be viewed as an intermediate step in calculating the parameters of the antireflection grating. That the groove depth and equivalent complex index of refraction for a rectangular groove grating equivalent to a analysis method disclosed results in gratings exhibiting antireflection behavior has been verified by the exact treatment of the rigorous coupled-wave analysis of metallic surface-relief grating diffraction and by experimental reduction to practice. Zero reflectivity solutions are shown to exist for both TE and TM polarizations. For an arbitrary complex refractive index, the method of the invention determines multiple groove depths that together with their corresponding filling factors produce antireflection behavior for incident TE and TM polarizations for any angle of incidence.

The method has been applied to gold gratings with an incident free-space wavelength in the range from $\lambda_0 = 0.44$ to $12.0$ $\mu m$ with tabulated values of the complex refractive index for bulk gold used to characterize the material. Zero reflectivity solutions are presented in the detailed description below for both TE and TM polarizations over the entire range of wavelengths. Furthermore, gold gratings have been fabricated according to the method of this invention that are antireflecting in the range around $\lambda_0 = 0.5$ μm.

BRIEF DESCRIPTION OF THE DRAWINGS

FIG. 4b graphs the extinction coefficient required to produce zero reflectivity for TE polarization at normal incidence on gold as a function of wavelength.

FIG. 19a–19e illustrate the diffraction geometry of a lossy rectangular-groove surface-relief high-spatial frequency grating overcoated by a dielectric layer; the equivalent layer model for the grating is the long wavelength limit; the normal-incidence equivalent layer model; the transmission line model of the normal-incidence equivalent layer model; and an equivalent transmission line model.

DETAILED DESCRIPTION OF THE INVENTION

The method of the invention first requires the calculation of the thickness and complex refractive index of single homogeneous layers on lossy substrates to produce zero reflectivity using a rigorous impedance matching approach. The method is applicable to both TE and TM polarization and to any angle of incidence. The method then requires the calculation of the filling factor and the groove depth of a rectangular-groove grating equivalent to the single homogeneous lossy layer in the long wavelength limit. Once these characteristics are determined, the surface-relief grating is formed on the lossy substrate by reactive ion etching, electron beam lithography, or holography. The following detailed description first addresses the grating geometry, then the mathematics of the single homogeneous layer model, and the conditions for zero reflectivity at long wavelengths. The method is then applied to gold surfaces and the antireflection behavior of the gratings is verified by using the rigorous coupled-wave analysis of metallic surface-relief grating diffraction and by experimental reduction to practice.

I. Grating Geometry

Figure 1:
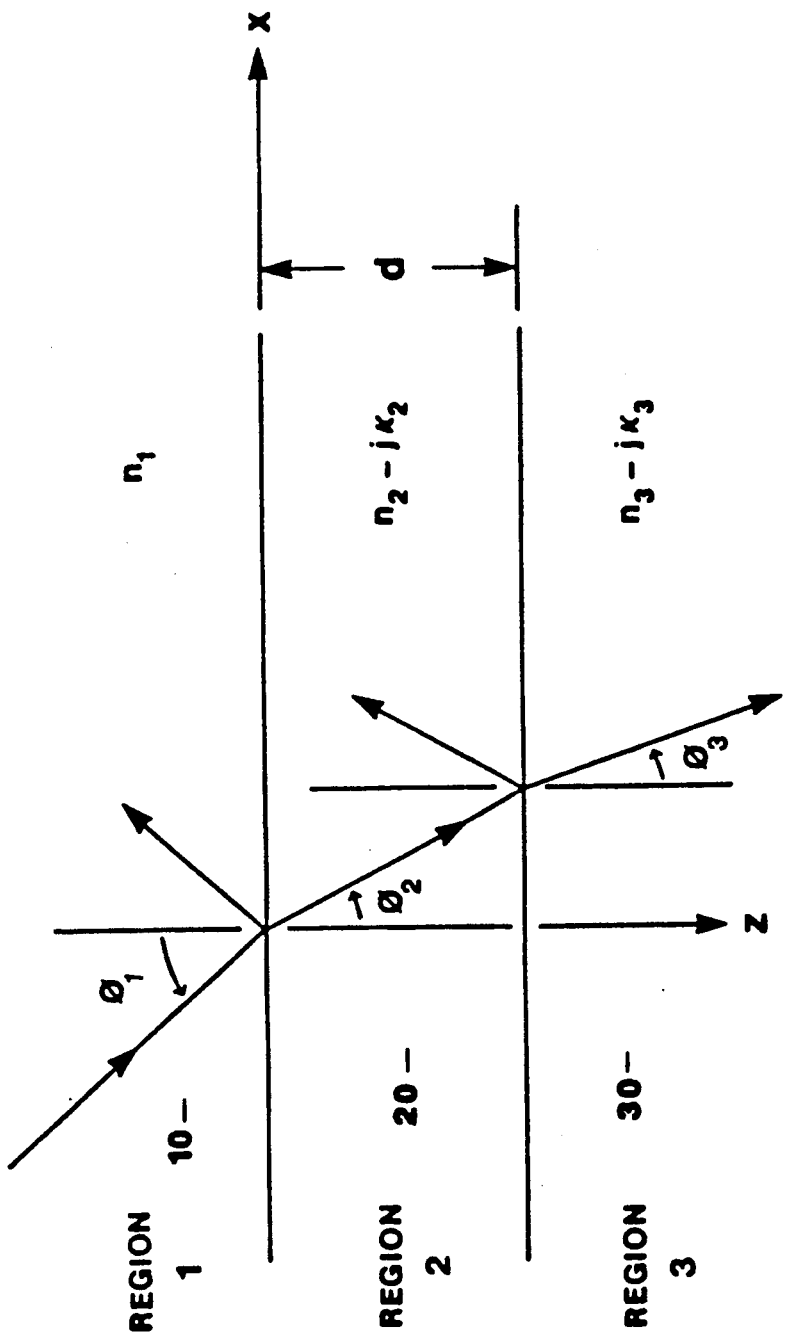
FIG. 1 illustrates the geometry of an electromagnetic wave in a lossless medium incident on a lossy layer on top of a lossy substrate.

The geometry of a single homogeneous lossy layer 20 (region 2) of thickness d on a lossy substrate 30 (region 3) is depicted in FIG. 1. Region 1, indicated by numeral 10, is lossless and is characterized by an index of refraction $n_1$. Regions 2 and 3 are lossy and have complex indices of refraction $n_2 - jk_2$, $n_3 - jk_3$ respectively, where the imaginary parts $k_2$ and $k_3$ are the extinction coefficients associated with those regions. An electromagnetic plane wave in the lossless medium 10 is incident at an angle $\phi_1$ upon the homogeneous lossy layer 20. Upon refraction, inhomogeneous plane waves (i.e., plane waves with nonconstant amplitudes along their phase fronts) propagate in the lossy regions. The quantities $\phi_2$ and $\phi_3$ are the complex angles of refraction in regions 2 and 3 respectively. These complex angles are determined from the phase matching requirement (Snell's law). That is, $$n_1 \sin \phi_1 = (n_2 - jk_2) \sin \phi_2 = (n_3 - jk_3) \sin \phi_3. \quad (1)$$

The incident wave may be of either TE or TM polarization. The lossless medium 10 would typically be air.

Figure 2:
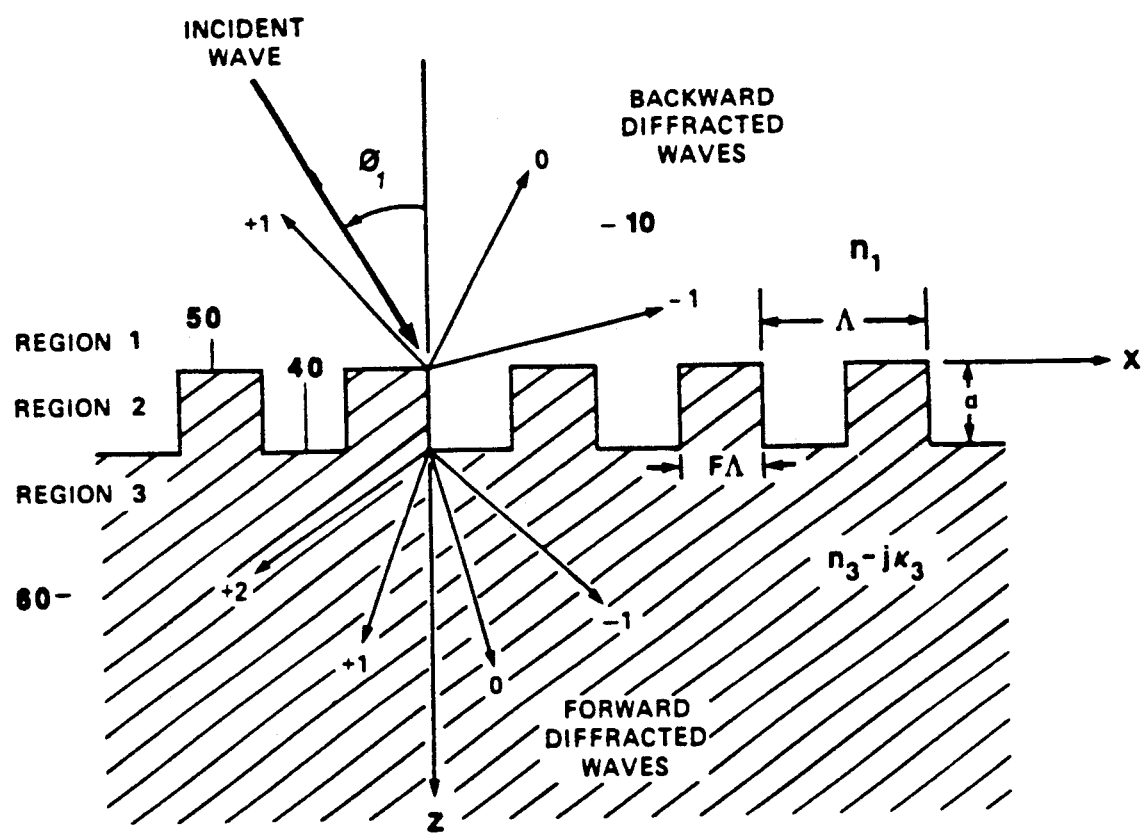
FIG. 2 illustrates the diffraction geometry of a lossy rectangular surface-relief grating.

The basic surface-relief grating diffraction geometry, on the other hand, is shown in FIG. 2. Grooves 40 are periodically spaced in the x direction with grating period $\Lambda$. The grating vector, K, is thus given by $K = (2\pi/\Lambda)x$, where x is the unit vector in the x direction and boldface indicates a vector quantity. The depth of the grooves is d. Similarly, an electromagnetic plane wave in the lossless medium 10 (region 1) is incident at an angle $\phi_1$ upon the rectangular surface-relief grating 50 (region 2) on the lossy material 60 (region 3) producing both forward-diffracted and backward-diffracted waves. An incident wave of arbitrary polarization may be decomposed into components with either the electric field or magnetic field parallel to the grating grooves. The first case corresponds to TE polarization and the electric field is perpendicular to the grating vector. The second case corresponds to TM polarization and the magnetic field is perpendicular to the grating vector. The plane of incidence is the x-z plane. The grating vector thus lies in the plane of incidence and there is no coupling between TE and TM polarized waves. the angles of diffraction of the backward-diffracted (reflected) waves are given by the grating equation (phase-matching) $i\lambda_0/n_1 = \Lambda(\sin \phi_1 + \sin \phi_{1i})$, where i is the diffracted order, $\lambda_0$ is the free-space wavelength, $\phi_1$ is the angle of incidence in the lossless dielectric of refractive index $n_1$ and $\phi_{1i}$ is the angle of diffraction in region 1 of the ith-order backward-diffracted wave.

The case of primary interest in the present invention is that of high spatial-frequency gratings 50 in which all forward- and backward-diffracted orders, other than i=0, are cutoff. Thus, in the grating equation there are no real solutions for the diffraction angle $\phi_{1i}$ for $i \neq 0$. In this situation, the $i \geq +1$ and $i \leq -1$ forward and backward orders are all evanescent. The i=0 forward-diffracted order decays as it enters the lossy substrate and so is also evanescent. Only the i=0 backward (reflected) order exists as a propagating wave.

II. Single-Homogeneous-Layer Model

A. Layer Analysis

The amplitude of the normalized electric field reflected, $E_r$, and transmitted, $E_t$, are related by $$\begin{bmatrix} 1 \\ E_r \end{bmatrix} = \frac{1}{\tau_{12}\tau_{23}} \begin{bmatrix} 1 & \pm\rho_{12} \\ \pm\rho_{12} & 1 \end{bmatrix} \begin{bmatrix} \exp(\gamma d) & 0 \\ 0 & \exp(-\gamma d) \end{bmatrix} \begin{bmatrix} 1 & \pm\rho_{23} \\ \pm\rho_{23} & 1 \end{bmatrix} \begin{bmatrix} E_t \\ 0 \end{bmatrix} \quad (2)$$

where $\tau_{12}$ and $\tau_{23}$ are the amplitude transmissivities of the interfaces between media 1 and 2 and between 2 and 3 respectively, $\rho_{12}$ and $\rho_{23}$ are the amplitude reflectivities at the same interfaces, and $\gamma$ is the complex propagation coefficient. The + sign applies for TE polarization and the − sign applies for TM polarization. The complex propagation coefficient in region 2 (the homogeneous layer of FIG. 1) is given by $\lambda = (\alpha + j\beta) \cos \phi_2$. The quantity $\alpha$ is the attenuation coefficient ($\alpha = k_0 k_2$ where $k_0 = 2\pi/\lambda_0$) and $\beta$ is the phase constant ($\beta = k_0 n_2$). From Eq. (2), the amplitude of normalized electric field reflected is $$E_r = \pm \frac{\rho_{12}\exp(\gamma d) + \rho_{23}\exp(-\gamma d)}{\exp(\gamma d) + \rho_{12}\rho_{23}\exp(-\gamma d)}. \quad (3)$$

where the + and − again applies for TE and TM polarizations respectively. The reflected electric field, $E_r$, may also be expressed in terms of characteristic impedances as will be described in the following paragraphs.

B. Characteristic Impedance (Transmission Line) Representation

The amplitude transmissivities and reflectivities may be expressed in terms of the characteristic impedances $Z_1$, $Z_2$, and $Z_3$ of the three regions respectively. The characteristic impedance $Z_1$ is real while $Z_2$ and $Z_3$ are complex. For incident TE polarization, the transmissivities and reflectivities are $$\tau_{12} = 2Z_2/(Z_2 + Z_1), \qquad \tau_{23} = 2Z_3/(Z_3 + Z_2), \qquad (4)$$
$$\rho_{12} = (Z_2 - Z_1)/(Z_2 + Z_1), \quad \rho_{23} = (Z_3 - Z_2)/(Z_3 + Z_2).$$

where, the characteristic impedances for this polarization are given by $$Z_1 = Z_0/n_1 \cos\phi_1, \; Z_2 = Z_0/(n_2 - j\kappa_2)\cos\phi_2, \qquad (5)$$
$$Z_3 = Z_0/(n_3 - j\kappa_3)\cos\phi_3.$$

where $Z_0$ is the characteristic impedance of free space. For incident TM polarization, the transmittances and reflectivities are $$\tau_{12} = 2Z_2\cos\phi_1/(Z_2 + Z_1)\cos\phi_2, \qquad (6)$$
$$\tau_{23} = 2Z_3\cos\phi_2/(Z_3 + Z_2)\cos\phi_3,$$
$$\rho_{12} = (Z_2 - Z_1)/(Z_2 + Z_1), \; \rho_{23} = (Z_3 - Z_2)/(Z_3 + Z_2).$$

where the characteristic impedances for this polarization are $$Z_1 = Z_0\cos\phi_1/n_1, \; Z_2 = Z_0\cos\phi_2/(n_2 - j\kappa_2), \qquad (7)$$
$$Z_3 = Z_0\cos\phi_3/(n_3 - j\kappa_3).$$

C. Effective Index of Grating at Long Wavelengths

The refractive index of the layer may be approximated using the electromagnetic boundary conditions on the electric field, E, and the electric displacement, D, in the long wavelength limit and calculating the average fields in the grating region. For TE polarization, the electric field is parallel to the grating grooves 40. Since the tangential electric field must be continuous and the wavelength is long compared to a grating period, then $E_y$ is approximately the same in the grooves and in the ridges of the grating. This gives an average value of $D_y$ in the grating region of $\overline{D_y} = \epsilon_0(n_{TE})^2 \overline{E_y} = \epsilon_0[(1-F)n_1^2 \cos^2\phi_1 + F(n_3 - j\kappa_3)^2 \cos^2\phi_3]\overline{E_y}$ where $^-$ indicates average value, $n_{TE}$ is the effective index, and $\epsilon_0$ is the permittivity of free space. Therefore, the complex effective index, $n_{TE}$, of the grating layer, in the long wavelength limit, for TE polarization is $$n_{TE} = [(1-F)n_1^2 \cos^2\phi_1 + F(n_3 - j\kappa_3)^2 \cos^2\phi_3]^{\frac{1}{2}}. \qquad (8)$$

For TM polarization, the magnetic field is parallel to the grating grooves 40. Since the normal component of the electric displacement must be continuous and the wavelength is long, then $D_x$ is approximately the same in the grooves and in the ridges. This gives an average value of $E_x$ in the grating region of $\overline{E_x} = [1/\epsilon_0(n_{TM})^2]\overline{D_x} = [(1-F)\cos^2\phi_1/n_1^2 + F\cos^2\phi_3/(n_3 - j\kappa_3)^2](\overline{D_x}/\epsilon_0)$ and thus the complex effective index, $n_{TM}$, of the grating layer for TM polarization is $$n_{TM} = [(1-F)\cos^2\phi_1/n_1^2 + F\cos^2\phi_3/(n_3 - j\kappa_3)^2]^{-\frac{1}{2}}. \qquad (9)$$

III. Conditions for Zero Reflectivity at Long Wavelengths

A. Impedance Matching

Figure 3:
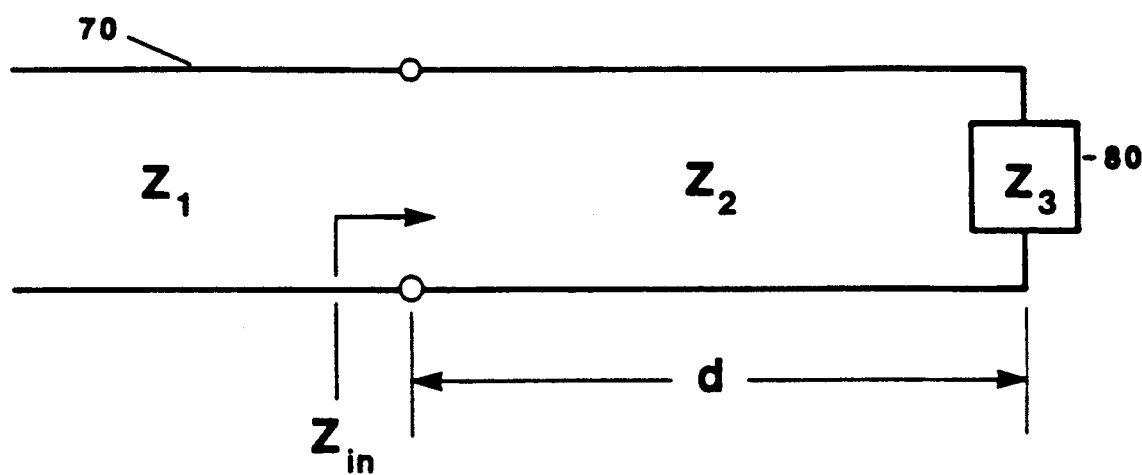
FIG. 3 illustrates a schematic representation of a transmission line used to model the single homogeneous layer.

The optical characteristics of the rectangular-groove metallic surface-relief grating 50 can be very accurately modeled in the long-wavelength limit by a single homogeneous layer 20 with complex refractive index $n_{TE}$ for the electric field perpendicular to the grating vector (polarization parallel to grooves) or $n_{TM}$ for the magnetic field perpendicular to the grating vector (polarization perpendicular to grooves). The single homogeneous layer may be conveniently modeled as a transmission line 70 (whose characteristics are determined by region 2, the layer) terminated with a load 80 (whose characteristics are determined by region 3, the substrate). The terminated transmission line is schematically illustrated in FIG. 3.

The (complex) input impedance, $Z_{in}$, of a transmission line of (complex) characteristic impedance $Z_2$ and length d terminated with a load of (complex) impedance $Z_3$, is given by $Z_{in} = Z_2[Z_3 + Z_2 \tan h(\gamma d)]/[Z_2 + Z_3 \tan h(\gamma d)]$, where $\gamma$ is the complex propagation coefficient of the transmission line and is given by $\gamma = (\alpha + j\beta) \cos\phi_2 = \alpha' + j\beta'$. The real part, $\alpha'$, of the complex transmission line (region 2) propagation coefficient is the attenuation coefficient and the imaginary part, $\beta'$, is the phase constant. Using the identity $\tan h(a+jb) \equiv [\tan h(a) + j \tan(b)]/[1 + j \tan h(a) \tan(b)]$, the input impedance may be expressed as $$Z_{in} = \qquad (10)$$
$$Z_2 \frac{Z_3[1 + j\tanh(\alpha'd)\tan(\beta'd)] + Z_2[\tanh(\alpha'd) + j\tan(\beta'd)]}{Z_2[1 + j\tanh(\alpha'd)\tan(\beta'd)] + Z_3[\tanh(\alpha'd) + j\tan(\beta'd)]}.$$

The phase coefficient of the transmission line 70 (region 2) is given by $\beta' = k_0 N_2'$; the attenuation coefficient of the transmission line (region 2) incidence is given by $\alpha' = k_0 K_2'$ and $N_2'$ and $K_2'$ are defined below.

From the characteristic impedances as given by Eqs. (5) and Eqs. (7), effective refractive indices, $N_i$, (i=1, 2, 3) and extinction coefficients, $K_i$, may be defined. For incident TE polarization, $N_i' = N_i$, $K_i' = K_i$, and the real-valued effective) quantities are $$N_1 = n_1\cos\phi_1, N_2 = Re\{(n_2 - j\kappa_2)\cos\phi_2\}, \qquad (11)$$
$$N_3 = Re\{(n_3 - j\kappa_3)\cos\phi_3\}, \; K_1 = 0,$$
$$K_2 = -Im\{(n_2 - j\kappa_2)\cos\phi_2\}, K_3 = -Im\{(n_3 - j\kappa_3)\cos\phi_3\},$$

where Re and Im denote real part and imaginary part respectively. For incident TM polarization, $N_i' = Re\{(N_i - jK_i)\cos^2\phi_i\}$, $K_i' = -Im\{(N_i - jK_i)\cos^2\phi_i\}$, and the real-valued effective quantities are $$N_1 = n_1/\cos\phi_1, \; N_2 = Re\{(n_2 - j\kappa_2)/\cos\phi_2\}, \qquad (12)$$
$$(N_3 = Re\{(n_3 - j\kappa_3)/\cos\phi_3\}, \; K_1 = 0,$$
$$K_2 = -Im\{(n_2 - j\kappa_2)/\cos\phi_2\}, K_3 = -Im\{(n_3 - j\kappa_3)/\cos\phi_3\}.$$

Substituting the characteristic impedances, Eqs. (5) or (7), and the effective quantities, Eqs. (11) or (12), into Eq. (10) the input impedance may be expressed as a function of d, $\lambda_0$, $n_2$, $\kappa_2$, $\phi_2$, $n_3$, $\kappa_3$, and $\phi_3$.

The normalized electric field reflected may be expressed in terms of the input impedance, $Z_{in}$, and the characteristic impedance, $Z_1$, of the first region containing the incident wave. It is $E_r = (Z_{in} - Z_1)/(Z_{in} + Z_1)$. This may be straightforwardly shown using Eqs. (3), (4)

[or (6)], and (10). For zero reflectivity to occur, the input impedance as given by Eq. (10) must be matched to the characteristic impedance of the first region. That is, $$Z_{in} = Z_1. \quad (13)$$

Substituting Eqs. (5) [or (7)], (10), (11) [or (12)], and the definitions of $N_2'$ and $K_2'$ into Eq. (13) produces a complex equation that specifies the condition for zero reflectivity for TE (or TM) polarization. This equation may be separated into a real-part equation and an imaginary-part equation. The real-part equation is $$N_1 N_3 \tanh(k_0 K_2' d) + N_1 K_3 \tan(k_0 N_2' d) + \quad (14)$$
$$(N_1 N_2 - N_2 N_3 + K_2 K_3) +$$
$$(N_1 K_2 - N_2 K_3 - K_2 N_3)\tanh(k_0 K_2' d)\tan(k_0 N_2' d) -$$
$$(N_2^2 - K_2^2)\tanh(k_0 K_2' d) - 2N_2 K_2 \tan(k_0 N_2' d) = 0.$$

The imaginary-part equation is $$-N_1 K_3 \tanh(k_0 K_2' d) + N_1 N_3 \tan(k_0 N_2' d) - \quad (15)$$
$$(N_1 K_2 - N_2 K_3 + K_2 N_3) +$$
$$(N_1 N_2 - N_2 N_3 - K_2 K_3)\tanh(k_0 K_2' d)\tan(k_0 N_2' d) -$$
$$(N_2^2 - K_2^2)\tan(k_0 N_2' d) - 2N_2 K_2 \tanh(k_0 K_2' d) = 0.$$

Equations (14) and (15) are valid for both TE and TM polarizations provided that the corresponding effective quantities are used [Eqs. (5) and (11) for TE, and Eqs. (7) and (12) for TM]. The given quantities in the problem definition are in the incident (region 1) index, $n_1$, the incident angle, $\phi_1$, the substrate (region 3) index, $n_3$, the substrate extinction coefficient, $\kappa_3$, and the free-space wavevector magnitude, $k_0$. Using the phase matching requirement, Eq. (1), the complex angle $\phi_3$ can be determined.

Therefore the known quantities in Eqs. (14) and (15) are $N_1$, $N_3$, $K_3$, and $k_0$. The unknown quantities are associated with the layer (region 2) and are $N_2$, $K_2$, and the layer thickness, d ($N_2'$ and $K_2'$ can be expressed as functions of $N_2$ and $K_2$ as shown in the Appendix). Thus there are two equations and three unknowns.

B. TE Polarization

Since the homogeneous layer model is a representation of the grating in the long wavelength limit, the complex effective refractive index of the layer, $N_2 - jK_2$, must be equal to the effective index of the grating. Thus, for TE polarization $$N_2 - jK_2 = n_{TE}, \quad (16)$$

where $n_{TE}$ is given by Eq. (8). The complex Eq. (16) may be separated into a real-part equation and an imaginary-part equation. These are $$N_2^2 - K_2^2 = (1-F)N_1^2 + F(N_3^2 - K_3^2), \quad (17)$$

$$N_2 K_2 = FN_3 K_3. \quad (18)$$

Equations (14), (15), (17), and (18) represent four independent equations in four unknowns ($N_2$, $K_2$, F, and d). Due to the transcendental nature of Eqs. (14) and (15), analytic solutions are not possible. However, these equations can be solved numerically using the procedure described in the Appendix and illustrated by the flowchart shown in FIG. 13. The resulting values of the filling factor, F, and the groove depth, d, completely specify the surface-relief grating that will exhibit zero-reflectivity for TE polarization.

C. TM Polarization

For TM polarization, the complex refractive index of the layer, $N_2 - jK_2$, must likewise be equal to the effective index of the grating for this polarization. That is, $$N_2 - jK_2 = n_{TM}, \quad (19)$$

where $n_{TM}$ is given by Eq. (9). The complex Eq. (19) may be separated into a real-part equation and an imaginary-part equation. These are $$N_2^2 - K_2^2 = \quad (20)$$

$$\frac{N_1^2[(1-F)(N_3^2 + K_3^2)^2 + FN_1^2(N_3^2 - K_3^2)]}{[(1-F)(N_3^2 - K_3^2) + FN_1^2]^2 + [2(1-F)N_3 K_3]^2},$$

$$N_2 K_2 = \quad (21)$$

$$\frac{FN_1^4 N_3 K_3}{[(1-F)(N_3^2 - K_3^2) + FN_1^2]^2 + [2(1-F)N_3 K_3]^2}.$$

Equations (14), (15), (20), and (21) likewise represent four equations in four unknowns ($N_2$, $K_2$, F, and d) and can be solved as described in the Appendix. The resulting values of the filling factor, F, and the groove depth, d, completely specify the surface-relief grating that will exhibit zero-reflectivity for TM polarization.

IV. Required Gratings for Gold Surfaces

The normalized equations of the Appendix were solved for gold gratings for incident free-space wavelengths from $\lambda_0 = 0.44$ μm to 12.0 μm (violet to infrared). The tabulated complex refractive indices of bulk gold, presented in G. Hass and L. Hadley, "Optical Properties of Metals," *American Institute of Physics Handbook*, D. E. Gray, ed., McGraw-Hill, New York, 1972, pg. 6-119, were used in these calculations. These values are reproduced in Table I for reference. Inspection of Eq. (A1) reveals that multiple solutions are possible, each corresponding to a different branch of the tan $(k_0 N_2' d)$ function. These branches are labeled with the integer m. The range correspondinng to the m-th branch is $0 < k_0 N_2' d < \pi/2$ for m=1 and $(2m-3)\pi/2 < k_0 N_2' d < (2m-1)\pi/2$ for m≥2 since $N_2' > 0$ (for component of propagation along incident wavevector) and only positive values of thickness are allowed. For TE polarization, there is no solution for m=1 (no intersection with the first branch), but there are roots for m=2, 3, 4, . . . . For TM polarization, there are solutions for all values of the integer m (m=1, 2, 3, . . .).

TABLE I.

| COMPLEX REFRACTIVE INDEX, $n_2$-$jk_2$, FOR BULK GOLD FOR VARIOUS FREE-SPACE WAVELENGTHS $\lambda_0$ | | |
|---|---|---|
| $\lambda_0$(μm) | $n_2$ | $k_2$ |
| 0.44 | 1.58 | 1.91 |
| 0.46 | 1.48 | 1.83 |
| 0.48 | 1.25 | 1.73 |
| 0.50 | 0.80 | 1.82 |
| 0.52 | 0.53 | 2.13 |
| 0.54 | 0.38 | 2.45 |
| 0.56 | 0.31 | 2.75 |
| 0.58 | 0.25 | 3.01 |
| 0.60 | 0.21 | 3.24 |
| 0.62 | 0.19 | 3.46 |

TABLE I.-continued

COMPLEX REFRACTIVE INDEX, $n_2-jk_2$, FOR BULK GOLD FOR VARIOUS FREE-SPACE WAVELENGTHS $\lambda_0$

| $\lambda_0(\mu m)$ | $n_2$ | $k_2$ |
|---|---|---|
| 0.64 | 0.17 | 3.69 |
| 1.00 | 0.22 | 6.71 |
| 1.50 | 0.36 | 10.4 |
| 2.00 | 0.55 | 13.9 |
| 2.50 | 0.82 | 17.9 |
| 3.00 | 1.17 | 21.0 |
| 4.00 | 2.04 | 27.9 |
| 5.00 | 3.27 | 35.2 |
| 6.00 | 4.70 | 41.9 |
| 8.00 | 7.82 | 54.6 |
| 10.00 | 11.5 | 67.5 |
| 12.00 | 15.4 | 80.5 |

Figure 4A:
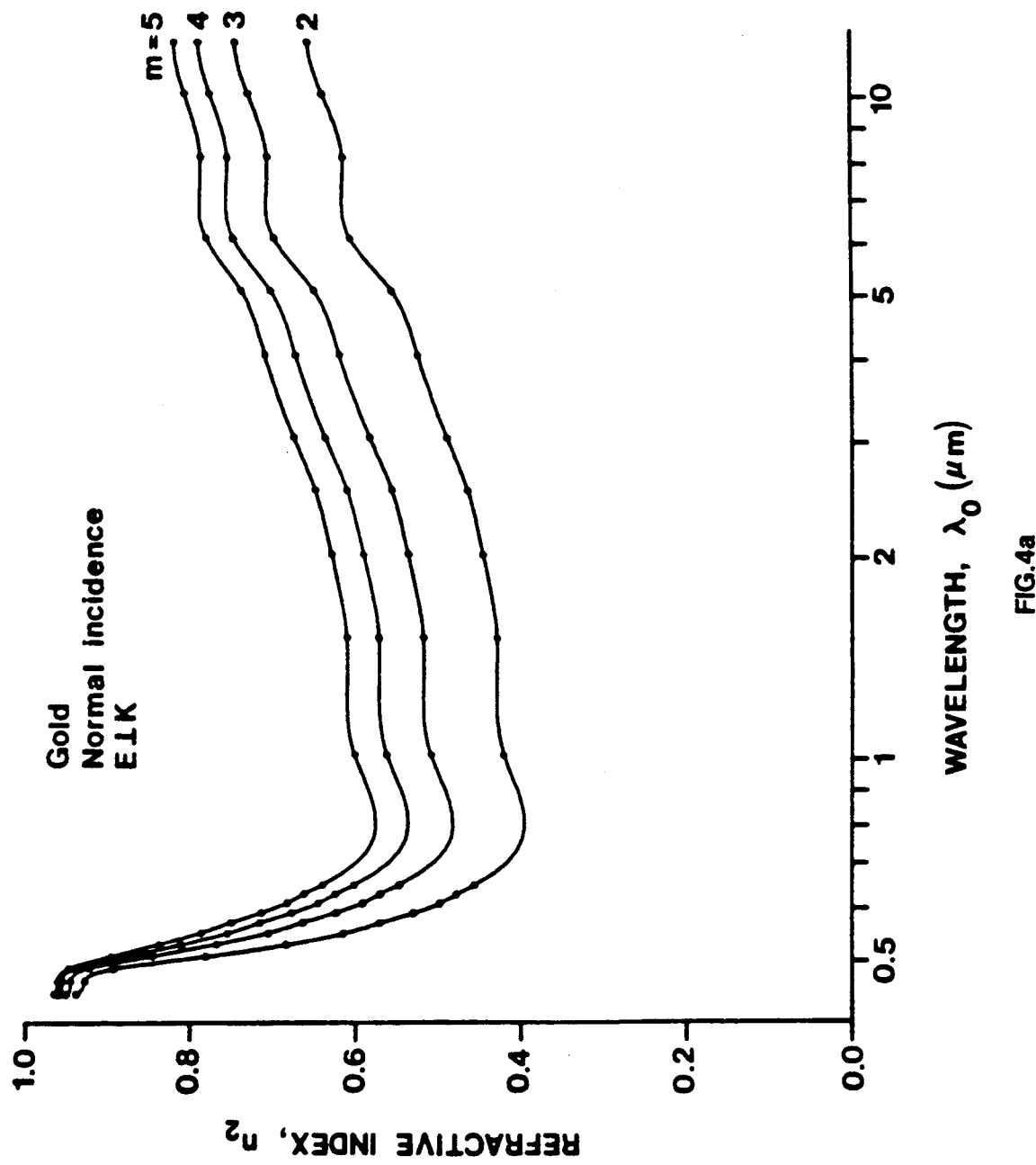
FIG. 4a graphs the refractive index required to produce zero reflectivity for TE polarization at normal incidence on gold as a function of normalized groove depth.
Figure 4C:
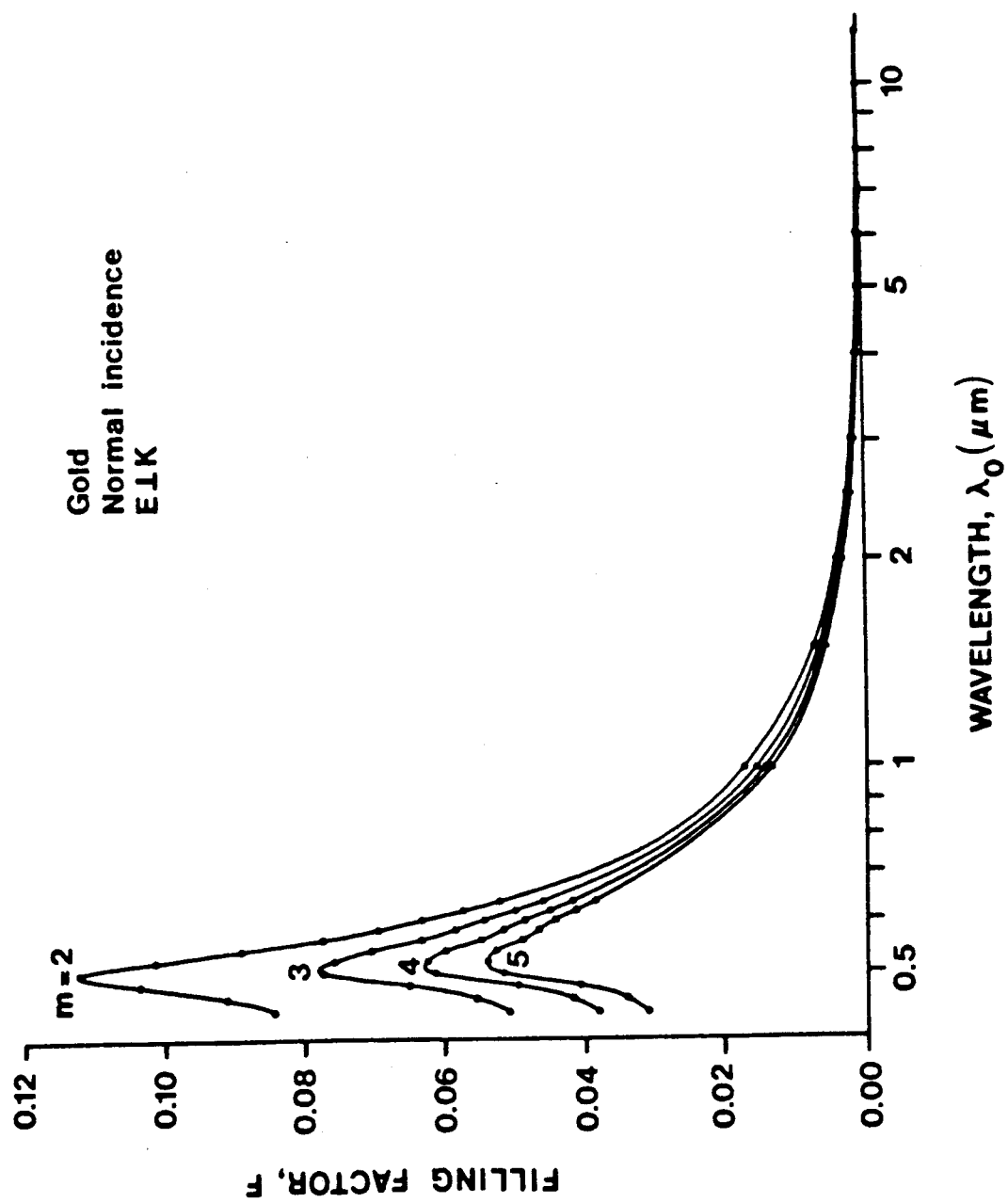
FIG. 4c graphs the filling factor required to produce zero reflectivity for TE polarization at normal incidence on gold as a function of wavelength required to produce zero reflectivity.

For TE polarization at normal incidence on gold, the calculated real ($n_2$) and imaginary ($\kappa_2$) parts of the complex refractive index for the lossy homogeneous layer are presented in FIGS. 4(a) and (b) respectively. The values of the filling factor (F) and the normalized groove depth ($d/\lambda_0$) for the corresponding grating are presented in FIGS. 4(c) and (d) respectively. As the integer m increases, the corresponding groove depth also increases. Therefore, the m=2 solution gives the shallowest normalized groove depth for TE incident polarization. The refractive index, $n_2$, and the extinction coefficient, $\kappa_2$, of the homogeneous layer are both less than unity for the entire range of wavelengths. The filling factor, F, of the grating is small for TE polarization. This corresponds to a grating that has widely spaced narrow ridges protruding from the substrate. As the wavelength increases, the zero-reflectivity grating's filling factor approaches zero as shown in FIG. 4(c).

Figure 4D:
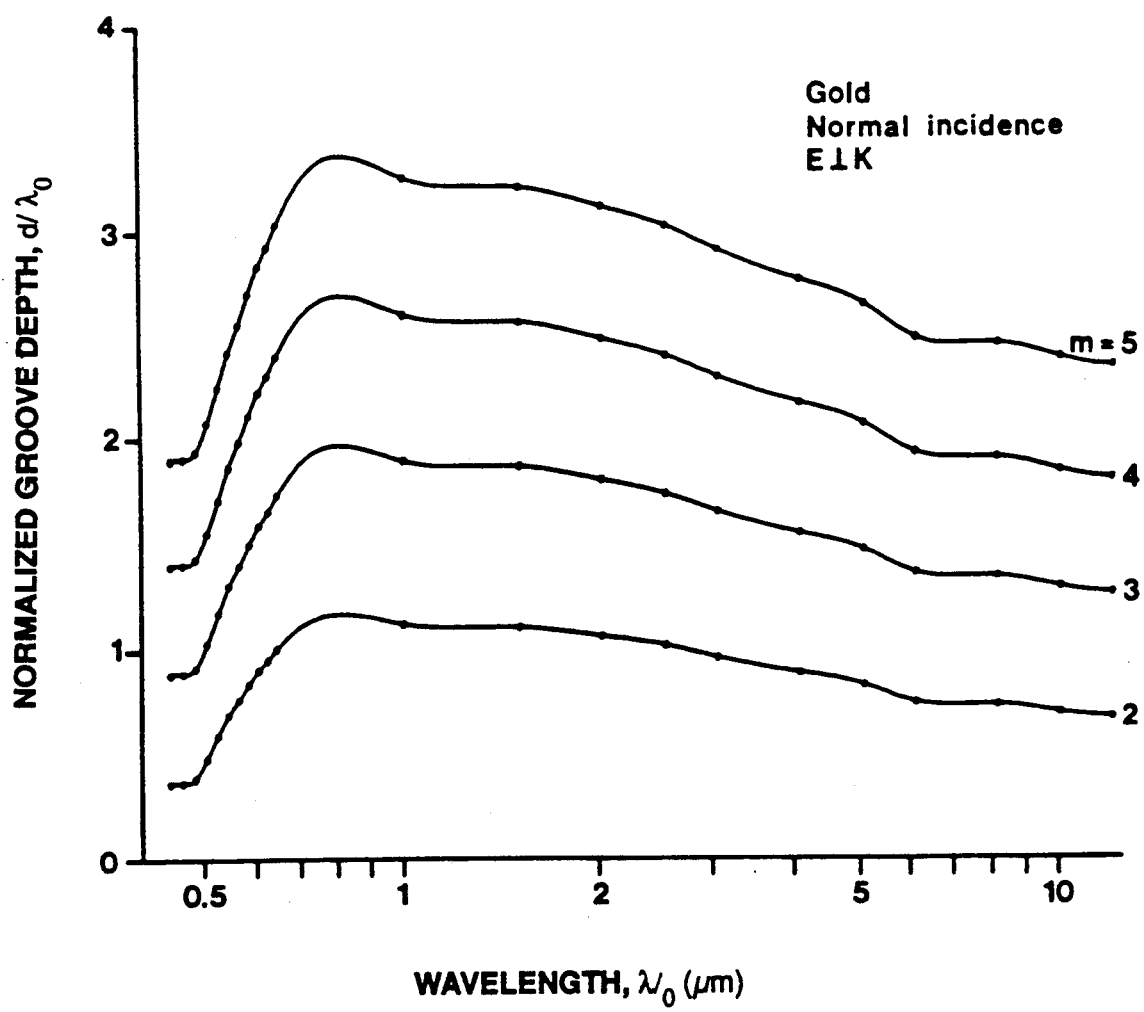
FIG. 4d graphs normalized groove depth for TE polarization at normal incidence on gold as a function of wavelength.
Figure 5A:
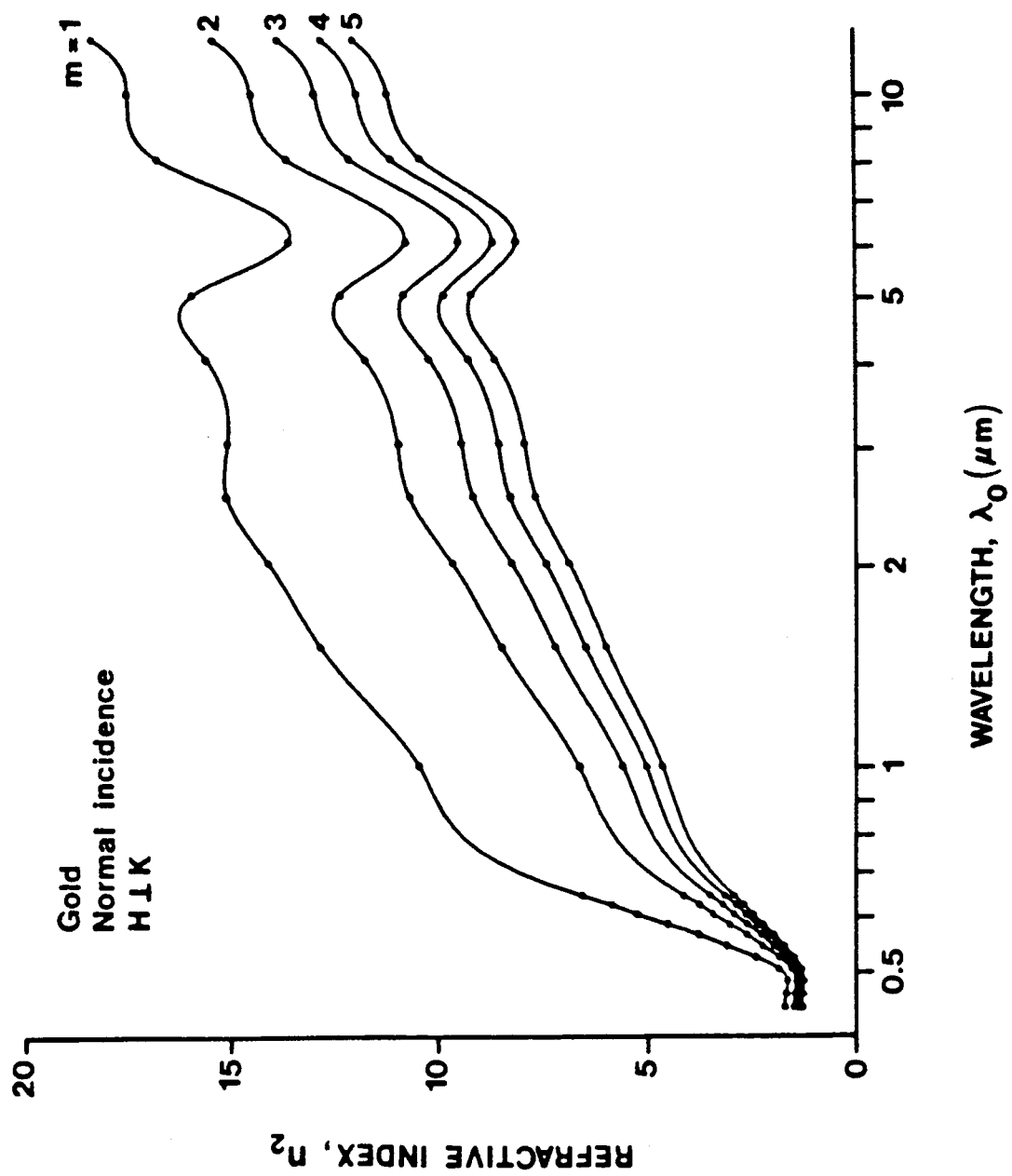
FIG. 5a graphs the refractive index required to produce zero reflectivity for TM polarization at normal incidence on gold as a function of wavelength.
Figure 5B:
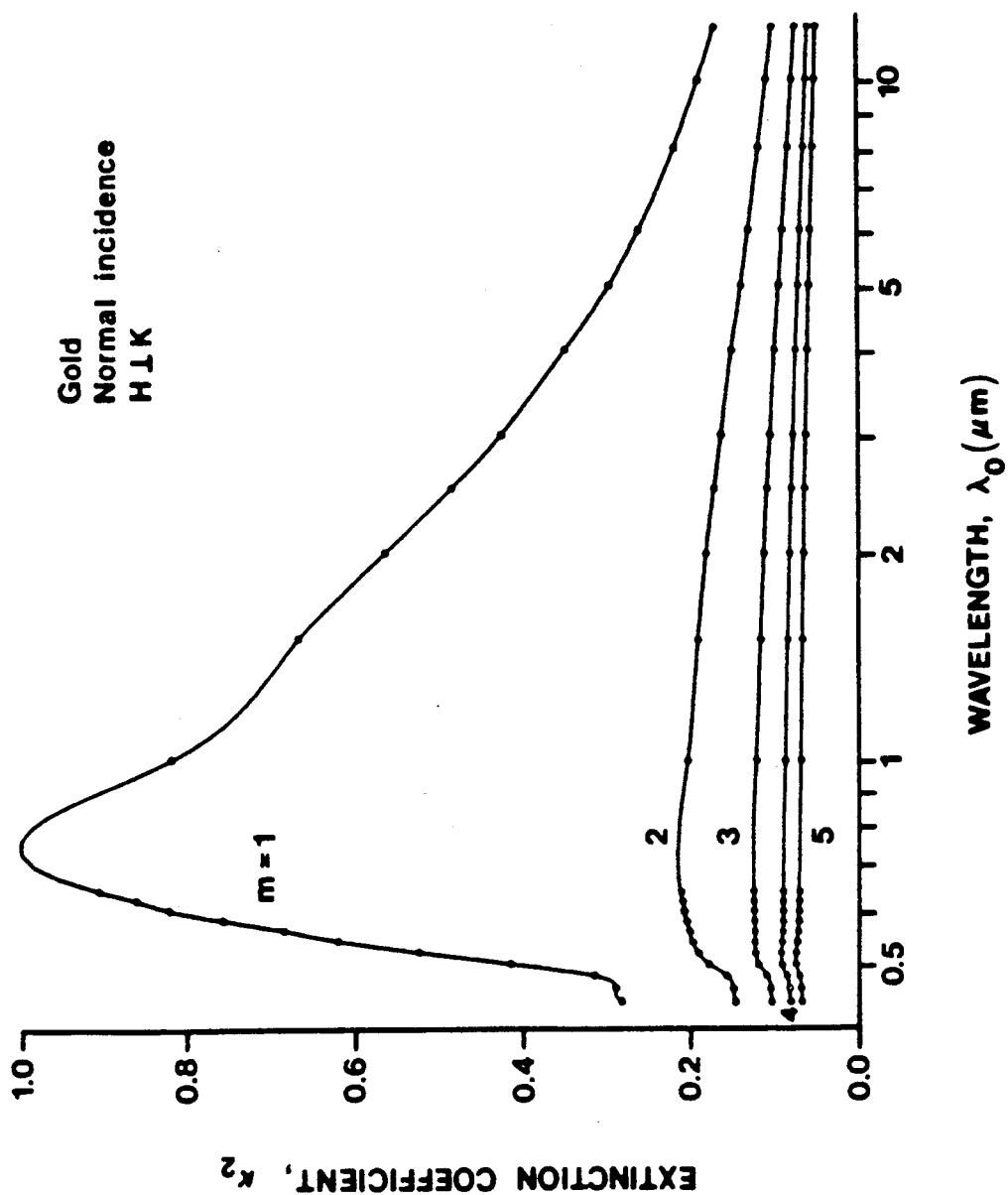
FIG. 5b graphs the extinction coefficient required to produce zero reflectivity for TM polarization at normal incidence on gold as a function of wavelength.
Figure 5C:
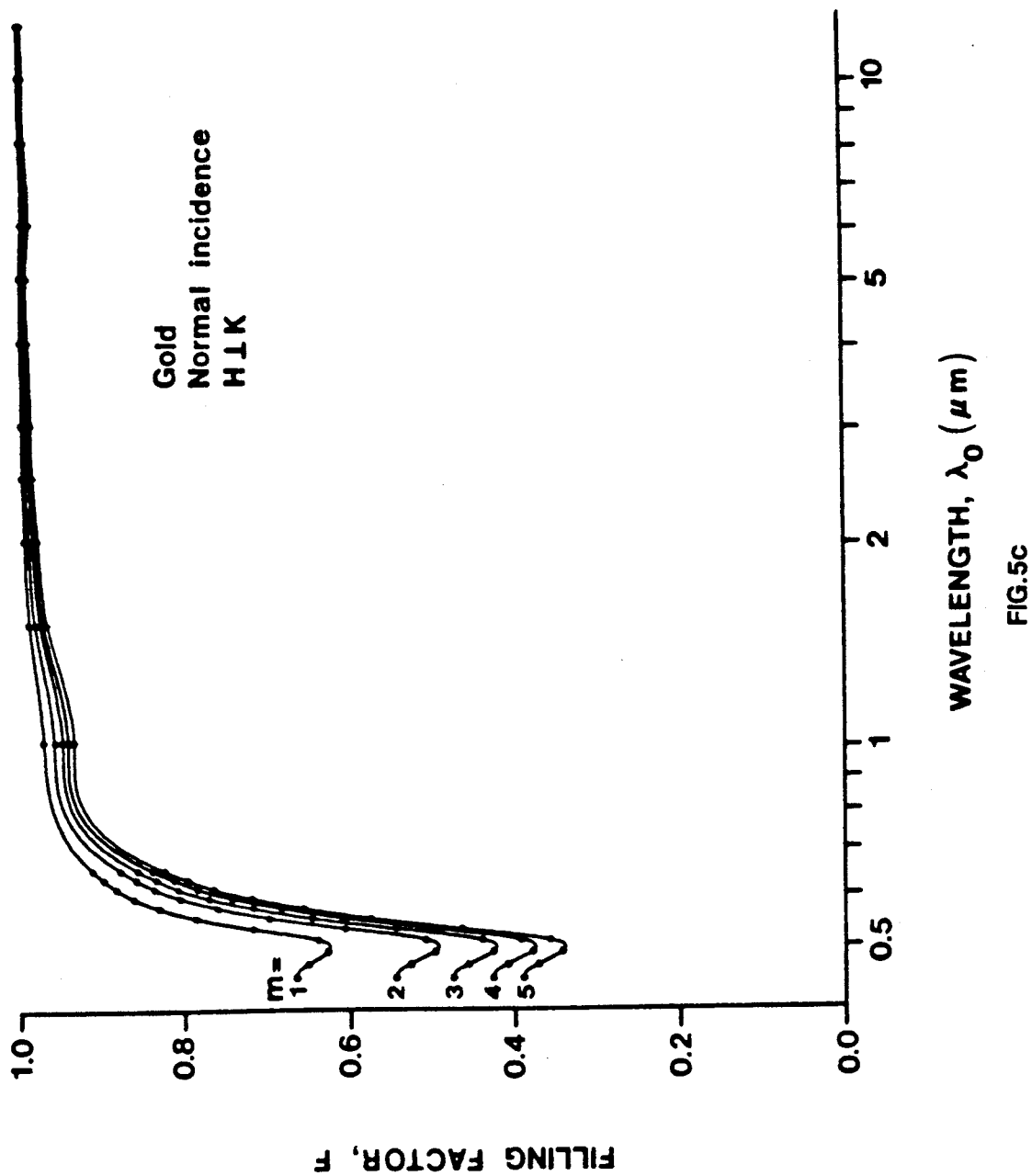
FIG. 5c graphs the filling fractor required to produce zero reflectivity for TM polarization at normal incidence on gold as a function of wavelength.
Figure 5D:
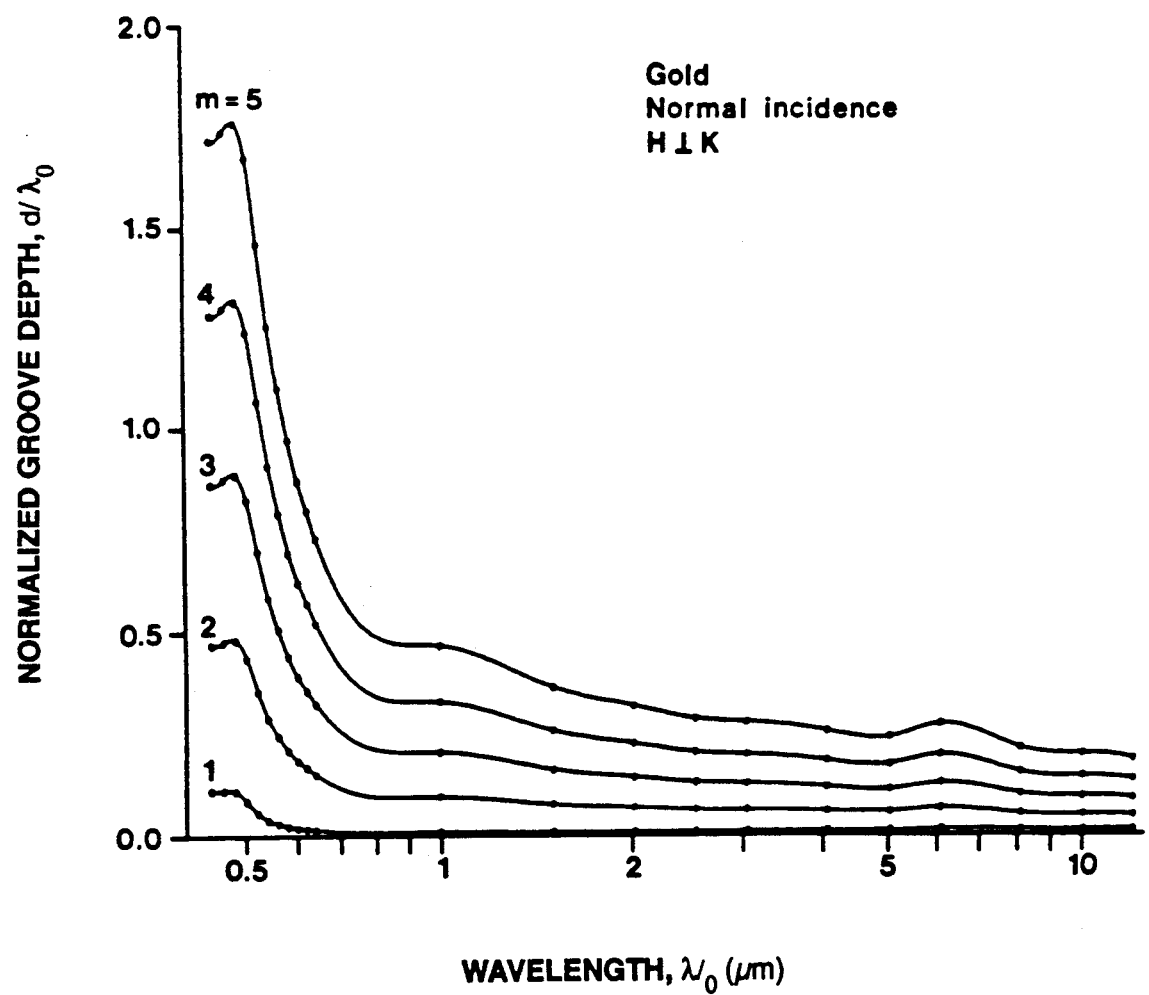
FIG. 5d graphs the normalized groove depth required to produce zero reflectivity for TM polarization at normal incidence on gold as a function of wavelength.

For TM polarization at normal incidence on gold, the calculated real and the imaginary parts of the complex refractive index for the lossy homogeneous layer are presented in FIGS. 5(a) and (b) respectively. The values of the filling factor and the normalized groove depth for the corresponding grating are presented in FIGS. 5(c) and (d) respectively. For this incident polarization, the m=1 solution exists and it gives the shallowest normalized groove depth. In contrast to the TE case the refractive index, $n_2$, is now always greater than unity. The extinction coefficient, $\kappa_2$, of the homogeneous layer is less than unity for the entire range of wavelengths as before. The filling factor, F, of the grating now has a wider range of possible values. Indeed, a zero-reflectivity grating with 50% filling factor (equal width ridges and grooves) is possible. Typically, however, the filling factor is relatively large for TM polarization. This corresponds to a rather flat surface grating that has widely spaced narrow grooves extending into the substrate. As the wavelength increases, the zero-reflectivity grating's filling factor approaches unity as shown in FIG. 5(c). The required normalized groove depth is much smaller for TM polarization [FIG. 5(d)] than it is for TE polarization [FIG. 4(d)].

Figure 6A:
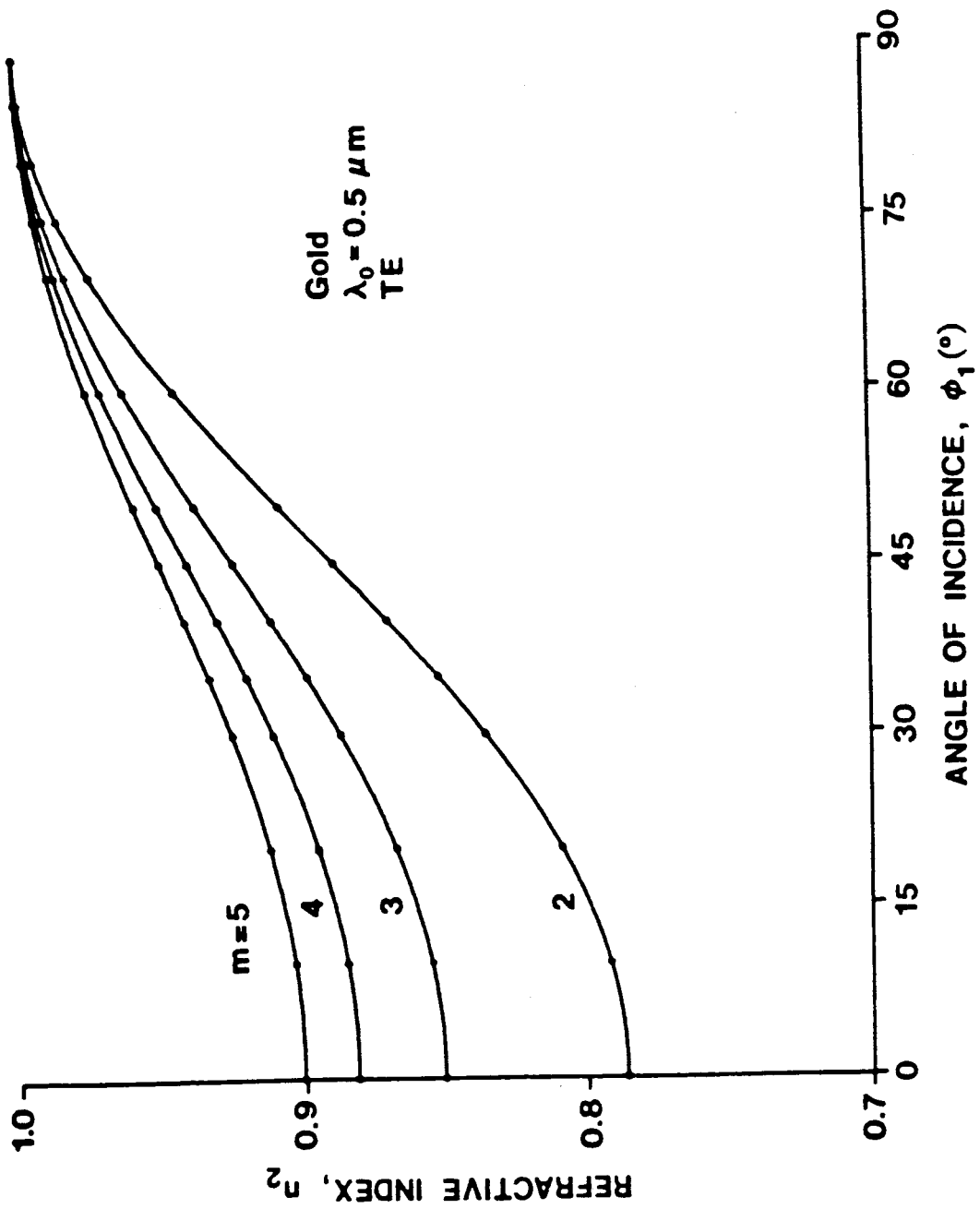
FIG. 6a graphs the normalized refractive index required to produce zero reflectivity for TE polarization of free-space wavelength $\lambda_0 = 0.5$ μm as a function of the angle of incidence on gold.
Figure 6B:
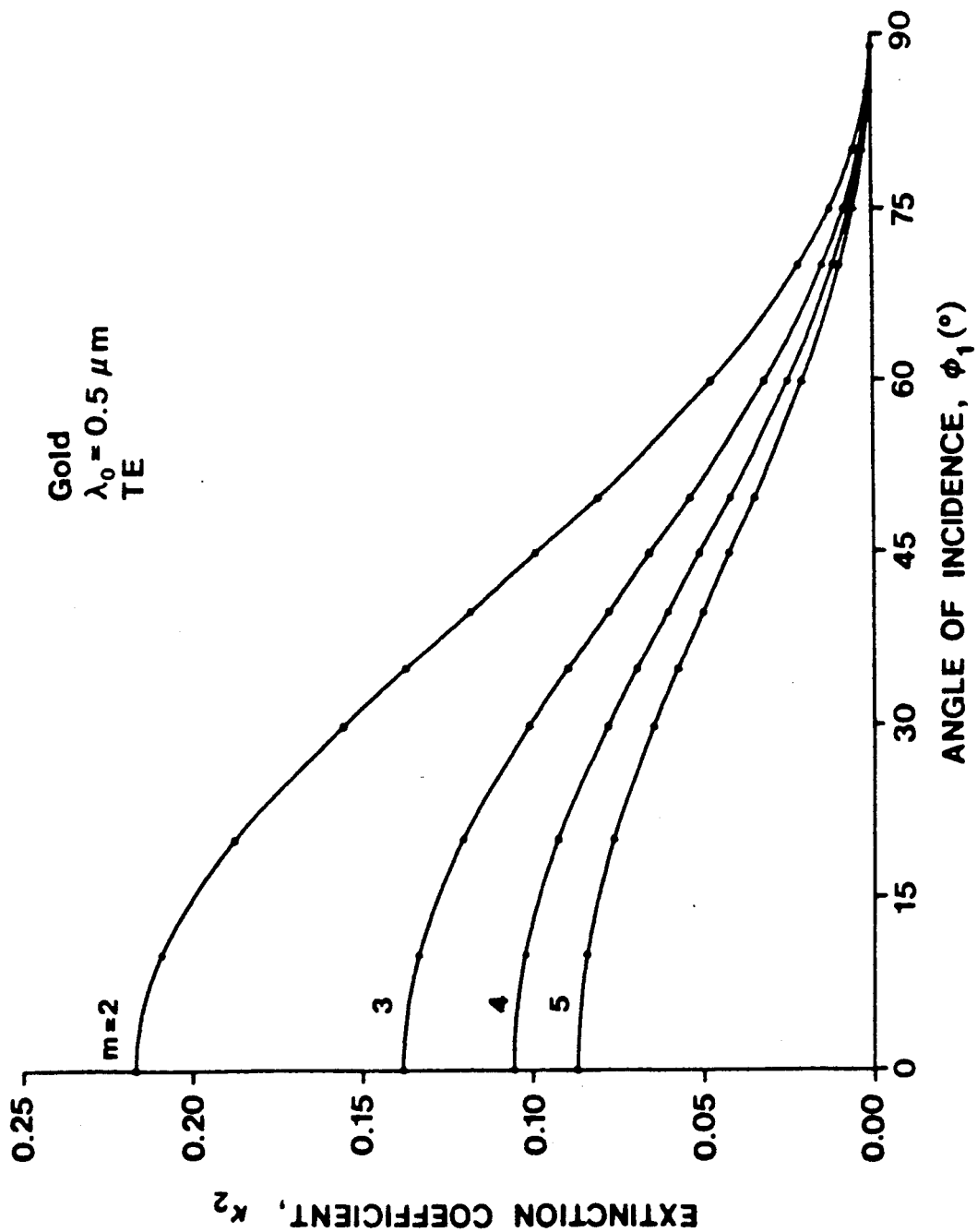
FIG. 6b graphs the normalized extinction coefficient required to produce zero reflectivity for TE polarization of free-space wavelength $\lambda_0 = 0.5$ μm as a function of the angle of the incidence on gold.
Figure 6C:
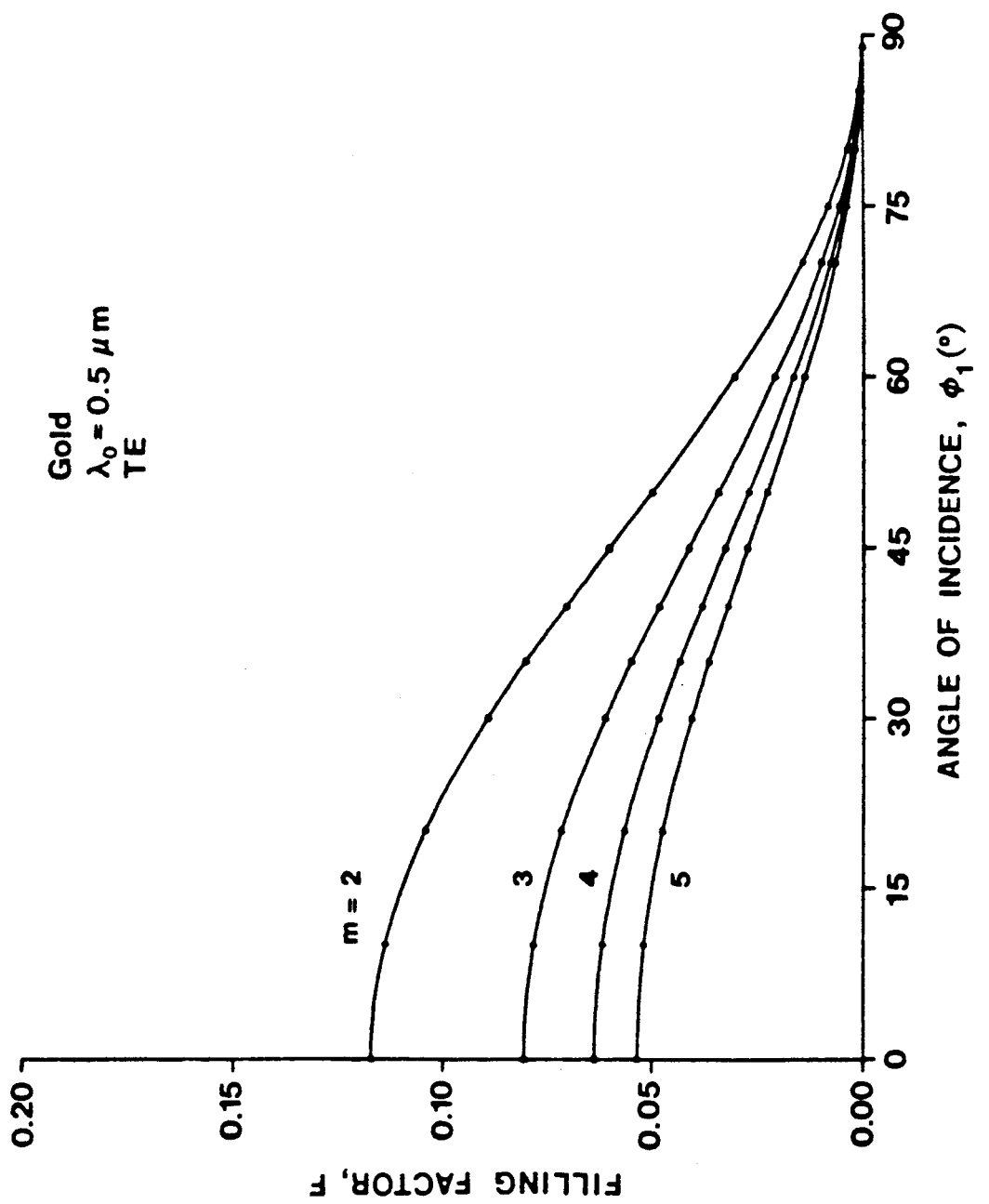
FIG. 6c graphs the filling factor required to produce zero reflectivity for TE polarization of free-space wavelength $\lambda_0 = 0.5$ μm as a function of the angle of incidence on gold.
Figure 6D:
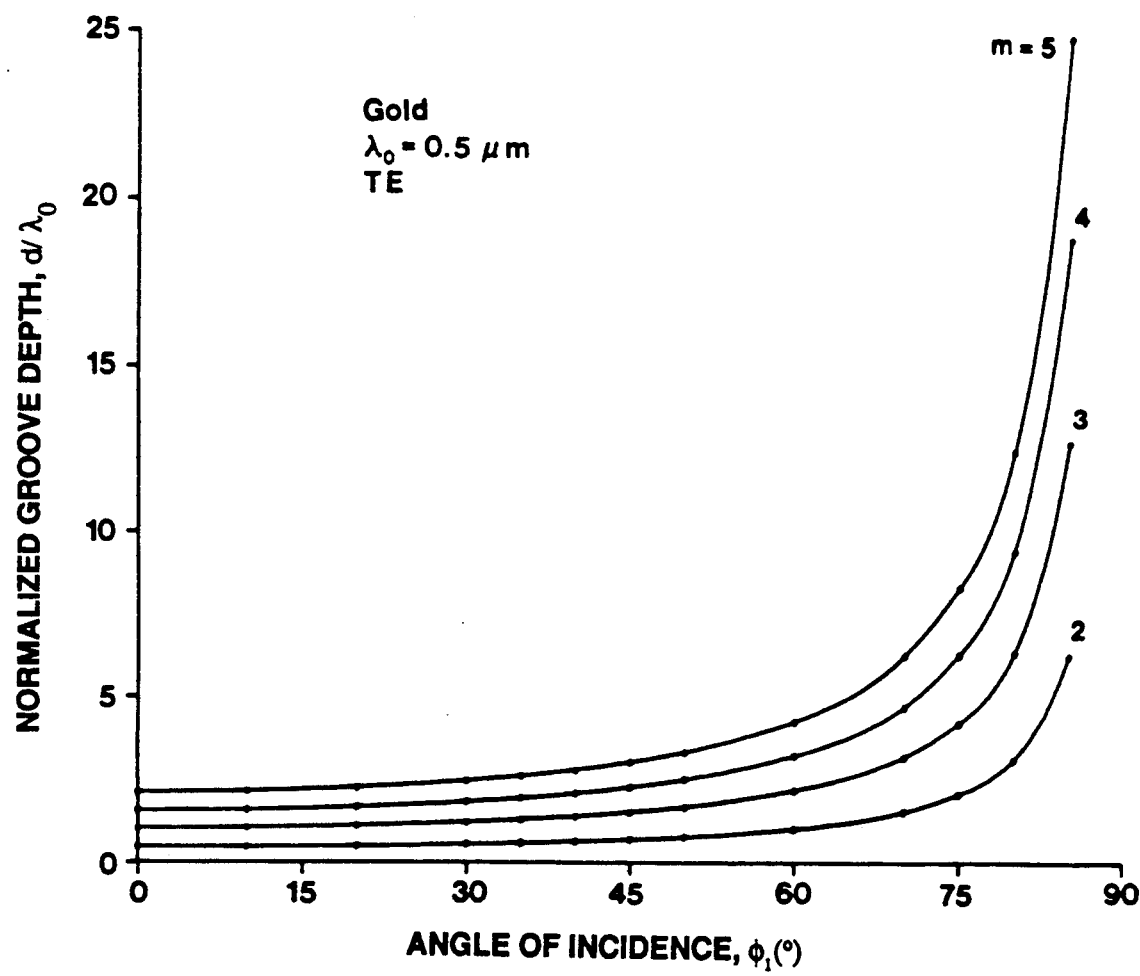
FIG. 6d graphs the normalized groove depth required to produce zero reflectivity for TE polarization of free-space wavelength $\lambda_0 = 0.5$ μm as a function of the angle of incidence on gold.
Figure 7A:
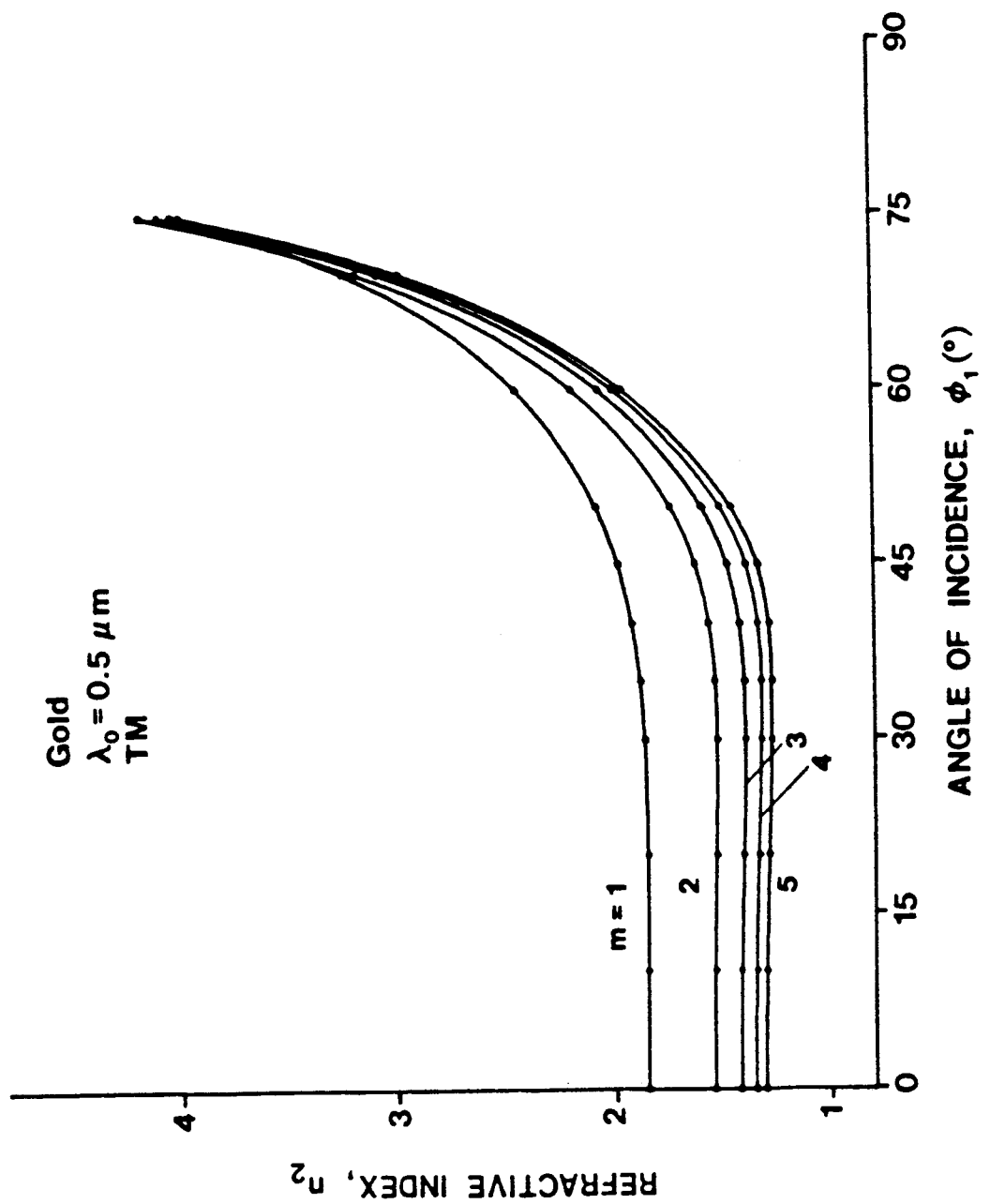
FIG. 7a graphs the refractive index required to produce zero reflectivity for TM polarization of free-space wavelength $\lambda_0 = 0.5$ μm as a function of the angle of incidence on gold.
Figure 7B:
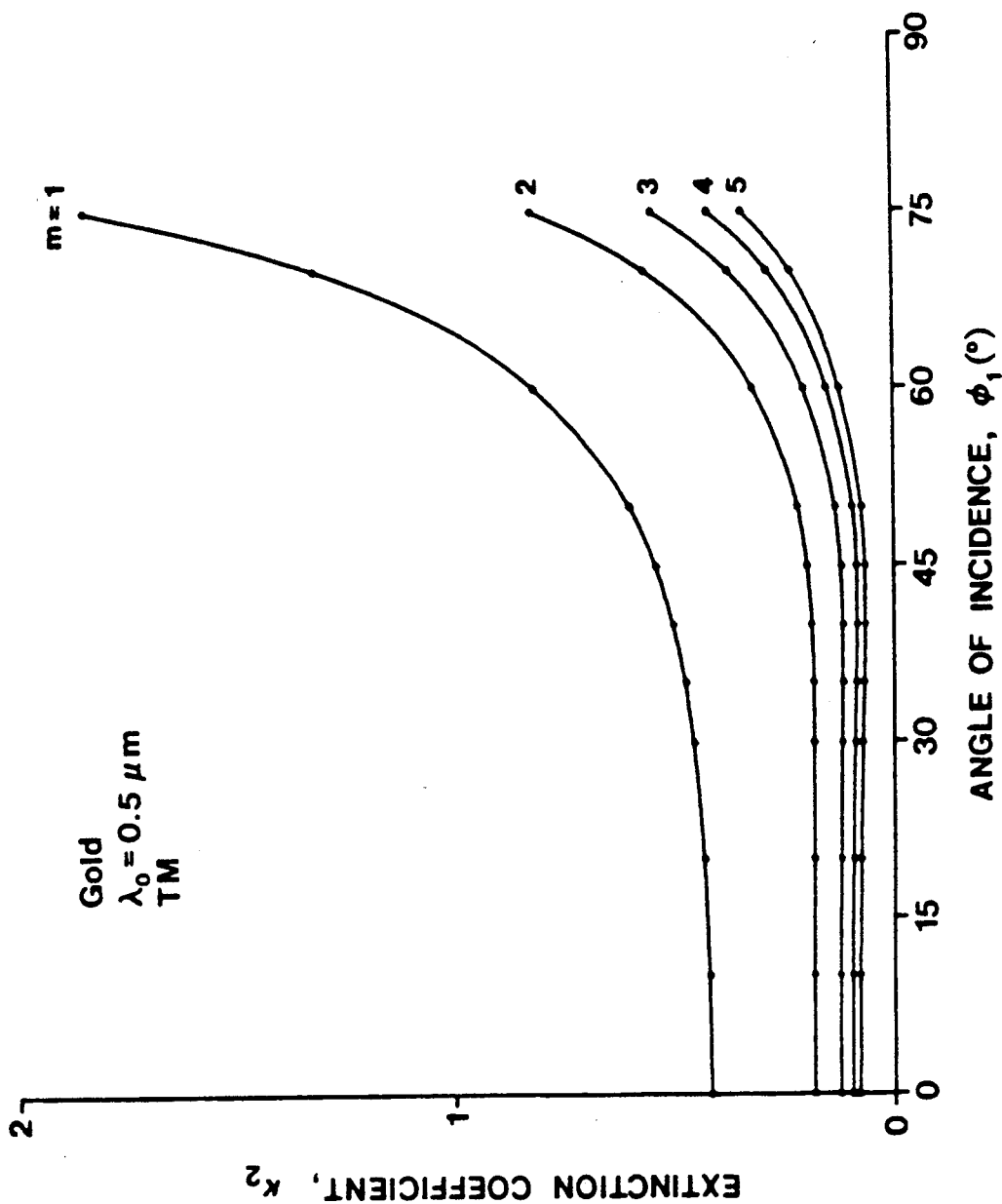
FIG. 7b graphs the extinction factor required to produce zero reflectivity for TM polarization of free-space wavelength $\lambda_0 = 0.5$ μm as a function of the angle of incidence on gold.
Figure 7C:
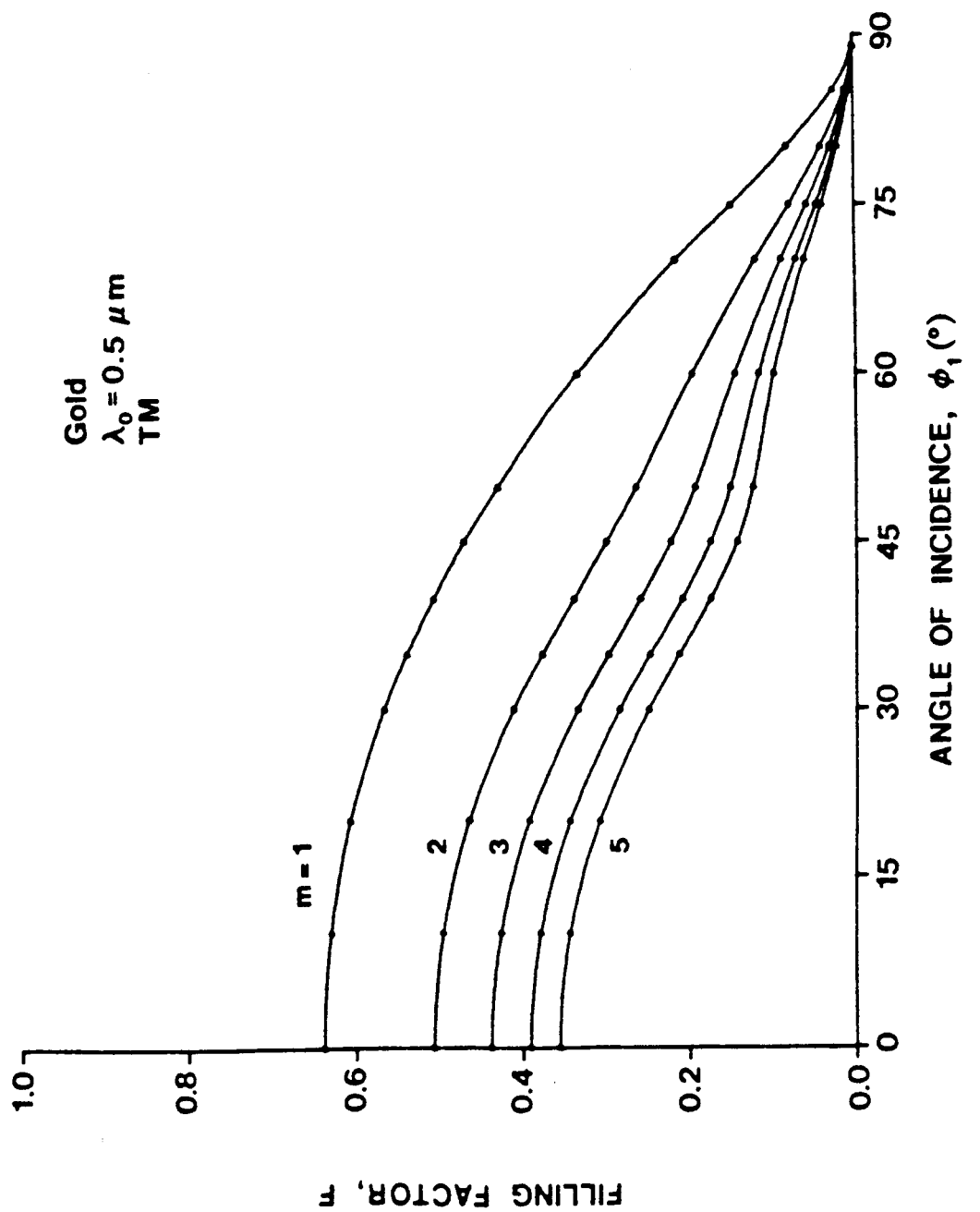
FIG. 7c graphs the filling factor required to produce zero reflectivity for TM polarization of free-space wavelength $\lambda_0 = 0.5$ μm as a function of the angle of incidence on gold.
Figure 7D:
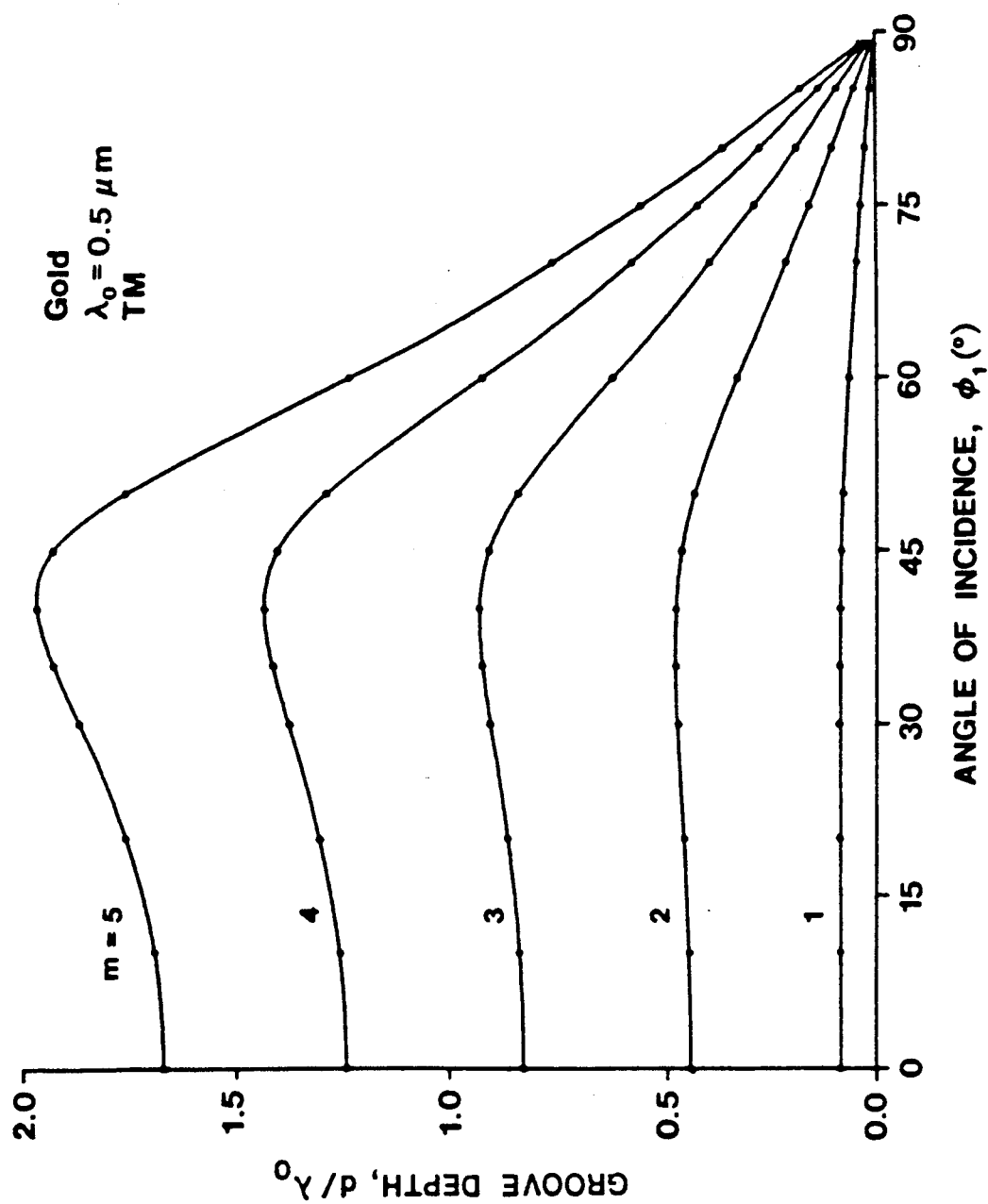
FIG. 7d graphs the normalized groove depth required to the produce zero reflectivity for TM polarization of free-space wavelength $\lambda_0 = 0.5$ μm as a function of the angle of incidence on gold.

Lossy homogeneous layers and their corresponding surface-relief gratings were also designed for oblique incidence and both TE and TM polarizations. Results for the case of gold at $\lambda_0=0.5$ $\mu m$ are presented here as an example. For zero reflectivity with TE polarization, as shown in FIGS. 6(a)-(c), the refractive index monotonically increases with increasing angle of incidence while the extinction coefficient and the filling factor decrease with increasing angle of incidence. The required normalized groove depth remains nearly constant for angles of incidence up to 60° as shown in FIG. 6(d). It then increases for $\phi_1$ approaching 90° (grazing incidence). For zero reflectivity with TM polarization as shown in FIGS. 7(a)-(b), the refractive index and the extinction coefficient both monotonically increase with angle of incidence. The extinction coefficient thus behaves in a manner opposite to that for the TE case. The required filling factor decreases with angle of incidence in a similar fashion to that with TE polarization. Zero reflectivity is shown to be possible with a 50% filling factor (F=0.5) for TM polarization at an angle of incidence of about 40° [FIG. 7(c)]. The required groove depth again remains nearly constant as the angle of incidence increases. Beyond 45°, however, it monotonically decreases as shown in FIG. 7(d). In these plots (FIGS. 4-7), the computed solutions are given by the solid dots. A continuous line, calculated by cubic spline interpolation, has been provided for ease of interpretation.

V. Reflectivity Characteristics

With a knowledge of the polarization, the complex refractive index, $n_2-j\kappa_2$, and the thickness, d, the input impedance of the structure, as given by Eq. (10), can be calculated. Using the values of these quantities obtained by solving the equations in the Appendix, it is easy to show that these solutions produce impedance matching ($Z_{in}=Z_1$). For the examples presented, the lossy homogeneous layer on a substrate and the corresponding surface-relief grating on a substrate appear to have the impedance of free-space to an incident wave. Thus, there is no reflected wave! If the substrate is sufficiently thick, all of the power is absorbed.

Figure 8A:
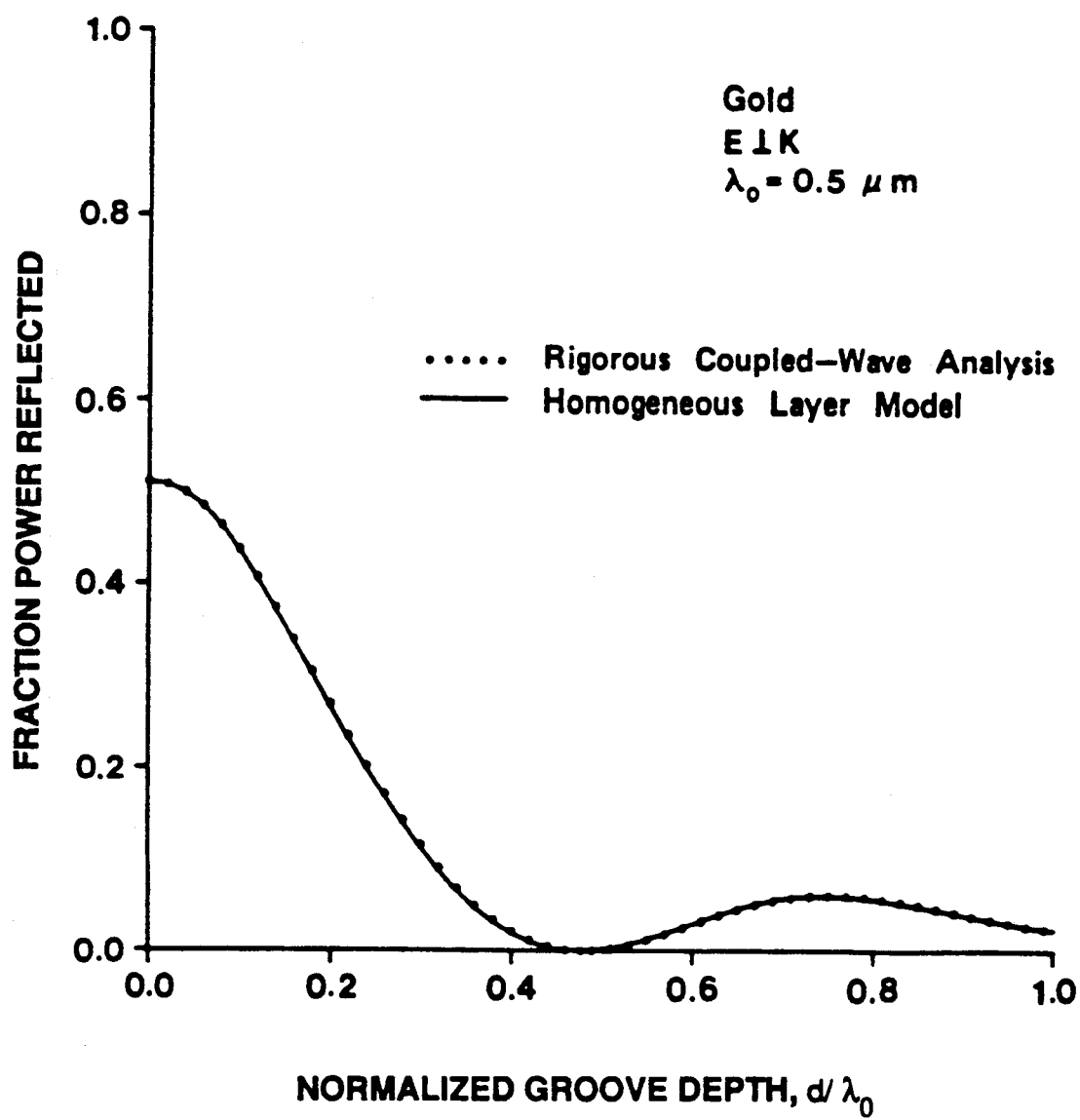
FIG. 8a graphs the fraction of power reflected as a function of normalized groove depth for free-space wavelength $\lambda_0 = 0.5$ μm normally incidence on gold determined by the homogeneous layer model with rigorous coupled-wave analysis for TE polarization.
Figure 8B:
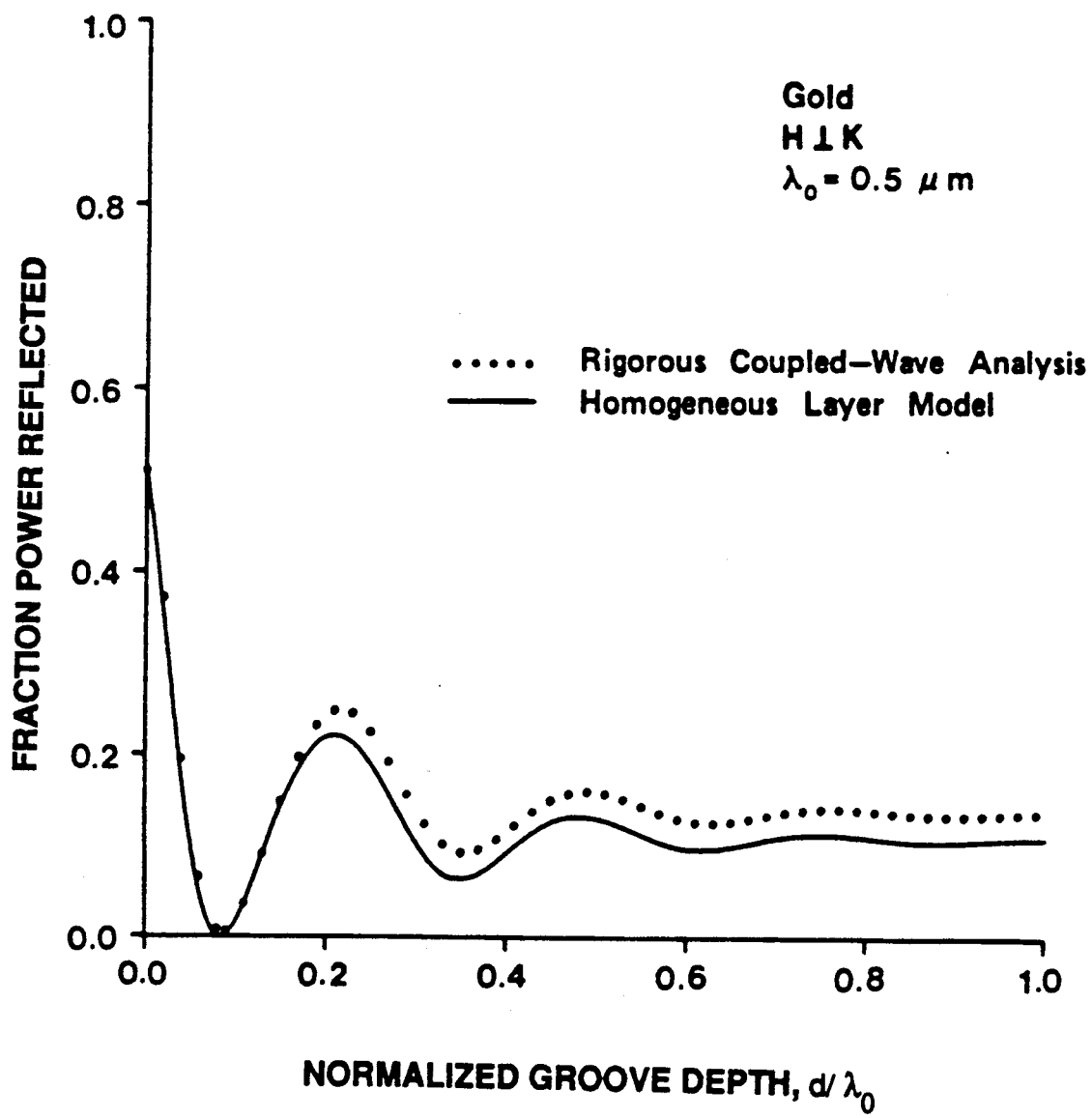
FIG. 8b graphs the fraction of power reflected as a function of normalized groove depth for free-space wavelength $\lambda_0 = 0.5$ μm normally incidence on gold determined my the homogeneous layer model with rigorous coupled-wave analysis for TM polarization.
Figure 9A:
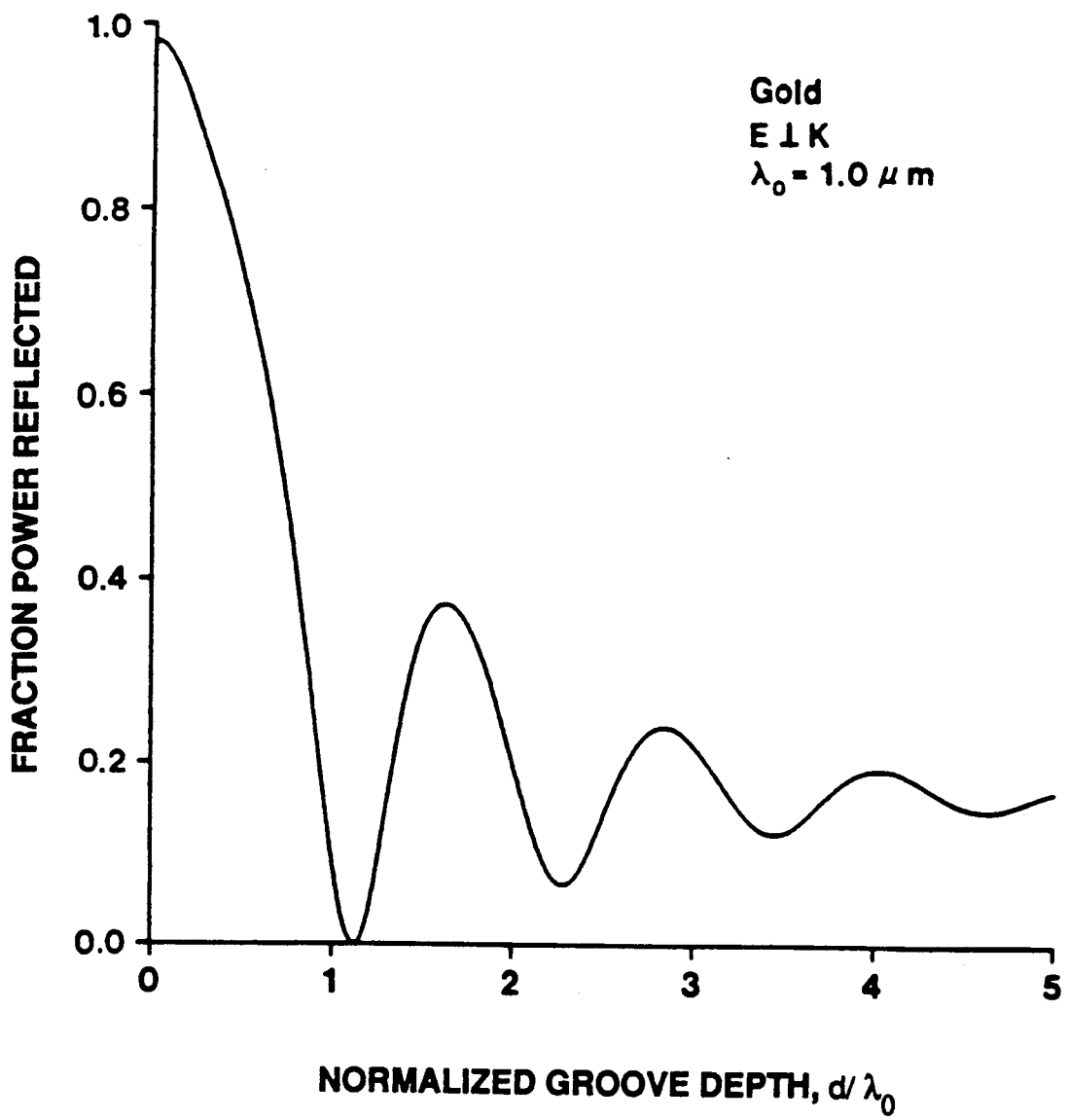
FIG. 9a graphs the fraction of power reflected as a function of normalized groove depth for free-space wavelength $\lambda_0 = 1.0$ μm normally incident on gold for TE polarization.
Figure 9B:
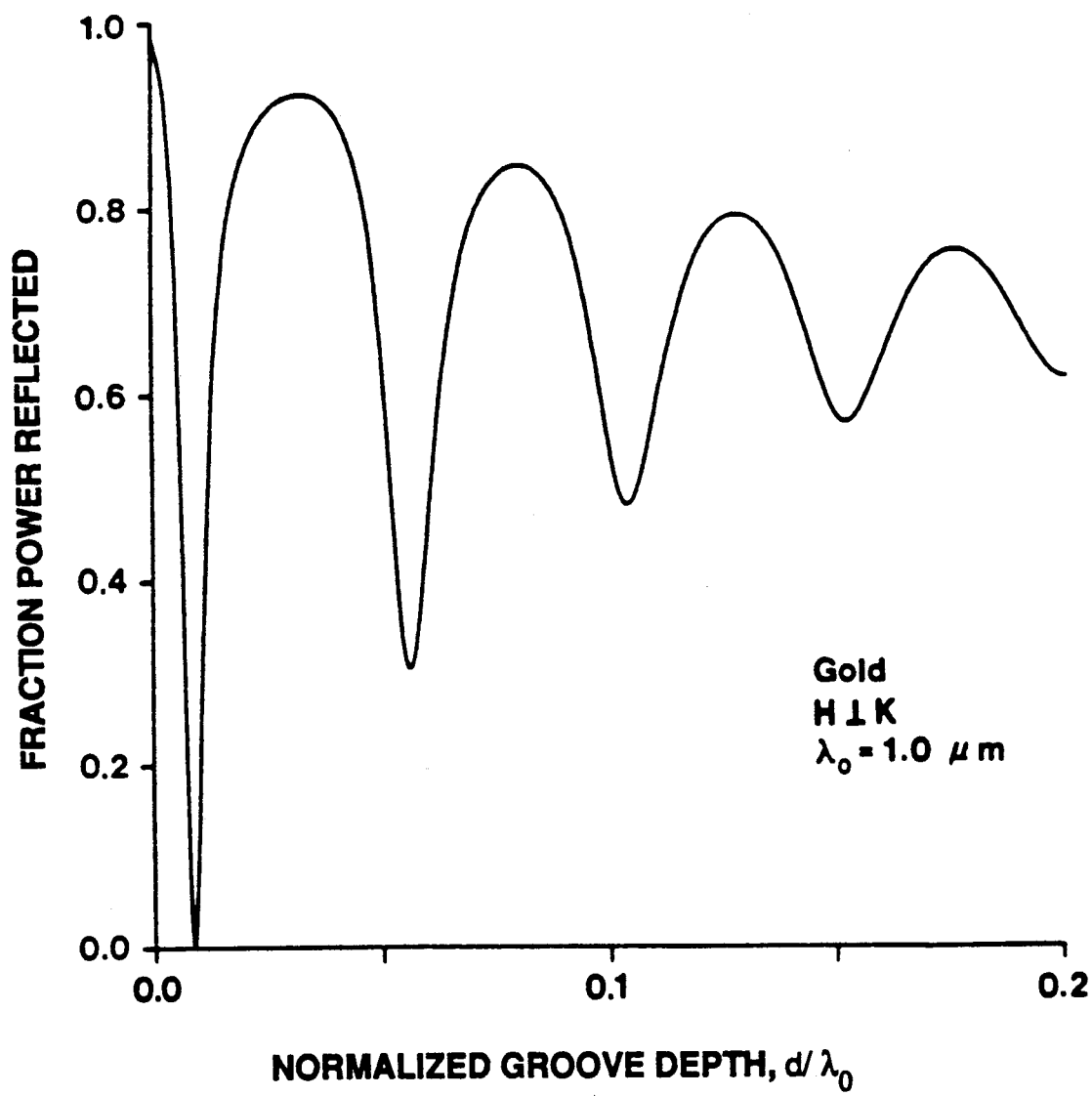
FIG. 9b graphs the fraction of power reflected as a function of normalized groove depth for wavelength $\lambda_0 = 1.0$ μm normally incident on gold for TM polarization.
Figure 10A:
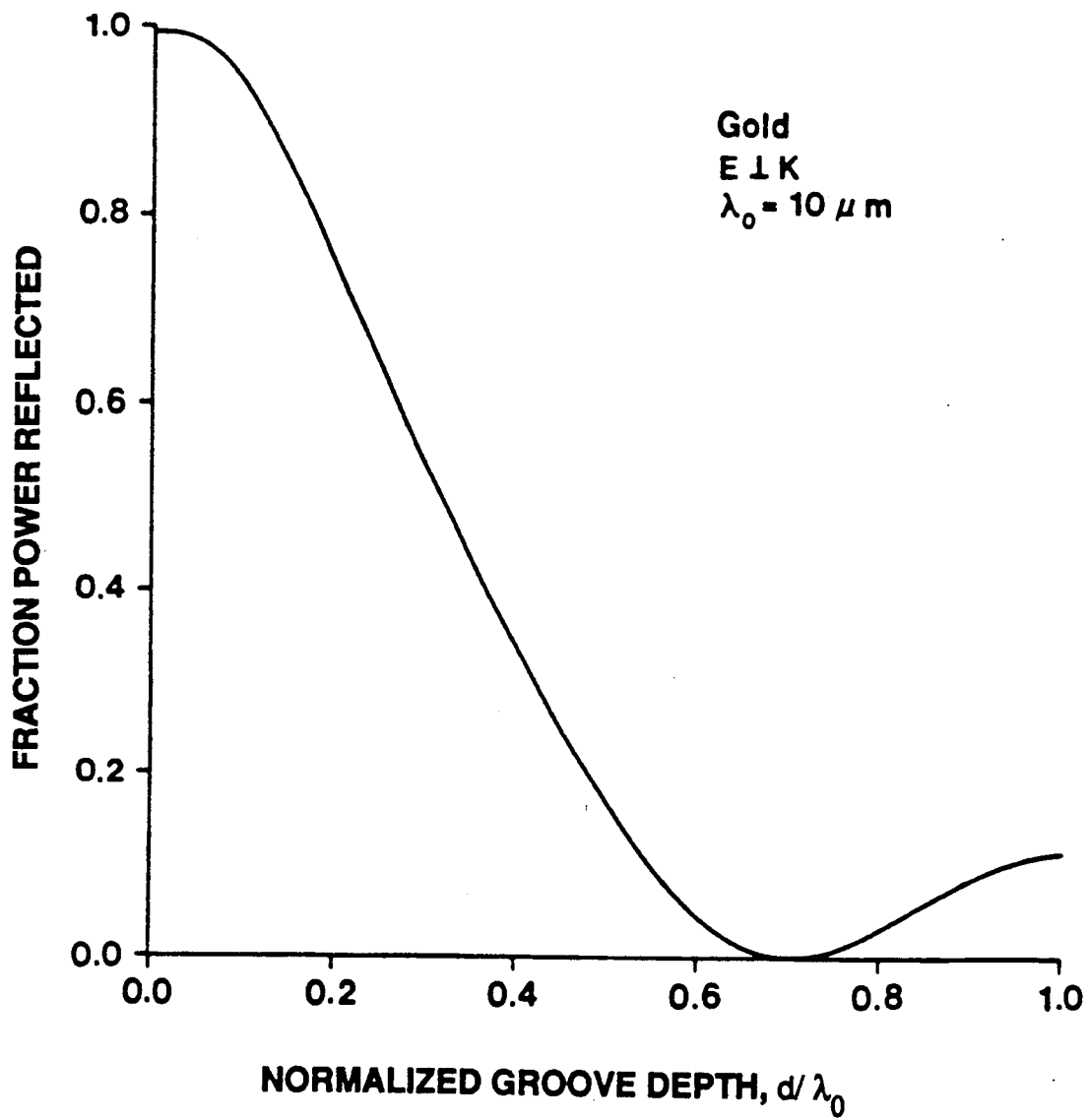
FIG. 10a graphs the fraction of power reflected as function of normalized groove depth for free-space wavelength $\lambda_0 = 10$ μm normally incident on gold for TE polarization.
Figure 10B:
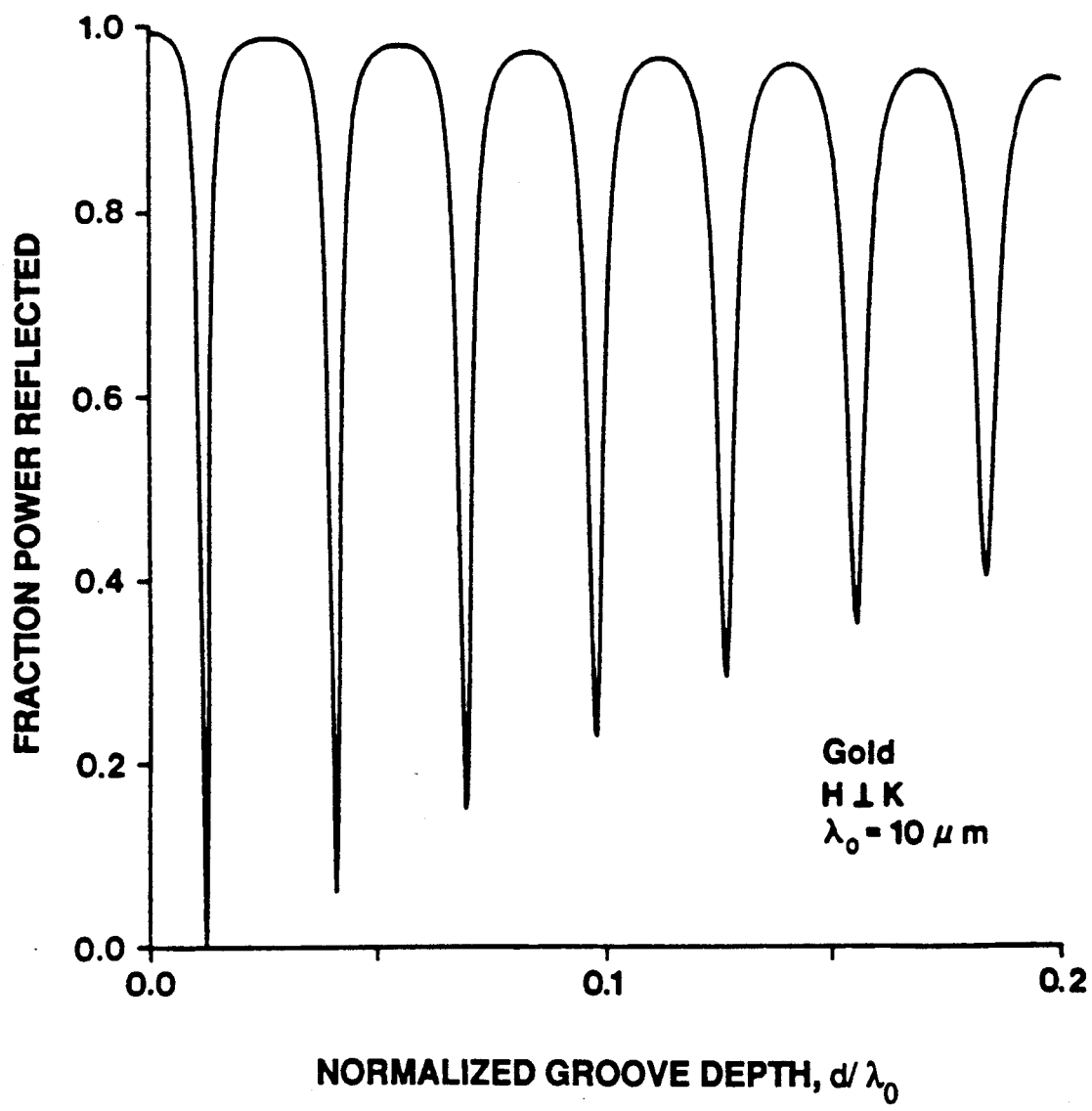
FIG. 10b graphs the fraction of power reflected versus normalized groove depth for a free-space wavelength $= 10$ μm normally incident on gold for TM polarization.

In order to examine the optical characteristics of both the lossy homogeneous layers on substrates and the corresponding surface-relief gratings on substrates, the fraction of the incident power reflected was calculated with the parameters obtained previously, but with a wide range of values for thickness, d. For the homogeneous layer structures, the rigorous formulation presented previously was used. For the rectangular surface-relief gratings, the rigorous coupled-wave analysis was used. The rigorous coupled-wave analysis of grating diffraction was first applied to dielectric and then lossy planar (volume) gratings. Rigorous coupled-wave analysis has also been applied to dielectric and metallic surface-relief gratings. Details of our rigorous coupled-wave approach applied to surface-relief gratings are provided in two papers published by M. G. Moharam and T. K. Gaylord, "Diffraction Analysis of Dielectric Surface-Relief Gratings," *J. Optical Soc. Amer.* 72, 1385 (1982) and "Rigorous Coupled-Wave Analysis of Metallic Surface-Relief Gratings," *J. Optical Soc. Amer. A* 3, 1780 (1986). Due to the fact that surface-relief gratings with rectangular profiles can be treated as single layer structures, the calculations are relatively straightforward. The results of these calculations are shown in FIGS. 8-10.

From the homogeneous lossy layer analysis, a null in the reflected power is calculated exactly at the value of groove depth predicted for both polarizations. Parameter values for the smallest thickness values were used. The reflected power oscillates with increasing thickness as shown in FIGS. 8-10. For TE polarization, the first minimum in the reflected power versus thickness curve becomes the null if m=2. This happens because there is no first branch solution for the TE polarization. For a general value of m for this polarization, the (m−1)-th minimum becomes the null and the other minima are all non-zero. For example, if the calculated parameters for m=5 are used, then the fourth minimum (only) decreases to zero. For TM polarization, the first minimum in the reflected power with increasing thickness is a null if m=1. For a general value of m for this polarization, the m-th minimum is the null in the reflected power versus thickness curve. For TE polarization, the resulting minima tend to be rounded, while for TM polarization, the nulls are much sharper. As the groove depth increases to infinity, the reflected power oscillations damp out and the reflectivity asymptotically approaches a value of $R=[(N_1-N_2)^2+K_2^2]/[(N_1+N_2)^2+K_2^2]$. At normal incidence, the asymptotic value is $R=[(n_1-n_2)^2+\kappa_2^2]/[(n_1+n_2)^2+\kappa_2^2]$, the value of reflectivity that would occur for a normally incident wave upon a boundary of infinitely thick material of complex refractive index, $n_2-j\kappa_2$.

Figure 11:
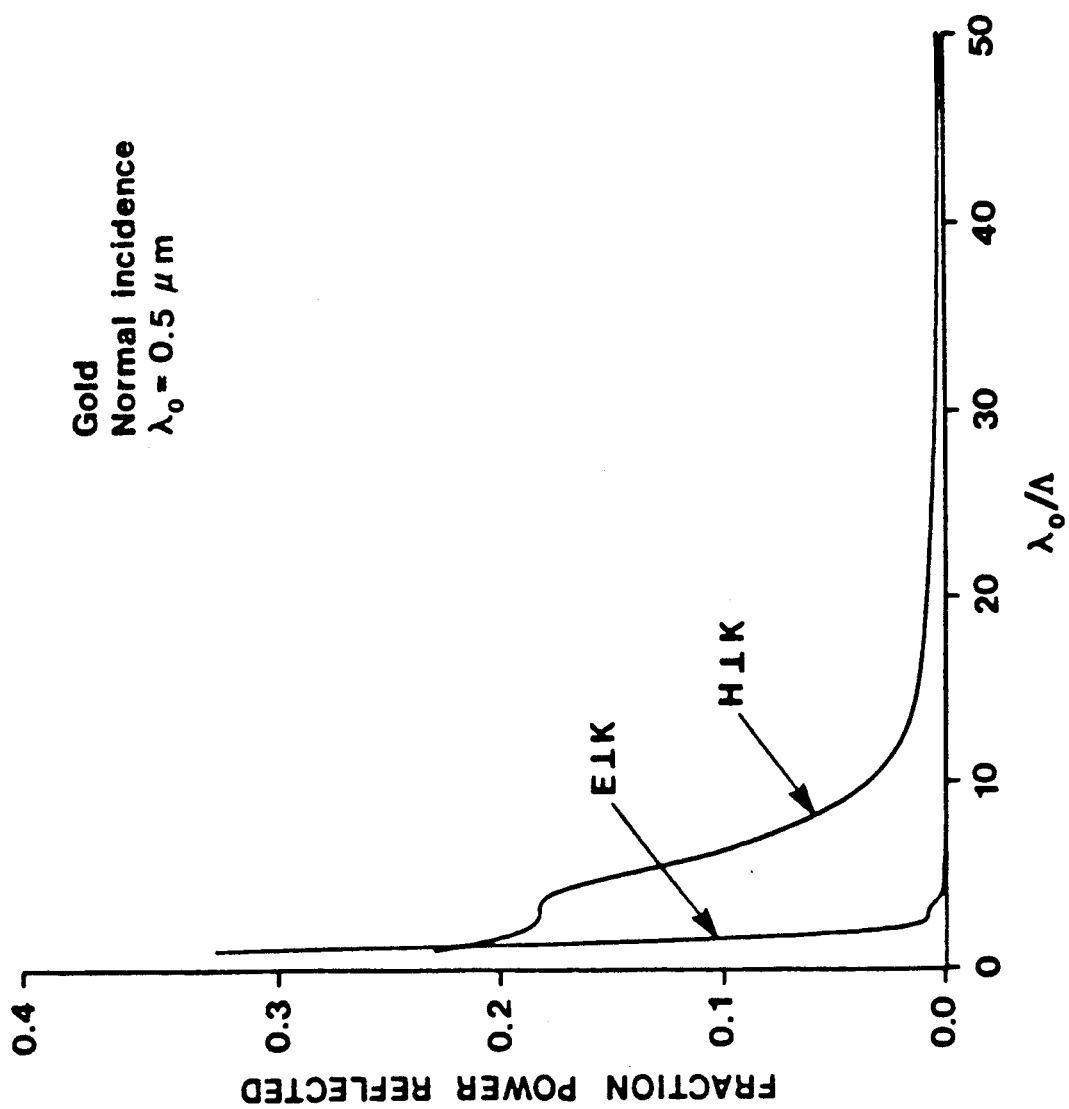
FIG. 11 illustrates the fraction of power reflected from a gold rectangular-groove surface-relief grating as a function of grating spatial frequency at $\lambda_0 = 0.5$ μm for TE and TM polarizations as calculated by rigorous coupled-wave grating diffraction analysis.

From the rigorous coupled-wave analysis of the corresponding short-period gratings, a minimum in the zero-order reflected power is likewise observed. This is also shown in FIG. 8a for TE polarization and in FIG. 8b for TM polarization. As the $\lambda_0/\Lambda$ ratio increases (decreasing grating period), all diffracted orders except the zero-order bcome evanescent (cutoff). As the grating period decreases, the long wavelength limit is approached and the resultant gratings beahve in exactly the same manner as single homogeneous layers. This is shown in FIG. 11 for both polarizations. The zero-order backward-diffracted wave intensity is calculated with the rigorous coupled-wave analysis for a wave of $\lambda_0=0.5$ μm normally incident on gold gratings which have filling factors equal to the antireflection values predicted by the present work (F=0.11689 and $d/\lambda_0=0.47779$ for TE polarization and F=0.63841, and $d/\lambda_0=0.083629$ for TM polarization) grating. As the period decreases, the reflected power asymptotically approaches zero as predicted. For TE polarization, the fraction of the power reflected decreases more rapidly with increasing spatial frequency than does the reflected power for TM polarization. From FIG. 11, it is observed that the long wavelength limit is reached for TE polarization in this case when there are only four grating periods per free-space wavelength. For TM polarization, the long wavelength limit is approached more gradually and requires about twenty grating periods per free-space wavelength to be reached.

VI. Observations, Experimental Results, and Application of Dielectric Coatings

For the homogeneous lossy layers and their corresponding rectangular surface-relief gratings in the long wavelength limit as calculated by the impedance matching method described previously, the effective index of the structure is indeed matched to that of the surrounding medium. Example calculations were presented for gold in air (free-space). The required layers or gratings to match the gold to free-space were presented for a wavelength in the range of $\lambda_0=0.44$ μm to 12.0 μm and for both polarizations. Using the parameters calculated for these cases of normal incidence in air, the real part of the effective index of the structure is unity and the imaginary part is zero. Thus there is no reflected power. If the substrate is sufficiently thick the structure absorbs all incident power. At the design wavelength and polarization, these surfaces would appear to be "flat black."

Numerous results were noted based on the zero-reflectivity cases presented. For incident TE polarization, these include: (1) $0<n_2<1$; (2) $0<N_2<1$; (3) $n_2>N_2$; (4) $n_2\rightarrow$(approaches) 1 as $\phi_1\rightarrow 90°$; (5) $N_2\rightarrow 0$ as $\phi_1\rightarrow 90°$; (6) $0=\kappa_2<1$; (7) $0<K_2<1$; (8) $\kappa_2<K_2$; (9) $\kappa_2\rightarrow 0$ as $\phi_1\rightarrow 90°$; (10) $K_2\rightarrow 0$ as $\phi_1\rightarrow 90°$. For incident TM polarization, the corresponding results are: (1) $n_2>1$; (2) $N_2>1$; (3) $n_2<N_2$; (4) $n_2\rightarrow\infty$ as $\phi_1\rightarrow 90°$; (5) $N_2\rightarrow\infty$ as $\phi_1\rightarrow 90°$; (6) $0<\kappa_2<\infty$; (7) $0<K_2<\infty$; (8) $\kappa_2>K_2$; (9) $\kappa_2\rightarrow\infty$ as $\phi_1\rightarrow 90°$; (10) $K_2\rightarrow\infty$ as $\phi_1\rightarrow 90°$.

Other observations about the zero-reflectivity cases presented include: (1) The real part of the complex refractive index, $n_2$, does not necessarily lie in the range $n_1<n_2<n_3$. (2) The real part of the complex refractive index, $n_2$, is not necessarily less than unity if $n_3<1$. (3) Zero reflectivity is possible, in principle, even for large extinction coefficients (e.g. $\kappa_2=67.5$ for gold at $\lambda_0=10.0$ μm). (4) Zero reflectivity is possible even when the real part of the substrate index, $n_3$ is less than unity (e.g. for gold at $\lambda_0=0.5$ μm). (6) The required thicknesses, d, are not simply $\lambda_0/4$, but are sometimes larger and sometimes smaller than this value.

The method of this invention is applicable for any wavelength. Even though example results were presented for the violet to infrared range of wavelengths, the treatment is also valid at microwave wavelengths. Fabrication for these wavelengths might be considerably easier than in the optical range since the grating periods would be much larger. However, with high-resolution electron-beam lithography, feature sizes of as small as 30 nm have been produced, thus making fabrication of optical antireflection gratings also possible.

For antireflection behavior, it is not an inherent requirement that the surface-relief grating have a high spatial frequency (small period). The present analysis, however, treats the high spatial frequency grating case. This long wavelength situation is achieved when $\lambda_0/\Lambda>>1$ and represents the limit in which the homogeneous layer and the grating are completely equivalent (the same characteristics with wavelength, angle of incidence, thickness, etc.). Nevertheless, surface-relief gratings with relatively large periods can exhibit zero reflectivity as has previously been predicted. In these cases, propagating diffracted orders other than the zero order are also present. Minimizing the reflectivity in the zero order does not necessarily minimize the diffraction efficiencies of the other orders. The method of this invention can, in fact, be used to obtain estimates of the values needed for antireflection behavior by large period gratings. These values can then be used as the starting point in a series of rigorous calculations to determine parameters for antireflection behavior. This procedure is described in the paper: N. F. Hartman and T. K. Gaylord, "Antireflection Gold Surface-Relief Gratings: Experimental Characteristics," *Applied Optics*, 27 (1988) which has been accepted for publication. This procedure has been applied to a gold substrate with a TE polarized electromagnetic wave of wavelength 0.5 μm incident normally upon it. For a grating period of $\Lambda=1.00$ μm and a filling factor of 0.500, antireflection behavior was predicted to occur for a normalized grooved depth $d/\lambda_0=0.295$ (groove depth of 0.1475 μm). Furthermore, this particular antireflection grating design has been experimentally reduced to practice as described in above paper by N. F. Hartman and T. K. Gaylord. In addition, this design was found to apply simultaneously to TE, TM, and randomly polarized light and simultaneously to a broad range of angles of incidence.

The substrate thickness D should be ten times greater than the skin depth in order to appear to be semi-infinite to the incident wave. The skin depth $\delta$ is given by $\delta = \lambda_0/2\pi\kappa$. For gold at $\lambda_0 = 500$ nm, the skin depth is $\delta = 21.9$ nm and thus the substrate thickness D should be $D \geq 10\delta = 220$ nm.

Figure 14:
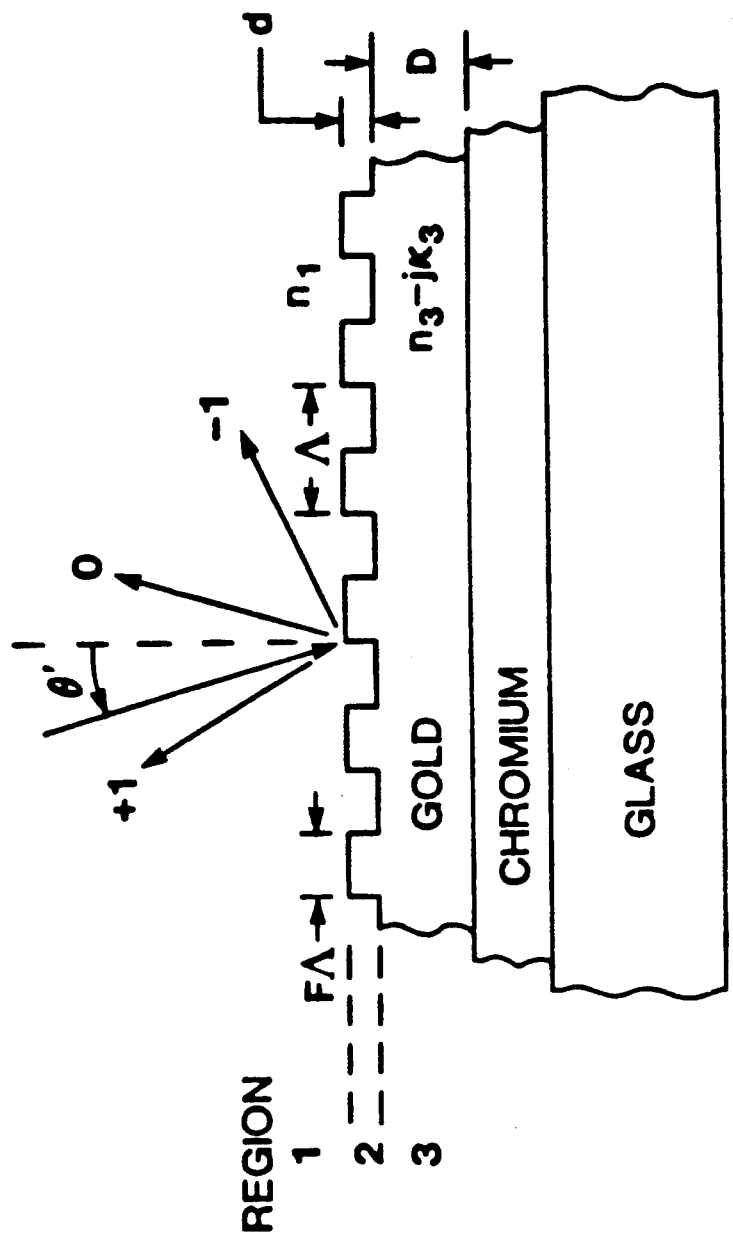
FIG. 14 illustrates the diffraction geometry of a gold rectangular-groove surface-relief grating.

The grating fabricated is shown schematically in FIG. 14. A 25 mm×25 mm section from a standard chromium coated photolithographic plate (with photoresist dissolved away) was used as a substrate. The layer of chromium promotes adhesion of the subsequent gold depositions. A gold layer of thickness d was evaporated onto the chromium. The thickness was monitored with a quartz crystal monitor and the deposition was halted when the thickness was 150±10 nm. The grating pattern was produced by standard photolithographic techniques. The grating pattern with a period of $\Lambda = 1.0$ μm was formed by the interference of two collimated coherent laser beams of $\lambda_0 = 363.8$ nm derived from an argon ion laser. The beams had $1/e^2$ intensity diameters of approximately 100 mm thus producing a highly uniform interference pattern over the entire 25 mm×25 mm plate. The angles of incidence were $\theta' = \pm 10.48°$. The resulting interference pattern was recorded in a 200 nm thick Shipley 1350J positive photoresist film spun onto the surface. After developing the exposed resist, it was treated with a very light plasma etch to remove residual resist material remaining in the developed areas. This plasma etching step improves the overall uniformity of the finished grating. The gold in the resulting resist/gold pattern was removed down to the chromium layer by selective etching using a standard gold etchant. Following this etching operation, the grating was subsequently washed with a resist solvent to remove the remaining resist. The patterned substrate was then coated with a second gold film of thickness $D \approx 250$ nm (greater than 10 skin depths). This produced the final grating configuration as shown in FIG. 14.

In room light, the finished grating appears to be a very uniform gold-orange color over its entire 25 mm×25 mm area. When examined with an optical microscope, the filling factor was estimated to be $F = 50 \pm 5\%$. The filling factor is critically dependent on the exposure, development, and thickness of the resist film. An average exposure of 7 mJ/cm$^2$ and a development time of 40 seconds were found to provide satisfactory results for 200 nm thick resist films.

Figure 15:
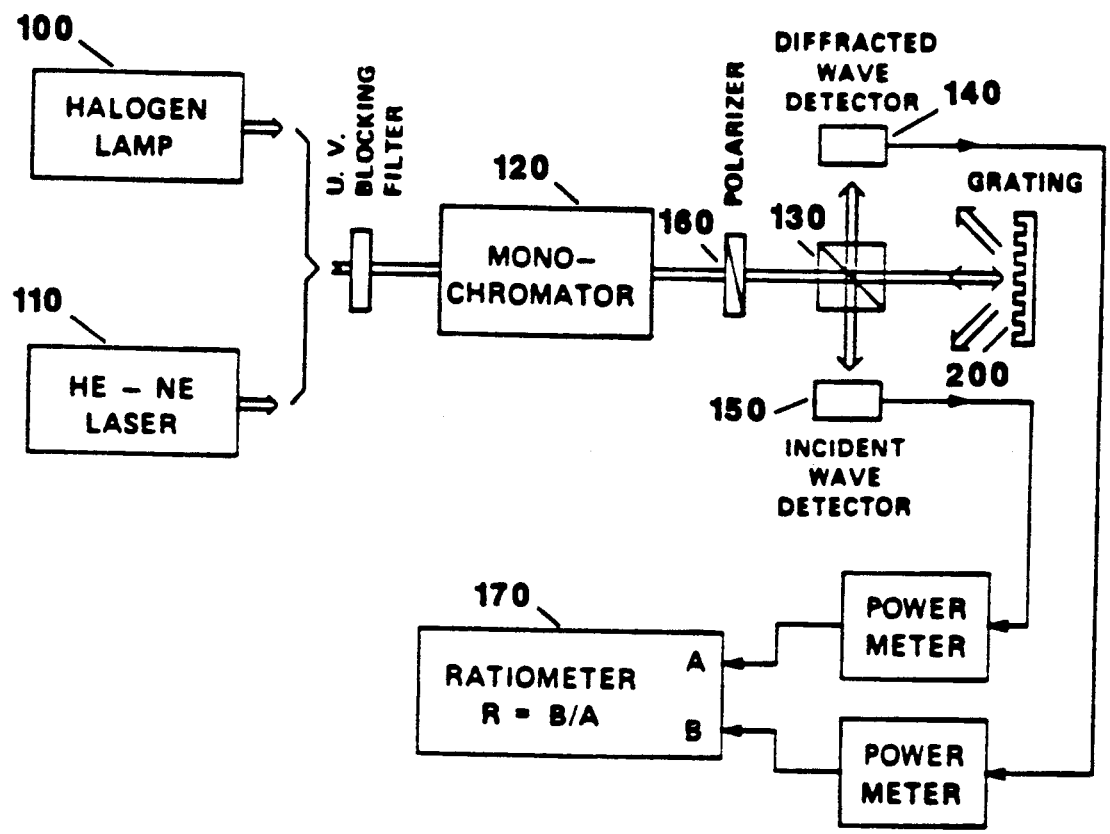
FIG. 15 illustrates the experimental configuration for measurement of reflectance at normal incidence as a function of wavelength and polarization.

To measure the grating reflectance experimentally as a function of wavelength and polarization, the configuration shown in FIG. 15 is used. A broadband halogen lamp 100 is used as a source. A He-Ne laser 110 is used to calibrate the monochromator 120 and to align the test object 200 (reflector or grating) so that the output beam from the monochromator impinges on the test object at normal incidence 200. A narrow band of wavelengths is selected by the grating monochromator. The reflected beam (zero-order diffracted wave in the case of a grating) propagates antiparallel to the incident beam. An antireflection-coated cube beamsplitter 130 is used to deflect the reflected beam into a detector 140. Simultaneously, the beamsplitter 130 also reflects a portion of the incident beam onto a second detector 150. The output light from the monochromator 120 is linearly polarized either horizontally or vertically by rotating the polarizer 160. Due to the diffraction characteristics of the grating in the monochromator, the monochromator output light power, $I_0(\lambda_0,P)$, is a function of the wavelength and polarization. In order to eliminate the wavelength and polarization dependence of the monochromator output intensity, a ratiometer 170 is used as indicated in FIG. 15. Furthermore, the wavelength and polarization dependence of reflectance and transmittance of the beamsplitter must be known in order to determine the reflectance of the test object.

The power measured by the incident wave detector is a function of wavelength and polarization and is $$A(\lambda_0,P) = r_{bs}(\lambda_0,P)I_0(\lambda_0,P), \tag{22}$$

where $r_{bs}(\lambda_0,P)$ is the reflectance of the beamsplitter. The power in the reflected wave as measured by the diffracted wave detector is $$B(\lambda_0,P) = [1 - r_{bs}(\lambda_0,P)] r_{obj}(\lambda_0,P) r_{bs}(\lambda_0,P) I_0(\lambda_0,P), \tag{23}$$

where $r_{obj}(\lambda_0,P)$ is the reflectance of the object being tested. The ratio of these powers is indicated by the ratiometer. Thus the ratiometer output is $$R(\lambda_0,P) = B(\lambda_0,P)/A(\lambda_0,P) = [1 - r_{bs}(\lambda_0,P)] r_{obj}(\lambda_0,P). \tag{24}$$

The beamsplitter reflectance can therefore be determined by $$r_{bs}(\lambda_0,P) = 1 - \frac{R(\lambda_0,P)}{r_{obj}(\lambda_0,P)}. \tag{25}$$

Inserting a known reflector [given $r_{obj}(\lambda_0,P)$] as the object in the position labeled "grating" in FIG. 15 thus allows the beamsplitter reflectance to be measured. In the present work, an overcoated aluminum reflector was used for the known reflector. The ratio of the beam powers $R = B/A$ was measured as a function of wavelength for both polarizations and then the beamsplitter reflectance calculated using Eq. (25). With a knowledge of the beamsplitter reflectance, the reflectance of an arbitrary object can be determined from $$r_{obj}(\lambda_0,P) = \frac{R(\lambda_0,P)}{1 - r_{bs}(\lambda_0,P)}. \tag{26}$$

To test the experimental configuration and procedure, a flat evaporated gold mirror surface was inserted as the object (in the position labeled "grating" in FIG. 15). The ratio of the beam intensities $R = B/A$ was then measured as a function of wavelength for both polarizations. Starting at $\lambda_0 = 400$ nm, the wavelength was increased in steps of 25 nm. Then the reflectance was calculated using Eq. (26). The resulting reflectances closely agree with those calculated from the refractive index data contained in Table I.

The fabricated gold grating was then inserted into the experimental configuration as shown in FIG. 15. In the actual experiment the grating vector was oriented perpendicular to the plane of FIG. 15. This caused the +1 and −1 order diffracted beams to be in a plane perpendicular to the plane of the beams and thus made it easier to isolate them from the detectors. For polarizations TE and TM, the ratio of the beam intensities $R = B/A$ was then measured as a function of wavelength and the reflectances calculated using Eq. (26).

Angular selectivity measurements were made at $\lambda_0 = 500$ nm. In this case the zero-order diffracted power was measured simply by moving the detector to the correct angular position. The diffracted power was then divided by the incident power to obtain the diffraction efficiency.

Figure 16:
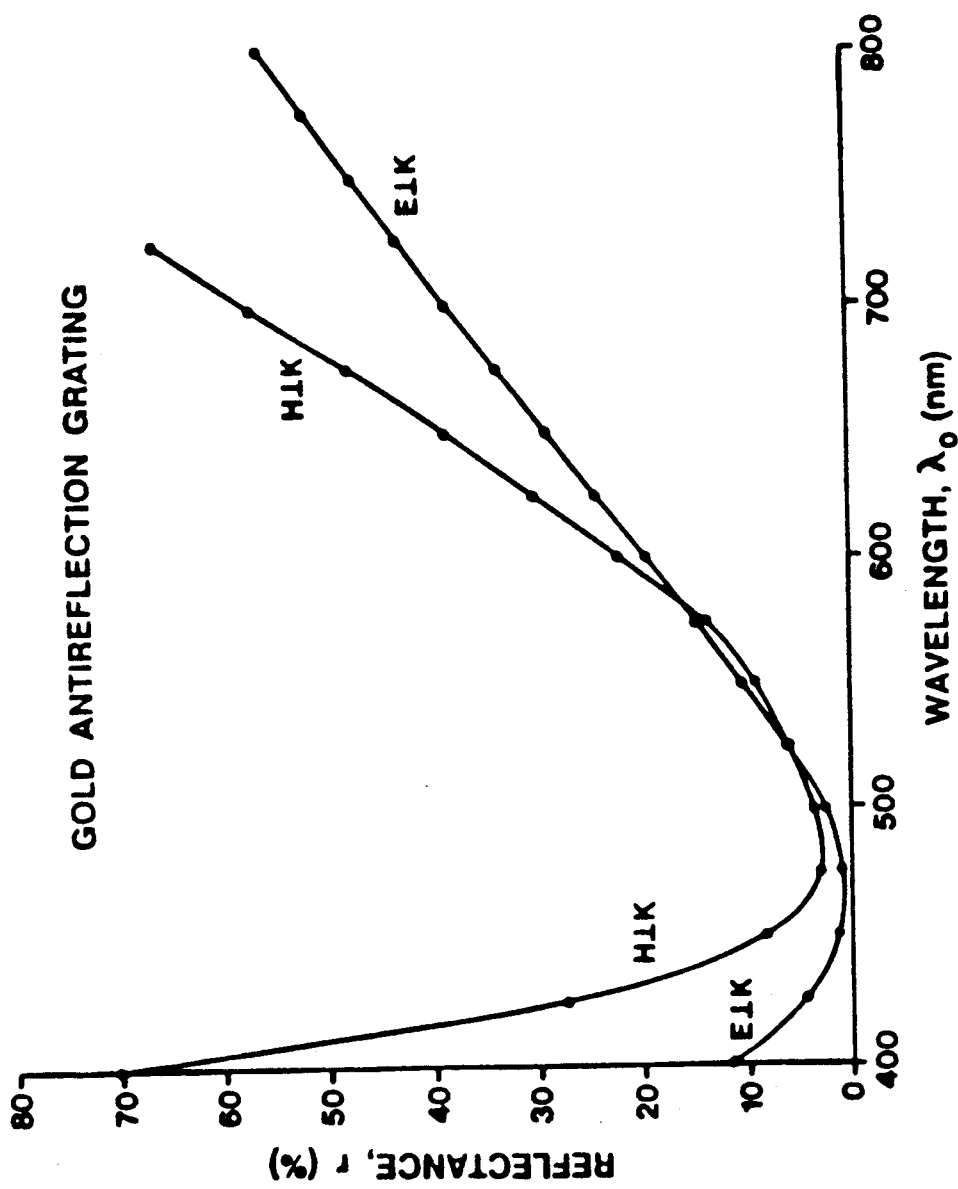
FIG. 16 illustrates measured zero-order (specular) reflection at normal incidence of a gold antireflection grating as a function of wavelength for both TE and TM polarization.

With the experimental configuration and measurement procedure verified as described in the previous section, the fabricated gold grating was inserted into the test configuration as shown in FIG. 15. At normal incidence, the ratio (R) of the intensities of the beams coming from the beamsplitter was measured as a function of wavelength for both TE and TM polarizations. The reflectances (zero-order diffraction efficiencies) were then calculated using Eq. (26). The resulting reflectances are shown as solid circles in FIG. 16. A dramatic antireflection effect is apparent. The data points have been connected with a continuous line for ease of interpretation. The grating was designed to be antireflecting at normal incidence for $\lambda_0 = 500$ nm for the optical electric field E perpendicular to the grating vector K (electric field parallel to grooves). The minimum measured value of reflectance for TE polarization was $r = 0.768\%$ which occurred at 475 nm. In the absence of the grating (a flat gold surface), the measured reflectance was 40.3% at 475 nm. Therefore the reflectance has been reduced by a factor of 52.5 due to the presence of the grating. Even though the grating was not specifically designed to be antireflecting for TM polarization (electric field perpendicular to the grooves), it nevertheless exhibits marked antireflection behavior for this polarization also. The minimum measured value of reflectance for TM polarization was $r = 2.70\%$ which also occurred at 475 nm. The bandwidth of the antireflection effect is seen to be relatively broad. The functional form of the reflectance curves in FIG. 16 are similar to those of a single layer antireflection coating.

With the experimental configuration described above, the angular selectivity of the specular reflectance (zero-order diffraction efficiency) of the gold grating was measured for TE polarization at the design wavelength of $\lambda_0 = 500$ nm. The measured reflectances as a function of angle of incidence $\theta'$ are shown as open circles in FIG. 17. The angle of incidence range for antireflection behavior is seen to be very broad. At $\lambda_0 = 500$ nm, the normal incidence ($\theta' = 0$) reflectance is 2.26%. As the angle of incidence is increased the measured reflectance increases only very slowly as shown. At $\theta' = 40°$, the gold grating reflectance reaches only 12.5%. For comparison, the exact calculation of the zero-order diffraction efficiency using the rigorous coupled-wave analysis is shown as a solid line in FIG. 17. These calculated data show a similarly broad angular selectivity. The slope discontinuity in the reflectance at $\theta' = 30°$ occurs due to the $i = -1$ diffracted order changing from propagating to cutoff and the $i = +2$ diffracted order changing from cutoff to propagating.

Figure 17:
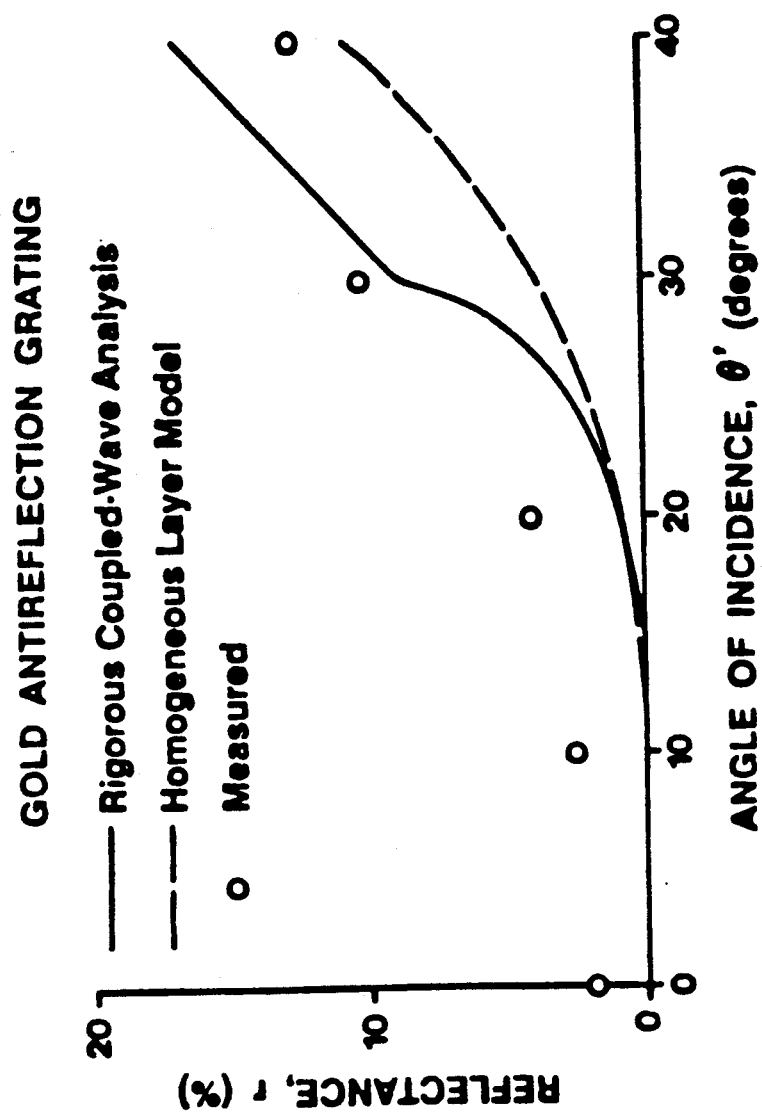
FIG. 17 compares the measured specular reflectance of a gold antireflection grating as a function of angle of incidence for a free-space wavelength $\lambda_0 = 0.5$ μm with predicted values based on the homogeneous layer model and rigorous coupled-wave analysis.

For further comparison, the reflectance of the homogeneous lossy layer that is equivalent to the small-period grating design is shown as a dashed line in FIG. 17. The complex refractive index of this antireflecting layer has a real part of $n_2 = 0.78590$, an imaginary part of $\kappa_2 = 0.21655$, and a thickness of $d = 0.47779\lambda_0$. It also predicts a similarly very broad angular selectivity as shown.

The grating indeed showed very nearly zero specular reflectivity in the blue region of the spectrum. The wavelength response (FIG. 16) and the angular selectivity (FIG. 17) are relatively broadband and are similar to those of a single-layer antireflection coating indicating that the grating is acting like a homogeneous lossy layer in this regard. In addition, the grating antireflects not only for the design polarization (TE) but also rather well for the orthogonal polarization (TM). This is in contrast to gratings that have high reflectance for one polarization and low reflectance for the other to enable their use as polarizers. Furthermore, comparison to angular response from rigorous coupled-wave analysis clearly shows that this behavior should be expected. Thus the design approach is valid. The grating acts as an impedance matching layer.

Figure 12:
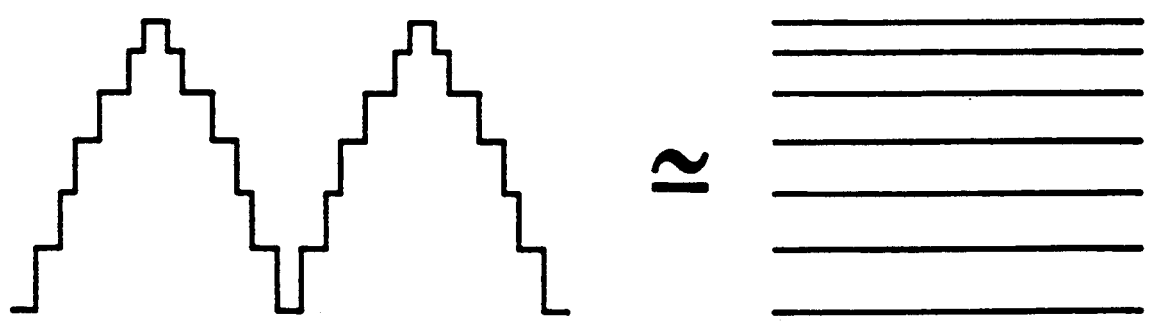
FIG. 12 is an illustration of possible equivalency between stairstep gratings and multilayer coatings.

The equivalence of gratings and homogeneous layers at long wavelengths indicates that a stair-step surface-relief profile consisting of N steps could be used to simulate a coating of N individual homogeneous layers as schematically illustrated in FIG. 12. The stair-step grating of N steps would be equivalent to N gratings, each with a different value of filling factor. Thus, for a given fundamental polarization, an N-layer design of a coating would correspond to an N-step stair-step grating on the surface of the lossy material. Thus, the extensive techniques for the design of multilayer thin film coatings could potentially be translated into equivalent stair-step gratings fabricated directly on the substrate materials.

In addition to antireflection surfaces, bandpass filters, band rejection filters, low pass filters, and high pass filters are all possible using grating surfaces. Furthermore, polarizers and polarization sensitive mirrors which exhibit low reflectivity for either TE or TM polarization and high reflectivity for the other polarization can be designed. For example, such devices could be used in high-power lasers to replace Brewster windows. In aerodynamic applications such as reducing the radar visibility of an aircraft or missile, it would be desirable to fill the grooves of a metallic surface-relief grating in order to protect the surface and/or to provide a smooth surface. The inclusion of a dielectric overlay into the analysis of this invention has been completed and is described in the paper: E. N. Glytsis and T. K. Gaylord, "Antireflection surface structure: Dielectric layer(s) over a high spatial-frequency surface-relief grating on a lossy substrate, "*Applied Optics*, 27 (1988), which has been accepted for publication. This not only produces a smooth surface but also allows the grating/overlayer combination to be designed so that the surface is simultaneously antireflecting for both TE and TM polarizations. Such a grating/overlayer surface is thus antireflecting for randomly polarized radiation. Furthermore, gratings with filling factors closer to 50% and small (compared to the incident wavelength) groove depths can be designed. Also, two-dimensional crossed gratings that exhibit low reflectivity for both orthogonal polarizations may be designed.

Figure 18:
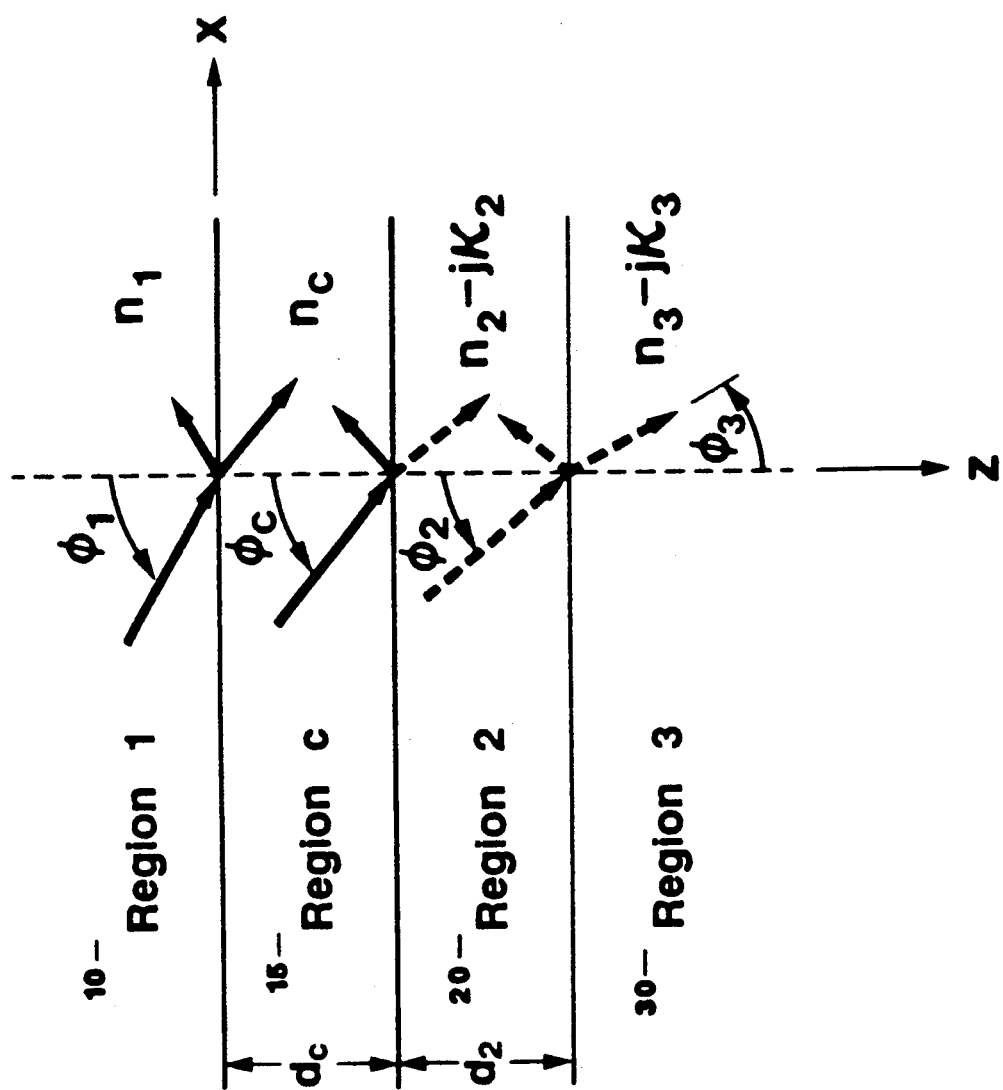
FIG. 18 illustrates the geometry of an electromagnetic wave in a lossless medium, incident on a lossless overlayer, on top of a lossy layer which is on top of a lossy substrate. The continuous lines correspond to propagating waves, while the dashed lines correspond to evanescent waves.

The geometry of a single homogeneous lossy layer 20 (region 2) of thickness $d_2$, overcoated by a dielectric layer 15 (region c) of thickness $d_c$, on a lossy substrate 30 (region 3) is depicted in FIG. 18. Region 1 is assumed to be lossless and is characterized by a refractive index $n_1$. Region c is the coating region and for a lossless dielectric is characterized by its refractive index $n_c$. Regions 2 and 3 are lossy and are characterized by their complex refractive indices $n_2 - j\kappa_2$ and $n_3 - j\kappa_3$, respectively, where the imaginary parts $\kappa_2$ and $\kappa_3$ are the extinction coefficients of those regions. An electromagnetic plane wave in region 1 (superstrate) is incident at an angle $\phi_1$ on the dielectric coating (region c). Upon refraction, homogeneous plane waves propagate in region c and inhomogeneous plane waves (plane waves with nonconstant amplitudes along their phase fronts) propagate in the lossy regions 2 and 3. The quantities $\phi_c$, $\phi_2$, and $\phi_3$ are the angles of refraction in regions c, 2, and 3 respectively. The angles $\phi_2$ and $\phi_3$ are complex due to the complex character of the corresponding refractive indices of regions 2 and 3. All angles of refraction are determined by the phase matching requirements (Snell's law) across the boundaries, that is, $$n_1 \sin \phi_1 = n_c \sin \phi_c = (n_2 - j\kappa_2) \sin \phi_2 = (n_3 - j\kappa_3) \sin \phi_3. \tag{27}$$

The incident wave may be of either TE or TM polarized. The lossless superstrate medium is typically air ($n_1 = 1.0$). The diffraction geometry of the surface-relief, rectangular-groove, lossy grating 50 which is equivalent to the homogeneous lossy layer in the high spatial-frequency limit, is shown in FIG. 19. Again the dielectric overlayer 15 is included. The grooves 40 of the grating are assumed to be filled by the dielectric material of the overlayer 15, and are periodically spaced in the x direction with period $\Lambda$. The grating vector K is given by $K = (2\pi/\Lambda)x$, where x is the unit vector in the x direction, and the boldface variable indicates a vector quantity. The depth of the grooves is $d_2$. In a similar manner to the homogeneous lossy layer geometry (FIG. 18), an electromagnetic plane wave in the superstrate (region 1) is incident at an angle $\phi_1$ on the dielectric overlayer (region c) and then at an angle $\phi_c$ on the lossy grating (region 2) on the lossy substrate (region 3) producing both forward-diffracted and backward-diffracted waves.

Applying the rigorous impedance matching approach to the four layers of FIG. 18 and defining an equivalent characteristic impedance $Z_{1c}$ such that $$Z_{1c} = \frac{Z_1 - jZ_c \tan(k_0 N_c' d_c)}{1 - j(Z_1/Z_c) \tan(k_0 N_c' d_c)}, \tag{28}$$

then the four-layer problem can be transformed into a three-layer problem by combining the effects of the input region 1 and region c (coating). This effective input region has a characteristic impedance $Z_{1c}$ (instead of $Z_1$) and a corresponding effective refractive index $N_{1c}$ and an effective extinction coefficient $K_{1c}$. Those quantities can be defined from the equation $Z_{1c} = Z_0/(N_{1c} - jK_{1c})$. The quantities $N_{1c}$ and $K_{1c}$ are $$N_{1c} = \{N_1 N_c^2 [1 + \tan^2 (k_0 N_c' d_c)]\}/\{N_c^2 + N_1^2 \tan^2 (k_0 N_c' d_c)\}, \tag{29}$$

$$K_{1c} = \{N_c (N_c^2 - N_1^2) \tan^2 (k_0 N_c' d_c)\}/\{N_c^2 + N_1^2 \tan^2 (k_0 N_c' d_c)\}. \tag{30}$$

Equations (29) and (30) are valid for both TE and TM polarization. By completing the impedance matching approach zero reflectivity is obtained. This equation is applicable for both TE and TM polarization, and it can be separated into a real-part equation and an imaginary-part equation. The real-part equation is $$(N_{1c}N_3 - K_{1c}K_3)\tanh(k_0 K_2' d) + \tag{31}$$

$$(N_{1c}K_3 + K_{1c}N_3)\tan(k_0 N_2' d) +$$

$$(N_{1c}N_2 - N_2 N_3 - K_{1c}K_2 + K_2 K_3) +$$

$$(N_{1c}K_2 - N_2 K_3 - K_2 K_3 + K_{1c}N_2)\tanh(k_0 K_2' d)\tan(k_0 N_2' d) -$$

$$(N_2^2 - K_2^2)\tanh(k_0 K_2' d) - 2N_2 K_2 \tan(k_0 N_2' d) = 0.$$

The imaginary-part equation is $$-(N_{1c}K_3 + K_{1c}N_3)\tanh(k_0 K_2' d) + \tag{32}$$

$$(N_{1c}N_3 - K_{1c}K_3)\tan(k_0 N_2' d) -$$

$$(N_{1c}K_2 - N_2 K_3 + K_{1c}N_2 - K_2 N_3) +$$

$$(N_{1c}N_2 - N_2 N_3 + K_{1c}K_2 + K_2 K_3)\tanh(k_0 K_2' d)\tan(k_0 N_2' d) -$$

$$(N_2^2 - K_2^2)\tan(k_0 N_2' d) + 2N_2 K_2 \tanh(k_0 K_2' d) = 0.$$

At this point some special cases can be discussed. If there is no coating then $n_c = n_1$ and $d_c$ can be arbitrary. In this case $N_{1c} = N_1$, $K_{1c} = 0$, and Eqs. (31) and (32) reduce to the corresponding equations of the no coating problem. The same condition is satisfied ($N_{1c} = N_1$ and $K_{1c} = 0$) when $d_c = 0$ or when $k_0 N_c' d_c = m\pi$ (m = 1, 2, ...). In the latter case the coating has no effect on the reflectivity of the structure.

The given quantities (parameters) in the problem are the incident index $n_1$ (region 1), the incident angle $\phi_1$, the coating index $n_c$ and the thickness $d_c$ (region c), the substrate index $n_3$, the substrate extinction coefficient $\kappa_3$, and the free-space wavevector magnitude $k_0$ (or equivalently the incident free-space wavelength $\lambda_0$). The extinction coefficient $\kappa_c$ is also a parameter in the case of a lossy coating. Using the phase-matching condition, Eq. (27), the angles $\phi_c$ and $\phi_3$ can be specified. Therefore the known quantities in Eqs. (31) and (32) are $N_{1c}$, $K_{1c}$, $N_3$, $K_3$, and $k_0$. The unknown quantities associated with region 2 (lossy layer or equivalent grating region) are $N_2$, $K_2$, and $d_2$ (since $N_2'$ and $K_2'$ can be expressed as functions of $N_2$ and $K_2$ as shown in the Appendix).

For TE polarization, Eq. (16) can again be separated into a real-part equation and an imaginary-part equation. These are $$N_2^2 - K_2^2 = (1-F)N_c^2 + F(N_3^2 - K_3^2), \tag{33}$$

$$N_2 K_2 = F N_3 K_3, \tag{34}$$

respectively. Equations (31), (32), (33), and (34) represent four independent equations with four unknowns ($N_2$, $K_2$, F, and $d_2$). These equations are solved numerically with the procedure described in the Appendix. The resulting values of the filling factor F and the groove depth $d_2$ completely specify the rectangular-groove surface-relief grating that will exhibit zero reflectivity for TE polarization. A special case of the overcoated grating is when $d_c = 0$. In this case the material (or refractive index $n_c$ different than air) fills the grating grooves.

for TM polarization, Eq. (19) can again be separated into a real-part equation and an imaginary-part equation which are $$N_2^2 - K_2^2 = \tag{35}$$

$$\frac{N_c^2[(1-F)(N_3^2 + K_3^2)^2 + FN_c^2(N_3^2 - K_3^2)]}{[(1-F)(N_3^2 - K_3^2) + FN_c^2]^2 + [2(1-F)N_3 K_3]^2},$$

$$N_2 K_2 = \frac{F N_c^4 N_3 K_3}{[(1-F)(N_3^2 - K_3^2) + FN_c^2]^2 + [2(1-F)N_3 K_3]^2}, \tag{36}$$

respectively. Equations (31), (32), (35), and (36) likewise represent four equations with four unknowns ($N_2$, $K_2$, F, and $d_2$) and are solved numerically as described in the Appendix. Similar to the TE polarization case, the resulting values of the filling factor F and the groove depth $d_2$ completely specify the surface-relief rectangular-groove grating that will exhibit zero reflectivity for TM polarization.

Figure 20:
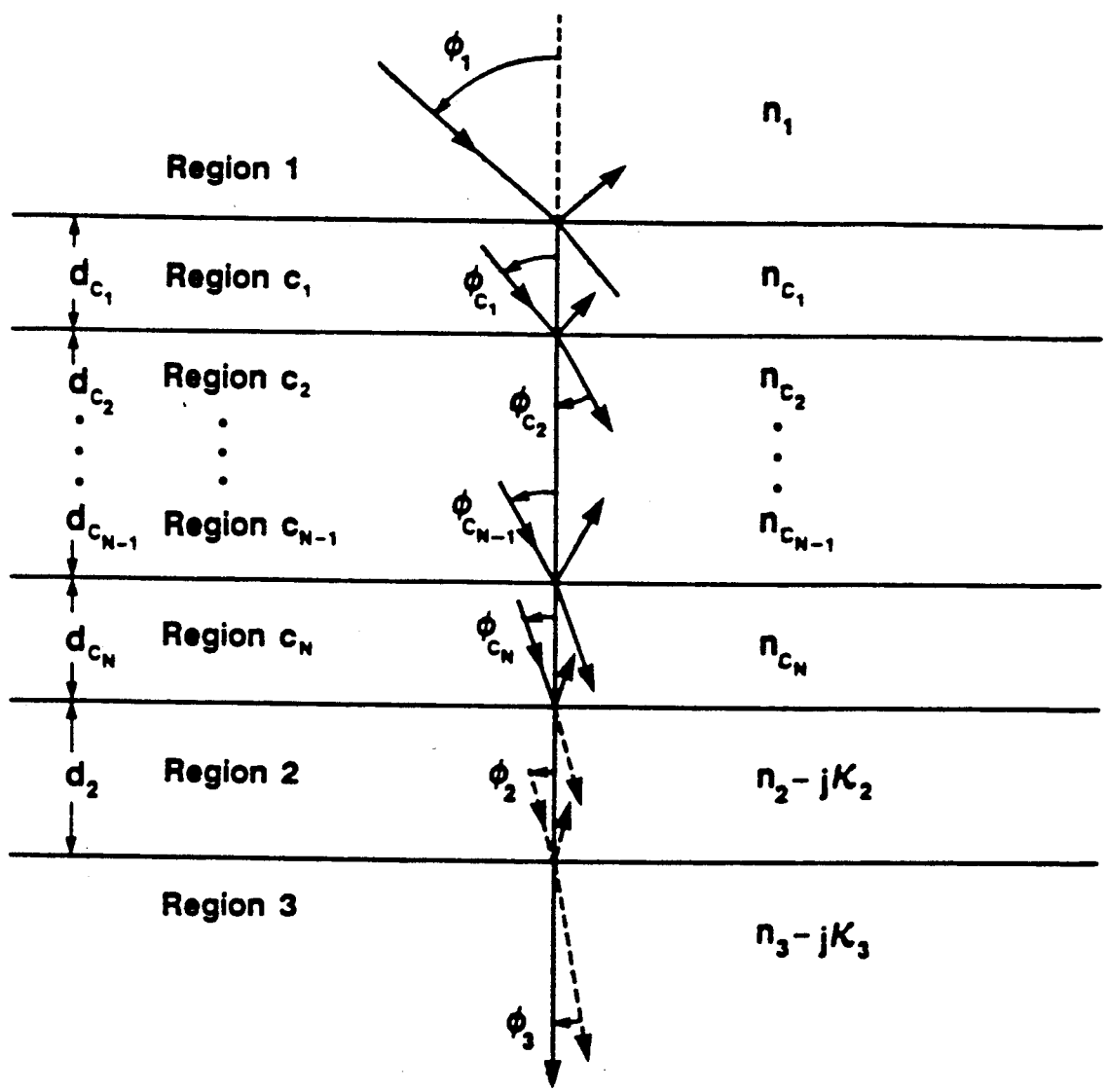
FIG. 20 illustrates the geometry of multiple overlayers, on top of a lossy layer, on top of a lossy substrate.
Figure 21:
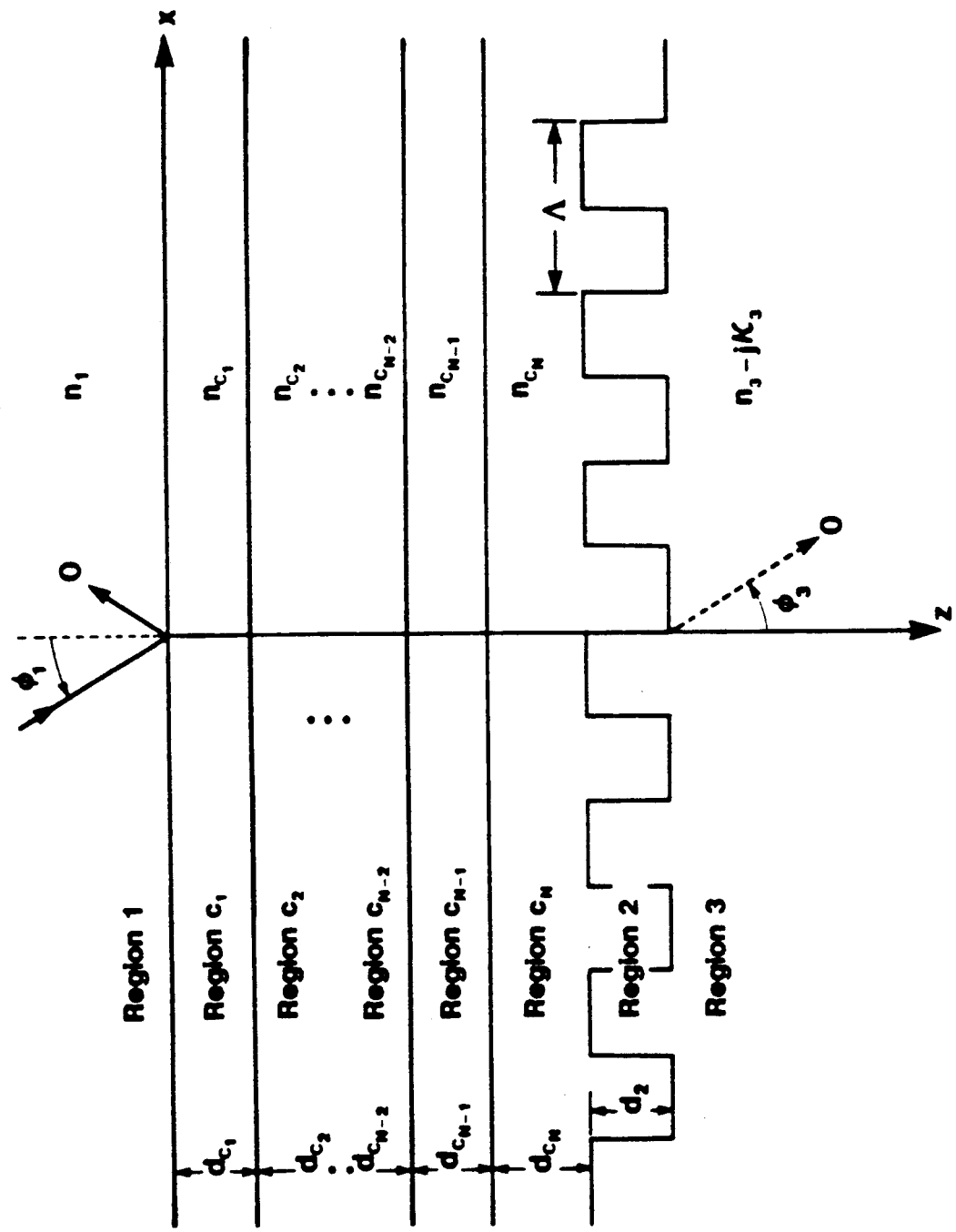
FIG. 21 illustrates the diffraction geometry of the multiple overcoated lossy rectangular-groove surface-relief high spatial-frequency grating.

The method that has been presented for a single overlayer can be easily generalized to include multiple dielectric overlayers. The refractive indices of the multiple dielectric coatings are denoted by $n_{cm}$ and their thicknesses $d_{cm}$, where $m = 1, 2, \ldots, N$ and N is the total number of dielectric overlayers. The geometry of the lossy homogeneous layer (region 2) on a lossy substrate (region 3), overcoated by multiple overlayers (regions $c_1, c_2, \ldots, c_N$) is shown in FIG. 20. The corresponding geometry for an overcoated surface-relief rectangular-groove grating is shown in FIG. 21.

The case of multiple dielectric overlayers over a dielectric substrate or the equivalent case of the multicoated dielectric surface-relief rectangular-groove grating on a dielectric substrate can be derived as a special case of the general lossy problem. Regions 2 and 3 of FIGS. 18 and 19 (or of FIGS. 20 and 21) are dielectric, therefore $\kappa_1 = \kappa_3 = 0$. As a consequence $K_3 = K_3' = K_2 = K_2' = 0$. In addition $N_2' = N_2$. Using the above relations, Eqs. (31) and (32) are simplified to $$K_{1c}N_3 \tan(k_0 N_2 d_2) + N_{1c}N_2 - N_2 N_3 = 0, \quad (37)$$

$$(N_{1c}N_3 - N_2^2) \sin(k_0 N_2 d_2) = 0 \quad (38)$$

The solution of the system of Eqs. (37) and (38) is $$N_2 = (N_{1c}N_3)^{\frac{1}{2}} \quad (39)$$

$$d_2 = (\lambda_0/2\pi N_2) \tan^{-1}[(N_{1c}/N_3)^{\frac{1}{2}}(N_3 - N_{1c})/K_{1c}] + m\lambda_0/2N_2, \quad (40)$$

where $m = 0, 1, 2, \ldots$. In the uncoated case Eqs. (39) and (40) reduce to $N_2 = (N_1 N_3)^{\frac{1}{2}}$ and $d_2 = (2m+1)\lambda_0/4(N_1 N_3)^{\frac{1}{2}}$. From the value of $N_2$ of Eq. (39) the value of $n_2$ is found to be $n_2 = (N_2^2 + n_1^2 \sin^2 \phi_1)^{\frac{1}{2}}$ for TE polarization and $n_2 = N_2\{[1 + (1 + 4n_1^2 \sin^2 \phi_1/N_2^2)^{\frac{1}{2}}]/2\}^{\frac{1}{2}}$ for TM polarization. Thus $n_2$ and $d_2$ specify the homogeneous layer of region 2. This layer is equivalent to the surface-relief grating in the long-wavelength limit. The filling factor for both polarizations can be computed as $$F = (N_{1c}N_3 - N_c^2)/(N_3^2 - N_c^2), \quad (41)$$

for TE polarization, and $$F = N_3(N_{1c}N_3 - N_c^2)/N_{1c}(N_3^2 - N_c^2), \quad (42)$$

for TM polarization. If no coating is included then $N_{1c} = N_c = N_1$ and $F = N_1/(N_1 + N_3)$ for TE polarization, and $F = N_3/(N_1 + N_3)$ for TM polarization.

The calculations were performed for example designs of antireflection gratings on gold substrates. The gratings (or coatings) are overcoated by one dielectric overlayer. The calculational procedure described previously and the normalized equations of the Appendix were solved for free-space wavelengths from $\lambda_0 = 0.44$ to $12.0$ $\mu$m (violet to infrared). The tabulated refractive indices of bulk gold were used in the computations. The refractive index of the dielectric overlayer is $n_c = 1.5$ (constant for the range of free-space wavelengths). As was mentioned previously multiple solutions are possible.

Figure 22:
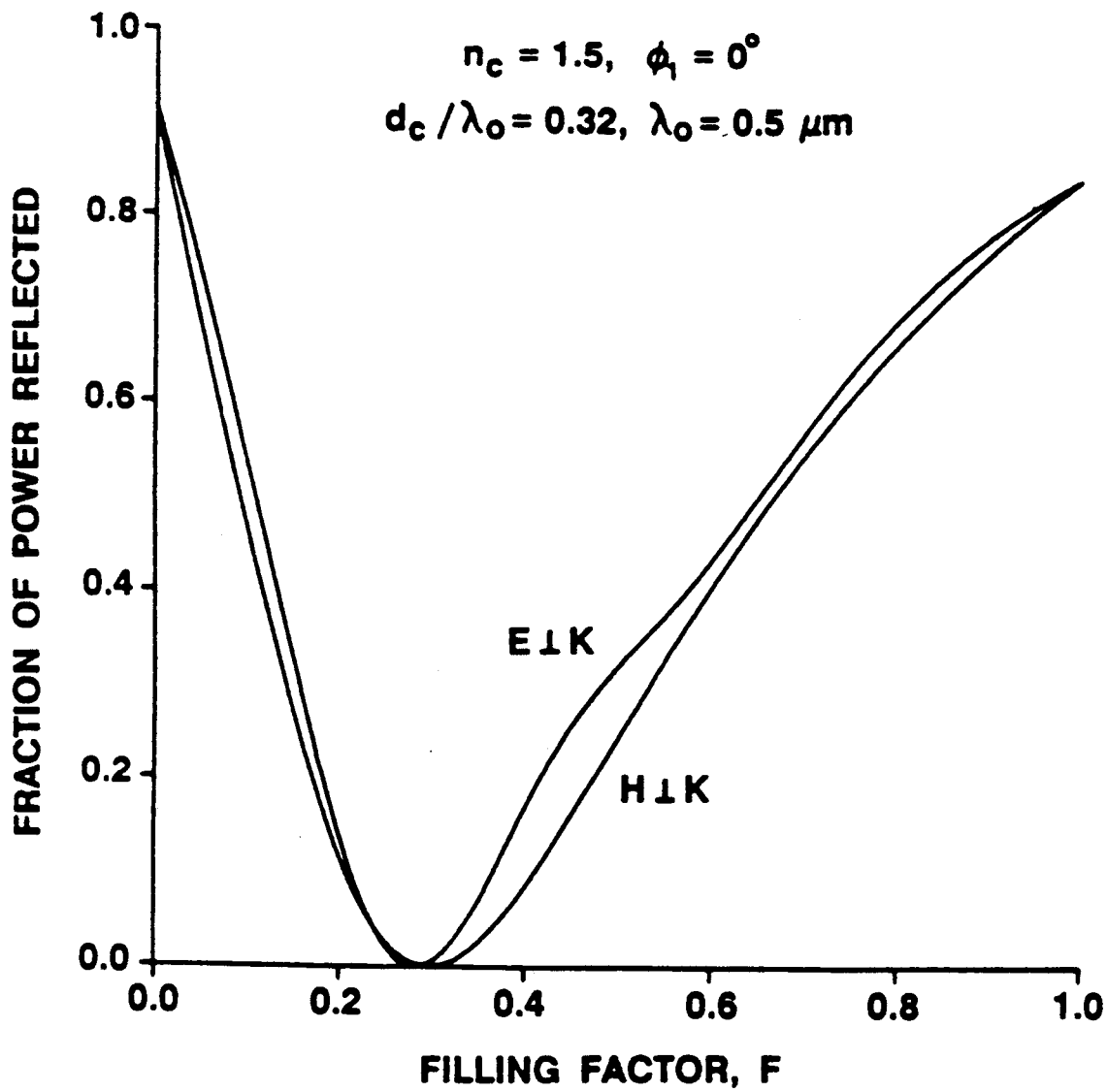
FIG. 22 illustrates the fraction of power reflected as a function of filling factor of an overcoated gold rectangular-groove surface-relief high spatial-frequency grating of groove depth $d_2/\lambda_0 = 0.32065$ for TE and TM polarizations at $\lambda_0 = 0.5$ μm for filling factor $F = 0.289897$.

The inclusion of one or more dielectric overlayers offers additional degrees of freedom for design flexibility. For TE polarization the addition of a dielectric overlayer increases the filling factor for antireflection. For TM polarization the filling factor decreases. The change in the filling factor results in an improved design for both polarizations, since TE polarization is generally characterized by small values of filling factor while TM polarization is characterized by large values of filling factors. The dielectric overlayer causes the antireflection groove depth to decrease for both polarizations. Again this effect is an improvement since smaller groove depth gratings are easier to fabricate. The overlayer brings the second solution for TE polarization ($m = 2$, since usually the $m = 1$ solution does not exist) close to the second solution for TM polarization. The thickness of the dielectric overlayer gives the additional flexibility to match the solutions of the two polarizations. For a normalized coating thickness $d_c/\lambda_0 \approx 0.035 + l(\frac{1}{2})$ ($l = 0, 1, 2, \ldots$), both polarizations have the same filling factor, $F \approx 0.290$, and the same groove depth, $d_2/\lambda_0 \approx 0.3207$. The $m = 2$ solutions are matched for TE and TM polarization. Thus the resulting antireflection grating is insensitive to the incident polarization! The fraction of the power reflected is shown in FIG. 22 as a function of the filling factor at the designed value $d_c/\lambda_0 = 0.3207$ for both polarizations. FIG. 22 shows that both polarizations have a zero (0.00027 for TE and 0.00045 for TM) at the same filling factor. Using the additional degrees of freedom of the overlayer, surface-relief rectangular-groove antireflection gratings can thus be designed for random polarization. Being able to vary the refractive index of the material also has a positive effect in the grating design. The filling factor increases for TE polarization and decreases for TM polarization as the layer refractive index increases. This can be particularly useful at longer wavelengths. If N overlayers are used, the free parameters increase to 2N ($n_{c1}, n_{c2}, \ldots, n_{cN}$, and $d_{c1}, d_{c2}, \ldots, d_{cN}$). Thus, the design can be improved further. In addition, if the incident wave is of very high intensity, the free parameters may be adjusted to reduce the peak electric field within the structure so as to avoid dielectric breakdown.

In the limit of no losses, the method of this invention reduces to the results reported by dielectric surface-relief gratings by T. K. Gaylord, W. E. Baird, and M. G. Moharam in "Zero-Reflectivity High Spatial-Frequency Rectangular-Groove Dielectric Surface-Relief Gratings," *Applied Optics* 25, 4562, (1986). Therefore, in the limit of long wavelengths, for light in a dielectric of refractive index $n_1$ normally incident upon a dielectric of refractive index $n_3$, antireflection behavior occurs when the grating groove depth is $\lambda_0/4(n_1 n_3)^{\frac{1}{2}}$ and the filling factor is $n_1/(n_1 + n_3)$ for the electric field perpendicular to the grating vector (TE polarization) or $n_2/(n_1 + n_3)$ for the electric field parallel to the grating vector (TM polarization). The invention is an extension of this previous work for application to lossy substrates and arbitrary angles of incidence. The antireflection behavior has been verified for the gratings using the rigorous (without approximations) coupled-wave analysis of metallic surface-relief grating diffraction. It has been shown that multiple zero-reflectivity solutions exist for both TE and TM polarizations, for any angle of incidence for an arbitrary complex-refractive-index substrate. Example zero-reflectivity gold gratings for incident free-space wavelengths in the range from 0.44 $\mu$m to 12.0 $\mu$m have been presented. For the longer wavelengths, the behavior of the gold approaches that of a perfect conductor and the required filling factor approaches zero for TE polarization and unity for TM polarization. The method is applicable to any incident wavelength.

APPENDIX: CALCULATIONAL PROCEDURE

To aid numerical calculation, the problem of determining the lossy layer and the equivalent surface-relief grating may be formulated by expressing the impedance matching conditions [Eqs. (14) and (15)] as $$\tan(k_0 N_2' d) = E + G \tan h(k_0 K_2' d), \quad (A1)$$

$$\tan h^2(k_0 K_2' d) + [(N_3 + K_3 G + DE - A - BG)/DG] \tan h(k_0 K_2' d) + 1 = 0, \quad (A2)$$

which applies for either polarization.

For TE polarization, the new quantities introduced in Eqs. (A1) and (A2) are $$N_2' = N_2 = [(N_1/2)^{\frac{1}{2}} B]/[(A^2 + B^2)^{\frac{1}{2}} - A]^{\frac{1}{2}}, \quad (A3)$$

$$K_2' = K_2 = \{(N_1/2)[(A^2 + B^2)^{\frac{1}{2}} - A]\}^{\frac{1}{2}}, \quad (A4)$$

$$A = [(1 - F)N_1^2 + F(N_3^2 - K_3^2)]/N_1, \quad (A5)$$

$$B = 2FN_3 K_3/N_1, \quad (A6)$$

$$C = N_2 - (N_2 N_3 - K_2 K_3)/N_1, \quad (A7)$$

$$D = K_2 - (N_2 K_3 + K_2 N_3)/N_1, \quad (A8)$$

$$E = -(C^2 + D^2)/(CK_3 - DN_3 - BC + AD), \quad (A9)$$

$$G = -(CN_3 + DK_3 - AC - BD)/(CK_3 - DN_3 - BC + AD). \quad (A10)$$

Figure 13:
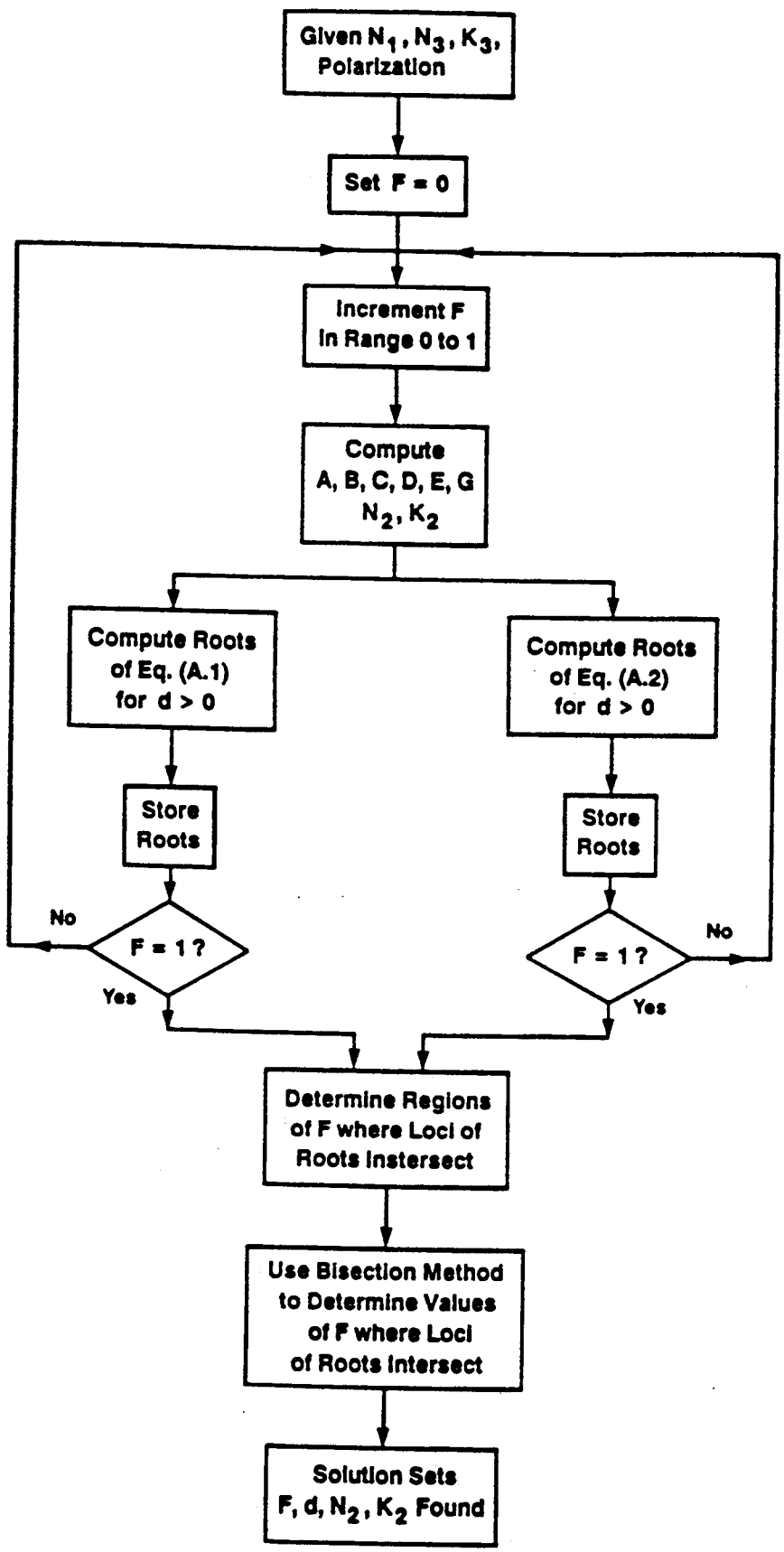
FIG. 13 illustrates a flowchart for finding the roots of the impedance matching equations to determine the complex refraction coefficients, filling factor and groove depth for zero reflectivity.

The unknown quantities, $N_2$, $K_2$, $F$, and $d$, may be determined using the iterative numerical procedure shown in the flowchart, FIG. 13. The rectangular surface-relief grating is completely specified by the filling factor, $F$, and the groove depth, $d$. The refractive index, $n_2$, and the extinction coefficient, $\kappa_2$, of the lossy layer may be obtained using $$n_2 = [(n_1/2)^{\frac{1}{2}} B_0]/[(A_0^2 + B_0^2)^{\frac{1}{2}} - A_0]^{\frac{1}{2}}, \quad (A11)$$

$$\kappa_2 = \{(n_1/2)[(A_0^2 + B_0^2)^{\frac{1}{2}} - A_0]\}^{\frac{1}{2}}, \quad (A12)$$

where $$A_0 = [(1 - F)n_1^2 + F(n_3^2 - \kappa_3^2)]/n_1, \quad (A13)$$

$$B_0 = 2F n_3 \kappa_3 / n_1. \quad (A14)$$

For TM polarization, the quantities introduced in Eqs. (A1) and (A2) are $$N_2' = (\tfrac{1}{2})[N_2(1 \pm r_0) \pm s_0 K_2], \quad (A15)$$

$$K_2' = (\tfrac{1}{2})[K_2(1 \pm r_0) \mp s_0 N_2], \quad (A16)$$

where $N_2$ and $K_2$ are given by Eqs. (A3) and (A4) as before but with A and B as given below and where $$r_0 = \Phi^{\frac{1}{2}} \cos(\phi/2), \quad (A17)$$

$$s_0 = -\Phi^{\frac{1}{2}} \sin(\phi/2), \quad (A18)$$

$$\Phi = \frac{[(N_2 - 2n_1 \sin\phi_1)^2 + K_2^2]^{\frac{1}{2}}[(N_2 + 2n_1 \sin\phi_1)^2 + K_2^2]^{\frac{1}{2}}}{N_2^2 + K_2^2} \quad (A19)$$

$$\phi = \tan^{-1}[K_2/(N_2 + 2n_1 \sin\phi_1)] + \tan^{-1}[K_2/(N_2 - 2n_1 \sin\phi_1)] - 2\tan^{-1}(K_2/N_2). \quad (A20)$$

Either the upper or the lower signs are chosen in both Eqs. (A15) and (A16) such that $K_2' \geq 0$ in order to have decreasing exponential fields as required for lossy materials. Only one set of these signs will simultaneously make $N_2' \geq 0$ and $K_2' \geq 0$ as required. The other quantities for TM polarization are $$A = \frac{N_1[(1 - F)(N_3^2 + K_3^2)^2 + FN_1^2(N_3^2 - K_3^2)]}{[(1 - F)(N_3^2 - K_3^2) + FN_1^2]^2 + [2(1 - F)N_3 K_3]^2}, \quad (A21)$$

$$B = \frac{2FN_1^3 N_3 K_3}{[(1 - F)(N_3^2 - K_3^2) + FN_1^2]^2 + [2(1 - F)N_3 K_3]^2}. \quad (A22)$$

and C, D, E, and G are given by Eqs. (A7), (A8), (A9), and (A10) respectively. The unknown quantities $N_2$, $K_2$, $F$, and $d$ may be obtained using the iterative numerical procedure shown in the flowchart, FIG. 13. The refractive index, $n_2$, and the extinction coefficient, $\kappa_2$, of the lossy layer for TM polarization may be obtained using Eqs. (A11) and (A12) respectively with $$A_0 = [2n_1 \sin^2 \phi_1 (1 \pm r_0)]/[(1 \pm r_0)^2 + s_0^2], \quad (A23)$$

$$B_0 = \pm (2n_1 \sin^2 \phi_1 s_0)/[(1 \pm r_0)^2 + s_0^2], \quad (A24)$$

where the signs are chosen as before (such that $N_2' \geq 0$ and $K_2' \geq 0$).

What is claimed is:

1. A method of manufacturing an antireflection high spatial-frequency rectangular groove surface-relief grating for a substrate which is exposed to a wave of transverse electric (TE) polarization incident at an angle $\phi_1$ and of free-space wavelength $\lambda_0$ in a lossless medium, wherein the grating is characterized by a grating period, groove depth, and filling factor, comprising the steps of:

determining the plurality of filling factors and corresponding groove depths for said rectangular-groove grating which will make said grating equivalent to a single homogeneous lossy layer of complex effective refractive index, $N_2 - jK_2$, by solving numerically the simultaneous set of equations:

$N_1 N_3 \tanh(k_o K_2 d) + N_1 K_3 \tan(k_o N_2 d) + N_1 N_2 - N_2 N_3 + K_2 K_3) +$ $(N_1 K_2 - N_2 K_3 - K_2 N_3)\tanh(k_o K_2 d)\tan(k_o N_2 d) -$ $(N_2^2 - K_2^2)\tanh(k_o K_2 d) - 2N_2 K_2 \tan(k_o N_2 d) = 0,$ $-N_1 K_3 \tanh(k_o K_2 d) + N_1 N_3 \tan(k_o N_2 d) -$ $(N_1 K_2 - N_2 K_3 - K_2 N_3) +$ $(N_1 N_2 - N_2 N_3 + K_2 K_3)\tanh(k_o K_2 d)\tan(k_o N_2 d) -$ $(N_2^2 - K_2^2)\tan(k_o N_2 d) + 2N_2 K_2 \tanh(k_o K_2 d) = 0,$ $N_2^2 - K_2^2 = (1 - F)N_1^2 + F(N_3^2 - K_3^2),$ $N_2 K_2 = FN_3 K_3,$ where $N_1$ is the effective refractive index in the lossless medium, $N_2$ is the effective refractive index in the equivalent homogeneous layer, $N_3$ is the effective refractive index in the substrate, $K_2$ is the effective extinction coefficient in the equivalent homogeneous layer, $K_3$ is the effective extinction coefficient in the substrate, K is the filling factor of the grating, d is the groove depth of the grating, $k_0$ is the wave number of the incident wave;

selecting a filling factor and corresponding groove depth from said plurality of filling factors and corresponding groove depths determined by solving numerically said simultaneous set of equations; and forming said rectangular groove surface-relief grating charactermized by said selected filling factor and corresponding groove depth on said substrate.

2. The method of claim 1 wherein the step of forming said rectangular groove surface-relief grating on said substrate is accomplished by reactive ion etching.

3. The method of claim 1 wherein the step of forming said rectangular groove surface-relief grating on said substrate is accomplished by electron beam lithography.

4. The method of claim 1 wherein the step of forming said rectangular groove surface-relief grating on said substrate is accomplished by holography.

5. A method of manufacturing an antireflection high spatial-frequency rectangular-groove surface-relief grating for a substrate which is exposed to a wave of transverse magnetic (TM) polarization incident at an angle $\phi_1$ and of free-space wavelength $\lambda_0$ in a lossless medium, wherein the grating is characterized by a grating period, groove depth and filling factor, comprising the steps of:

determining the plurality of filling factors and corresponding groove depths for said rectangular-groove grating which will make said grating equivalent to a single homogeneous lossy layer of complex effective refractive index, $N_2 - jK_2$, by solving numerically the simultaneous set of equations:

$N_1 N_3 \tanh(k_o K_2'd) + N_1 N_3 \tan(k_o N_2'd) + N_1 N_2 - N_2 N_3 +$ $K_2 K_3) + (N_1 K_2 - N_2 K_3 - K_2 N_3)\tanh(k_o K_2'd)\tan(k_o N_2'd) -$ $(N_2^2 - K_2^2)\tanh(k_o K_2'd) - 2N_2 K_2 \tan(k_o N_2'd) = 0,$ $-N_1 K_3 \tanh(K_o K_2'd) + N_1 N_3 \tan(k_o N_2'd) -$ $(N_1 K_2 - N_2 K_3 - K_2 N_3) +$ $(N_1 N_2 - N_2 N_3 + K_2 K_3)\tanh(k_o K_2'd)\tan(k_o N_2'd) -$ $(N_2^2 - K_2^2)\tan(k_o N_2'd) + 2N_2 K_2 \tanh(k_o K_2'd) = 0,$ $$N_2^2 - K_2^2 = \frac{N_1^2[(1-F)(N_3^2+K_3^2)^2 + FN_1^2(N_3^2-K_3^2)]}{[(1-F)(N_3^2-K_3^2)+FN_1^2]^2 + [2(1-F)N_3 K_3]^2}$$

$$N_2 K = \frac{FN_1^4 N_3 K_3}{[(1-F)(N_3^2-K_3^2)+FN_1^2]^2 + [2(1-F)N_3 K_3]^2}$$

where $N_1$ is the effective refractive index in the lossless medium, $N_2$ is the effective refractive index in the equivalent homogeneous layer, $N_2'$ is defined as the real part of the product of $N_2 - jK_2$ and the cosine squared of the complex angle of refraction in the equivalent homogeneous layer, $N_3$ is the effective refractive index in the substrate, $K_2$ is the effective extinction coefficient in the equivalent homogeneous layer, $K_2'$ is defined as the negative imaginary part of the product of $N_2 - jK_2$ and the cosine squared of the complex angle of refraction in the equivalent homogeneous layer, $K_3$ is the effective extinction coefficient in the substrate, F is the filling factor of the grating, d is the groove depth of the grating, $k_0$ is the wave number of the incident wave;

selecting a filling factor and corresponding groove depth from said plurality of filling factors and corresponding groove depths determined by solving numerically said simultaneous set of equations; and forming said rectangular groove surface-relief grating characterized by said selected filling factor and corresponding groove depth on said substrate.

6. The method of claim 5 wherein the step of forming said rectangular groove surface-relief grating on said substrate is accomplished by reactive ion etching.

7. The method of claim 5 wherein the step of forming said rectangular groove surface-relief grating on said substrate is accomplished by electron beam lithography.

8. The method of claim 5 wherein the step of forming said rectangular groove surface-relief grating on said substrate is accomplished by holography.

9. A method of manufacturing an antireflection rectangular groove surface-relief grating comprising the steps of:

selecting a substrate material on which to form the surface-relief grating;

determining the polarization and range of wavelengths and angles of incidence of the electromagnetic waves incident on said substrate;

selecting a lossless medium in which said electromagnetic waves propagate;

determining the plurality of filling factors and corresponding groove depths for said rectangular-groove grating which will make said grating equivalent to a single homogeneous lossy layer;

selecting a filling factor and corresponding groove depth from said plurality of filling factors and corresponding groove depths; and forming said rectangular groove diffraction grating characterized by said selected filling factor and corresponding groove depth on said substrate.

10. The method of claim 9 wherein the selected substrate material is a metal.

11. The method of claim 10 further comprising the step of forming a dielectric overlay on said rectangular groove surface-relief grating by filling the grooves of said metallic grating with a dielectric material so as to provide a smooth surface.

12. The method of claim 9 wherein the selected substrate material is a semiconductor.

13. The method of claim 9 wherein the selected substrate material is a dielectric.

14. The method of claim 9 wherein the polarization of the electromagnetic waves incident on said substrate is transverse electric.

15. The method of claim 9 wherein the polarization of the electromagnetic waves incident on said substrate is transverse magnetic.

16. The method of claim 9 wherein the substrate material is gold.

17. The method of claim 16 wherein the range of wavelengths of the electromagnetic waves incident on said substrate is from 0.44 microns to 12.0 microns.

18. The method of claim 16 wherein said angle of incidence is normal to said substrate, the wavelength $\lambda_0$ of said electromagnetic wave is 0.5 microns, the polarization of said electromagnetic waves is transverse electric and the filling factor F and normalized groove depth $d/\lambda_0$ are as follows:

$F = 0.11689$ $d/\lambda_0 = 0.4779$.

19. The method of claim 16 wherein said angle of incidence is normal to said substrate, the wavelength $\lambda_0$ of said electromagnetic waves is 0.5 microns, the polarization of said electromagnetic waves is transverse magnetic and the filling factor F and normalized groove depth $d/\lambda_0$ are as follows:

$F = 0.63841$ $d/\lambda_0 = 0.083629$.

20. The method of claim 9 wherein the lossless medium is air.

21. A method of manufacturing an antireflection overcoated rectangular groove surface-relief grating for a substrate which is exposed to incident waves of random polarization and free-space wavelength $\lambda_0$ in a lossless medium, wherein the grating is characterized by a grating period, groove depth and filling factor, and the coating layer has a thickness $d_c$ and an index of refraction $n_c$, comprising the steps of:
  determining the first plurality of filling factors and corresponding groove depths for said overcoated rectangular-groove grating which will make said grating equivalent to a single homogeneous lossy layer of complex effective refractive index, $N_2 - jK_2$, for incident waves of transverse electric polarization;
  determining the second plurality of filling factors and corresponding groove depths for said overcoated rectangular-groove grating which will make said grating equivalent to a single homogeneous lossy layer of complex effective refractive index, $N_2 - jK_2$, for incident waves of transverse magnetic polarization;
  selecting a filling factor and corresponding groove depth from said plurality of filling factors and corresponding groove depths for transverse electric polarization which matches with a filling factor and its corresponding groove depth from said second plurality of filling factors and corresponding groove depths for transverse magnetic polarization;
  forming said rectangular-groove surface-relief grating characterized by said selected filling factor and corresponding groove depth on said substrate; and
  forming said coating layer of thickness $d_c$ over the surface of said rectangular-groove surface-relief grating.

22. The method of claim 21 wherein the step of determining the first plurality of filling factors and corresponding groove depths for said overcoated rectangular-groove grating for incident waves of transverse electric polarization further comprises solving numerically the simultaneous set of equations:

$(N_{1c}N_3 - K_{1c}K_3)\tanh(k_oK_2d_2) + (N_{1c}K_3 + K_{1c}N_3)\tan(k_oN_2d_2) +$ $(N_{1c}N_2 - N_2N_3 - K_{1c}K_2 + K_2K_3) +$ $(N_{1c}K_2 - K_2N_3 + K_{1c}N_2 - N_2K_3)\tanh(k_oK_2d_2)\tan(k_oN_2d_2) -$ $(N_2{}^2 - K_2{}^2)\tanh(k_oK_2d_2) - 2N_2K_2\tan(k_oN_2d_2) = 0,$ $-(N_{1c}K_3 + K_{1c}N_3)\tanh(k_oK_2d_2) + (N_{1c}N_3 -$ $K_{1c}K_3)\tan(k_oN_2d_2) - (N_{1c}K_2 - K_2N_3 + K_{1c}N_2 - N_2K_3) +$ $(N_{1c}N_2 - N_2N_3 + K_{1c}K_2 + K_2K_3)\tanh(k_oK_2d_2)\tan(k_oN_2d_2) -$ $(N_2{}^2 - K_2{}^2)\tan(k_oN_2d_2) + 2N_2K_2\tanh(k_oK_2d_2) = 0,$ $N_2{}^2 - K_2{}^2 = (1 - F)N_c{}^2 + F(N_3{}^2 - K_3{}^2),$ $N_2K_2 = FN_3K_3,$ where
  $N_{1c}$ is the effective refractive index in the combined lossless medium and coating layer,
  $N_2$ is the effective refractive index in the equivalent homogeneous layer,
  $N_3$ is the effective refractive index in the substrate,
  $N_c$ is the effective refractive index in the coating layer,
  $K_{1c}$ is the effective extinction coefficient in the combined lossless medium and coating layer,
  $K_2$ is the effective extinction coefficient in the equivalent homogeneous layer,
  $K_3$ is the effective extinction coefficient in the substrate,
  F is the filling factor of the grating,
  d is the groove depth of the grating,
  $k_0$ is the wave number of the incident wave.

23. The method of claim 21 wherein the step of determining the second plurality of filling factors and corresponding groove depths for said overcoated rectangular-groove grating for incident waves of transverse magnetic polarization further comprises solving numerically the simultaneous set of equations:

$(N_{1c}N_3 - K_{1c}K_3)\tanh(k_oK_2'd_2) + (N_{1c}K_3 + K_{1c}N_3)\tan(k_oN_2'd_2) +$ $(N_{1c}N_2 - N_2N_3 - K_{1c}K_2 + K_2K_3) +$ $(N_{1c}K_2 - K_2N_3 + K_{1c}N_2 - N_2K_3)\tanh(k_oK_2'd_2)\tan(k_oN_2'd_2) -$ $(N_2{}^2 - K_2{}^2)\tanh(k_oK_2'd_2) - 2N_2K_2\tan(k_oN_2'd_2) = 0,$ $-(N_{1c}K_3 + K_{1c}N_3)\tanh(k_oK_2'd_2) + (N_{1c}N_3 -$ $K_{1c}K_3)\tan(k_oN_2'd_2) - (N_{1c}K_2 - K_2N_3 + K_{1c}N_2 - N_2K_3) +$ $(N_{1c}N_2 - N_2N_3 + K_{1c}K_2 + K_2K_3)\tanh(k_oK_2'd_2)\tan(k_oN_2'd_2) -$ $(N_2{}^2 - K_2{}^2)\tan(k_oN_2'd_2) + 2N_2K_2\tanh(k_oK_2'd_2) = 0,$ $N_2{}^2 - K_2{}^2 =$ $$\frac{N_c{}^2[(1 - F)(N_3{}^2 + K_3{}^2)^2 + FN_c{}^2(N_3{}^2 - K_3{}^2)]}{[(1 - F)(N_3{}^2 - K_3{}^2) + FN_c{}^2]^2 + [2(1 - F)N_3K_3]^2},$$

$$N_2K_2 = \frac{2FN_c{}^4N_3K_3}{[(1 - F)(N_3{}^2 - K_3{}^2) + FN_c{}^2]^2 + [2(1 - F)N_3K_3]^2},$$

where
  $N_{1c}$ is the effective refractive index in the combined lossless medium and coating layer, $N_2$ is the effective refractive index in the equivalent homogeneous layer, $N_2'$ is defined as the product of $N_2$ and the cosine squared of the complex angle of refraction in the equivalent homogeneous layer, $N_3$ is the effective refractive index in the substrate, $K_{1c}$ is the effective extinction coefficient in the combined lossless medium and coating layer, $K_2$ is the effective extinction coefficient in the equivalent homogeneous layer, $K_2'$ is defined as the product of $K_2$ and the cosine squared of the complex angle of refraction in the equivalent homogeneous layer, $K_3$ is the effective extinction coefficient in the substrate, F is the filling factor of the grating, d is the groove depth of the grating, $k_0$ is the wave number of the incident wave.

24. The method of claim 21 wherein said incident waves of random polarization are normal to said substrate and have a free-space wavelength $\lambda_0$ of 0.5 microns, the coating layer is a dielectric having index of refraction $n_c=1.5$, and the filling factor F, normalized groove depth $d/\lambda_0$ and normalized coating thickness $d_c/\lambda_0$ are as follows:

$F = 0.290$ $d/\lambda_0 = 0.3207$ $d_c/\lambda_0 = 0.3207$.

25. A method of manufacturing an antireflection large-period rectangular-groove surface-relief grating of a substrate which is exposed to incident waves of transverse electric (TE), transverse magnetic (TM), and random polarization, and of free-space wavelength $\lambda_0$ in a lossless medium, wherein the grating is characterized by a grating period, groove depth, and filling factor, comprising the steps of:

determining the plurality of filling factors and corresponding groove depths for said rectangular groove grating which will make said grating equivalent to a single homogeneous lossy layer of complex effective refraction index, $N_2-jK_2$, for incidence waves of transverse electric polarization in the long wavelength limit;

selecting a filling factor within a range of 0.4 and 0.6 from said plurality of filling factors to make the grating easier to fabricate;

selecting a grating period equal to twice the free-space wavelength $\lambda_0$;

determining the groove depth corresponding to said selected filling factor and said grating period which will make said surface-relief grating antireflecting at said free-space wavelength $\lambda_0$ for incident waves of normal incidence and transverse electric polarization; and forming said rectangular groove surface-relief grating characterized by said selected grating period, filling factor and corresponding groove depth on said substrate.

26. The method of claim 15 wherein said substrate is gold, the wavelength of said incident waves is 0.5 microns, the polarization of said incident waves is transverse electric (TE), said incident waves having an angle of incidence normal to said substrate, the grating period is 1.0 microns, the filling factor is 0.5 and the normalized groove depth is 0.295.

27. The method of claim 15 wherein the step of determining the groove depth corresponding to said selected filling factor and said grating period which will make said surface-relief grating antireflecting comprises applying the rigorous coupled-wave analysis of dielectric surface-relief gratings for gratings formed from dielectric material.

28. The method of claim 15 wherein the step of determining the groove depth corresponding to said selected filling factor and said grating period which will make said surface-relief grating antireflecting comprises applying the rigorous coupled-wave analysis of metallic surface-relief gratings for gratings formed from metallic material.

* * * * *

UNITED STATES PATENT AND TRADEMARK OFFICE
CERTIFICATE OF CORRECTION

PATENT NO. : 5,007,708
DATED : April 16, 1991
INVENTOR(S) : Thomas K. Gaylord, et al It is certified that error appears in the above-indentified patent and that said Letters Patent is hereby corrected as shown below:

On the title page, item [54] and column line 4, change "DIELECTRICS, SEMICONDUCTORS AND METALS" to --DIELECTRICS, SEMICONDUCTORS, AND METALS--.

Col. 1, line 58, change "Akiba" to --Akisa--.

Col. 2, line 44, change "homgeneous" to --homogeneous--.

Col. 4, line 13, change "my" to --by--.

Col. 4, line 29, change "length=10µm" to --"length $\lambda_0$=10µm--.

Col. 5, line 49, change "$n_2-j\kappa_2 n_3-j\kappa_3$" to --$n_2-j\kappa_2$ and $n_3-j\kappa_3$--.

Col. 6, line 2, change "$(2\pi/\Lambda)x$, where x" to --$(2\pi/\Lambda)\hat{x}$, where $\hat{x}$--.

Col. 6, line 54, change "is given by $\lambda$=" to --is given by $\gamma$= --.

Col. 7, line 45, change "region of $D_y=\varepsilon_0(n_{TE})$ -" to --region of $\bar{D}_y=\varepsilon_0(n_{TE})^2$--.

UNITED STATES PATENT AND TRADEMARK OFFICE
CERTIFICATE OF CORRECTION

PATENT NO. : 5,007,708
DATED : April 16, 1991
INVENTOR(S) : Thomas K. Gaylord, et al It is certified that error appears in the above-indentified patent and that said Letters Patent is hereby corrected as shown below:

Col., 7, line 46, change "$^2E_y$" to --$E_y$--.

Col. 7, line 60, change "$E_x=[1/\varepsilon_0$" to --$\bar{E}_x=[1/\varepsilon_0$--.

Col. 8, line 42, change "effective) quantities" to --effective quantities--.

Col. 8, eq. (11), change "$-Im\{n_3 -$" to -- $-Im\{(n_3 -$ --.

Col. 8, eq. (12), change "$(N_3 =$" to -- $N_3 =$ --.

Col. 8, eq. (12), change "$-Im\{n_3 -$" to -- $-Im\{(n_3 -$ --.

Col. 9, eq. (15), change "$N_2N_3 - K_2K_3$" to --$N_2N_3 + K_2K_3$--.

Col. 10, Table 1, change "$k_2$" to --$\kappa_2$--.

Col. 11, Table 1, change "$k_2$" to --$\kappa_2$--.

Col. 13, line 13, change "$[(N_1+N_2)^2-K_2^2]$" to --$[(N_1+N_2)^2+K_2^2]$--.

Col. 13, line 25, change "bcome" to --become--.

UNITED STATES PATENT AND TRADEMARK OFFICE
CERTIFICATE OF CORRECTION

PATENT NO. : 5,007,708

DATED : April 16, 1991

INVENTOR(S) : Thomas K. Gaylord, et al

It is certified that error appears in the above-indentified patent and that said Letters Patent is hereby corrected as shown below:

Col. 13, line 27, change "beahve" to --behave--.

Col. 14, line 2, change "$0=\kappa_2<1$" to --$0<\kappa_2<1$--.

Col. 14, lines 52-53, change "*Applied Optics*, 27 (1988) which has been accepted for publication" to --*Applied Optics*, 27, 3738 (1988)--.

Col. 18, lines 39-40, change "*Applied Optics*, 27 (1988) which has been accepted for publication" to --*Applied Optics*, 27, 4288 (1988)--.

Col. 19, eq. (27), place "$\phi_3$" immediately after "sin" so that it reads $\sin\phi_3$.

Col. 19, line 20, change "$(2\pi/\Lambda)x$, where x" to --$(2\pi/\Lambda)\hat{x}$, where $\hat{x}$--.

Col. 19, eq. (31) change "$N_2K_3 - K_2K_3$" to --$N_2K_3 - K_2N_3$--.

Col. 20, line 52, change "grating grooves." to --grating grooves (of depth $d_2$).--.

Col. 21, line 13, change "$C_N$" to --$c_N$--.

UNITED STATES PATENT AND TRADEMARK OFFICE
CERTIFICATE OF CORRECTION

PATENT NO. : 5,007,708

DATED : April 16, 1991

INVENTOR(S) : Thomas K. Gaylord, et al

It is certified that error appears in the above-indentified patent and that said Letters Patent is hereby corrected as shown below:

Col. 21, line 40, change "$\{[1+(1+4n_1^2$" to --$\{[1\pm(1-4n_1^2$--.

Col. 21, line 41, change "[2}" to -- ]2}--.

Col. 22, line 17, change "0.035+1(1/3) (1=0, 1, 2, ...)" to --0.035+$\ell$(1/3) ($\ell$=0, 1, 2, ...)--.

Col. 22, line 24, change, "$d_C/\lambda_0=0.3207$" to --$d_2/\lambda_0=0.3207$--.

Col. 23, eq. (A10), change "B-" on the first line and "C" on the second line to read --BC--.

Col. 25, line 9, change "K is the filling factor" to --F is the filling factor--.

Col. 25, line 45, change "+$N_1N_2 - N_2N_3$ +" to -- +($N_1N_2 - N_2N_3$ + --.

Col. 30, line 20, change "method of Claim 15" to --method of claim 25--.

Col. 30, line 27, change "method of Claim 15" to --method of Claim 25--.

UNITED STATES PATENT AND TRADEMARK OFFICE
CERTIFICATE OF CORRECTION

PATENT NO. : 5,007,708
DATED : April 16, 1991
INVENTOR(S) : Thomas K. Gaylord, et al It is certified that error appears in the above-indentified patent and that said Letters Patent is hereby corrected as shown below:

Col. 30, line 34, change "method of Claim 15" to --method of Claim 25--.

Col. 22, line 26, change "have a zero" to --have a zero reflectance--.

Signed and Sealed this

Thirteenth Day of September, 1994

Attest:

BRUCE LEHMAN

Attesting Officer     Commissioner of Patents and Trademarks